(12) United States Patent
Lee

(10) Patent No.: US 12,142,651 B2
(45) Date of Patent: Nov. 12, 2024

(54) INTEGRATED CIRCUIT MULTI-GATE TRANSISTORS STRUCTURE WITH GATE VIA AND MANUFACTURING METHOD THEREOF

(71) Applicant: TAIWAN SEMICONDUCTOR MANUFACTURING CO., LTD., Hsinchu (TW)

(72) Inventor: Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/166,379

(22) Filed: Feb. 8, 2023

(65) Prior Publication Data
US 2023/0187511 A1    Jun. 15, 2023

Related U.S. Application Data

(63) Continuation of application No. 17/191,278, filed on Mar. 3, 2021, now Pat. No. 11,588,030.
(Continued)

(51) Int. Cl.
| | |
|---|---|
| *H01L 29/417* | (2006.01) |
| *H01L 27/092* | (2006.01) |
| *H01L 29/06* | (2006.01) |
| *H01L 29/40* | (2006.01) |
| *H01L 29/423* | (2006.01) |

(Continued)

(52) U.S. Cl.
CPC .... *H01L 29/41775* (2013.01); *H01L 27/0924* (2013.01); *H01L 29/0665* (2013.01); *H01L 29/401* (2013.01); *H01L 29/41733* (2013.01); *H01L 29/41791* (2013.01); *H01L 29/42392* (2013.01); *H01L 29/66742* (2013.01); *H01L 29/66795* (2013.01); *H01L 29/785* (2013.01); *H01L 29/78618* (2013.01)

(58) Field of Classification Search
CPC ......... H01L 29/66795; H01L 29/66742; H01L 29/78618; H01L 29/785; H01L 29/42392; H01L 29/41791; H01L 29/401; H01L 29/41733; H01L 29/41775; H01L 27/0924; H01L 29/0665; H01L 21/76829; H01L 21/76897; H01L 21/823475
See application file for complete search history.

(56) References Cited

U.S. PATENT DOCUMENTS

| | | | |
|---|---|---|---|
| 9,349,833 B1 * | 5/2016 | Hung | ............ H01L 27/088 |
| 10,204,797 B1 | 2/2019 | Gao et al. | |

(Continued)

FOREIGN PATENT DOCUMENTS

| | | |
|---|---|---|
| CN | 106449524 A | 2/2017 |
| DE | 102018129012 A1 | 1/2020 |

(Continued)

*Primary Examiner* — Changhyun Yi
(74) *Attorney, Agent, or Firm* — Maschoff Brennan

(57) ABSTRACT

A method includes forming a gate structure over a substrate. A dielectric cap is formed over the gate structure. An etch stop layer is deposited over the dielectric cap. An interlayer dielectric (ILD) layer is deposited over the etch stop layer. The ILD layer is in contact with a sidewall of the etch stop layer. A gate via in the ILD layer is formed to pass through the etch stop layer and the dielectric cap to the gate structure.

20 Claims, 60 Drawing Sheets

Related U.S. Application Data

(60) Provisional application No. 63/084,999, filed on Sep. 29, 2020.

(51) Int. Cl.
  *H01L 29/66*  (2006.01)
  *H01L 29/78*  (2006.01)
  *H01L 29/786*  (2006.01)

(56) References Cited

U.S. PATENT DOCUMENTS

| | | | |
|---|---|---|---|
| 11,588,030 B2* | 2/2023 | Lee | ............... H01L 29/42376 |
| 2005/0095797 A1 | 5/2005 | Cho et al. | |
| 2012/0126295 A1 | 5/2012 | Edge et al. | |
| 2012/0181506 A1 | 7/2012 | Farmer et al. | |
| 2015/0035086 A1 | 2/2015 | Xie et al. | |
| 2015/0187905 A1 | 7/2015 | Cai et al. | |
| 2016/0104645 A1 | 4/2016 | Hung et al. | |
| 2016/0190287 A1* | 6/2016 | Hsu | ............... H01L 29/66795 |
| | | | 438/299 |
| 2017/0047418 A1 | 2/2017 | Fan et al. | |
| 2017/0186849 A1 | 6/2017 | Chen et al. | |
| 2018/0277430 A1 | 9/2018 | Xie et al. | |
| 2018/0350662 A1 | 12/2018 | You et al. | |
| 2019/0088542 A1 | 3/2019 | Hsieh et al. | |
| 2019/0164829 A1 | 5/2019 | Yang et al. | |
| 2019/0296124 A1* | 9/2019 | Hsu | ............... H01L 21/31105 |
| 2019/0341461 A1 | 11/2019 | Wang | |
| 2020/0006060 A1 | 1/2020 | Lee et al. | |
| 2022/0102343 A1* | 3/2022 | Mule' | ............... H01L 27/088 |

FOREIGN PATENT DOCUMENTS

| | | |
|---|---|---|
| KR | 20170078514 A | 7/2017 |
| TW | 201843718 A | 12/2018 |

* cited by examiner

100

100

100

100

200

200

INTEGRATED CIRCUIT MULTI-GATE TRANSISTORS STRUCTURE WITH GATE VIA AND MANUFACTURING METHOD THEREOF

PRIORITY CLAIM AND CROSS-REFERENCE

This application is a continuation application of U.S. patent application Ser. No. 17/191,278, filed Mar. 3, 2021, now U.S. Pat. No. 11,588,030, issued Feb. 21, 2023, which claims priority to U.S. Provisional Application Ser. No. 63/084,999, filed Sep. 29, 2020, which is herein incorporated by reference.

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
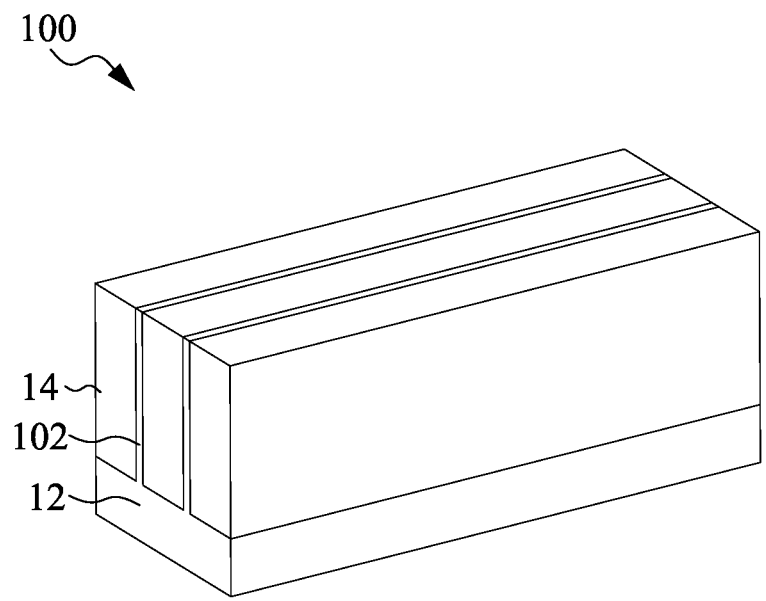
FIGS. 1, 2, 3A, 3B, 4-14, 15A, 15B, 16A, and 16B illustrate perspective views and cross-sectional views of intermediate stages in the formation of an integrated circuit structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit structures and methods of forming the same, and more particularly to fabricating transistors (e.g., fin field-effect transistors (FinFETs), gate-all-around (GAA) transistors) and source/drain vias over source/drain contacts of the transistors. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFETs, on account of their fin-like structure. A FinFET has a gate structure formed on three sides of a channel region (e.g., wrapping around an upper portion of a channel region in a semiconductor fin). Also presented herein are embodiments of a type of multi-gate transistor referred to as a GAA device. GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration.

After a front-end-of-line (FEOL) processing for fabricating transistors is completed, source/drain contacts are formed over source/drain regions of the transistors. Source/drain vias are then formed over the source/drain contacts to electrically connect the source/drain contacts to subsequently formed interconnect metal lines. Formation of the source/drain vias may include depositing an interlayer dielectric (ILD) layer over the source/rain contacts, forming via openings extending through the ILD layer by using anisotropic etching, and then depositing one or more metal layers in the via openings to serve as the source/drain vias.

In order to prevent over-etching the dielectric materials near the source/drain contacts during the anisotropic etching process, an additional etch stop layer can be selectively formed over the dielectric materials prior to formation of the ILD layer. The selectively-formed ESL has a different etch selectivity than the ILD layer, and thus the selectively-formed ESL can slow down or even stop the etching process of forming via openings, which in turn prevents over-etching the dielectric materials under the ESL, resulting in reduced risk of leakage current.

FIGS. 1-16B illustrate perspective views and cross-sectional views of intermediate stages in the formation of an integrated circuit structure 100 in accordance with some embodiments of the present disclosure. The formed transistors may include a p-type transistor (such as a p-type FinFET) and an n-type transistor (such as an n-type FinFET) in accordance with some exemplary embodiments. Throughout the various views and illustrative embodiments, like reference numbers are used to designate like elements. It is understood that additional operations can be provided before, during, and after the processes shown by FIGS. 1-16B, and some of the operations described below can be replaced or eliminated, for additional embodiments of the method. The order of the operations/processes may be interchangeable.

FIG. 1 illustrates a perspective view of a structure. The structure includes a substrate 12. The substrate 12 may be a semiconductor substrate (also called wafer in some embodiments), which may be a silicon substrate, a silicon germanium substrate, or a substrate formed of other semiconductor materials. In accordance with some embodiments of the present disclosure, the substrate 12 includes a bulk silicon substrate and an epitaxy silicon germanium (SiGe) layer or a germanium layer (without silicon therein) over the bulk silicon substrate. The substrate 12 may be doped with a p-type or an n-type impurity. Isolation regions 14 such as shallow trench isolation (STI) regions may be formed to extend into the substrate 12. The portions of the substrate 12 between neighboring isolation regions 14 are referred to as semiconductor strips 102.

The isolation regions 14 may include a liner oxide (not shown). The liner oxide may be formed of a thermal oxide formed through a thermal oxidation of a surface layer of the substrate 12. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). The isolation regions 14 may also include a dielectric material over the liner oxide, and the dielectric material may be formed using flowable chemical vapor deposition (FCVD), spin-on coating, or the like.

Figure 2:
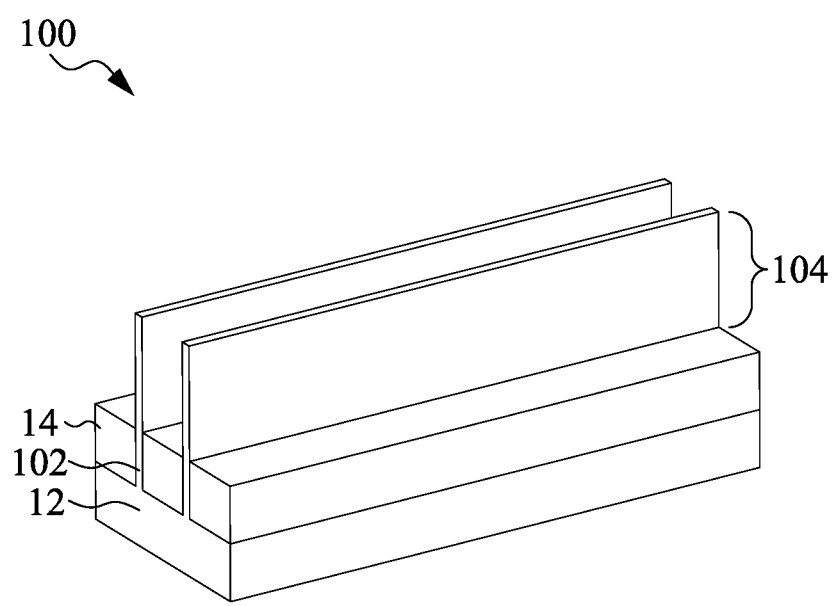

Referring to FIG. 2, the isolation regions 14 are recessed, so that the top portions of semiconductor strips 102 protrude higher than the top surfaces of the neighboring isolation regions 14 to form protruding fins 104. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of the isolation regions 14 is performed using a wet etch process. The etching chemical may include diluted HF, for example.

In above-illustrated exemplary embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of the protruding fins 104 may also be replaced with materials different from that of substrate 12. For example, if the protruding fins 104 serve for n-type transistors, protruding fins 104 may be formed of Si, SiP, SiC, SiPC, or a III-V compound semiconductor such as InP, GaAs, AlAs, InAs, InAlAs, InGaAs, or the like. On the other hand, if the protruding fins 104 serve for p-type transistors, the protruding fins 104 may be formed of Si, SiGe, SiGeB, Ge, or a III-V compound semiconductor such as InSb, GaSb, InGaSb, or the like.

Figure 3A:
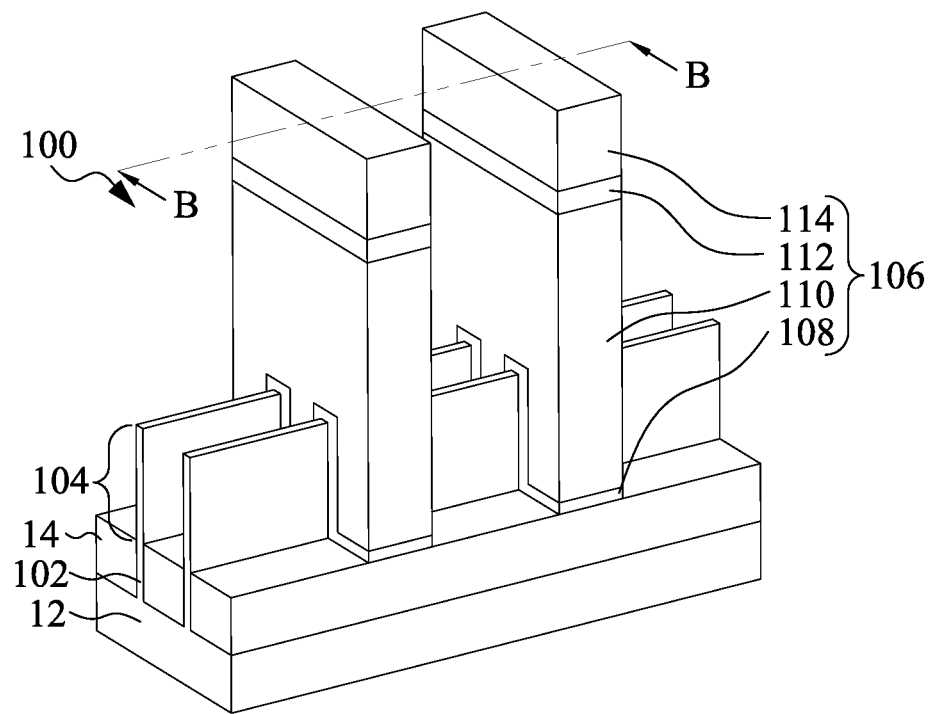
Figure 3B:
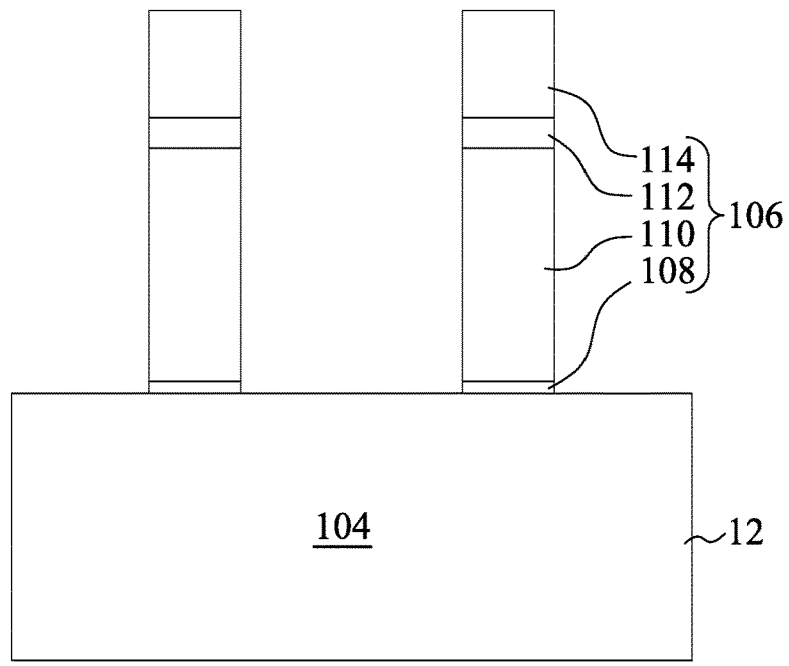

Referring to FIGS. 3A and 3B, dummy gate structures 106 are formed on the top surfaces and the sidewalls of the protruding fins 104. FIG. 3B illustrates a cross-sectional view obtained from a vertical plane containing line B-B in FIG. 3A. Formation of the dummy gate structures 106 includes depositing in sequence a gate dielectric layer and a dummy gate electrode layer across the fins 104, followed by patterning the gate dielectric layer and the dummy gate electrode layer. As a result of the patterning, the dummy gate structure 106 includes a gate dielectric layer 108 and a dummy gate electrode 110 over the gate dielectric layer 108. The gate dielectric layers 108 can be any acceptable dielectric layer, such as silicon oxide, silicon nitride, the like, or a combination thereof, and may be formed using any acceptable process, such as thermal oxidation, a spin process, CVD, or the like. The dummy gate electrodes 110 can be any acceptable electrode layer, such as comprising polysilicon, metal, the like, or a combination thereof. The gate electrode layer can be deposited by any acceptable deposition process, such as CVD, plasma enhanced CVD (PECVD), or the like. Each of dummy gate structures 106 crosses over a single one or a plurality of protruding fins 104. Dummy gate structures 106 may have lengthwise directions perpendicular to the lengthwise directions of the respective protruding fins 104.

A mask pattern may be formed over the dummy gate electrode layer to aid in the patterning. In some embodiments, a hard mask pattern including bottom masks 112 over a blanket layer of polysilicon and top masks 114 over the bottom masks 112 may be formed. The hard mask pattern is made of one or more layers of $SiO_2$, SiCN, SiON, $Al_2O_3$, SiN, or other suitable materials. In certain embodiments, the bottom masks 112 include silicon oxide, and the top masks 114 include silicon nitride. By using the mask pattern as an etching mask, the dummy gate electrode layer is patterned into the dummy gate electrodes 110, and the blanket gate dielectric layer is patterned into the gate dielectric layers 108.

Figure 4:
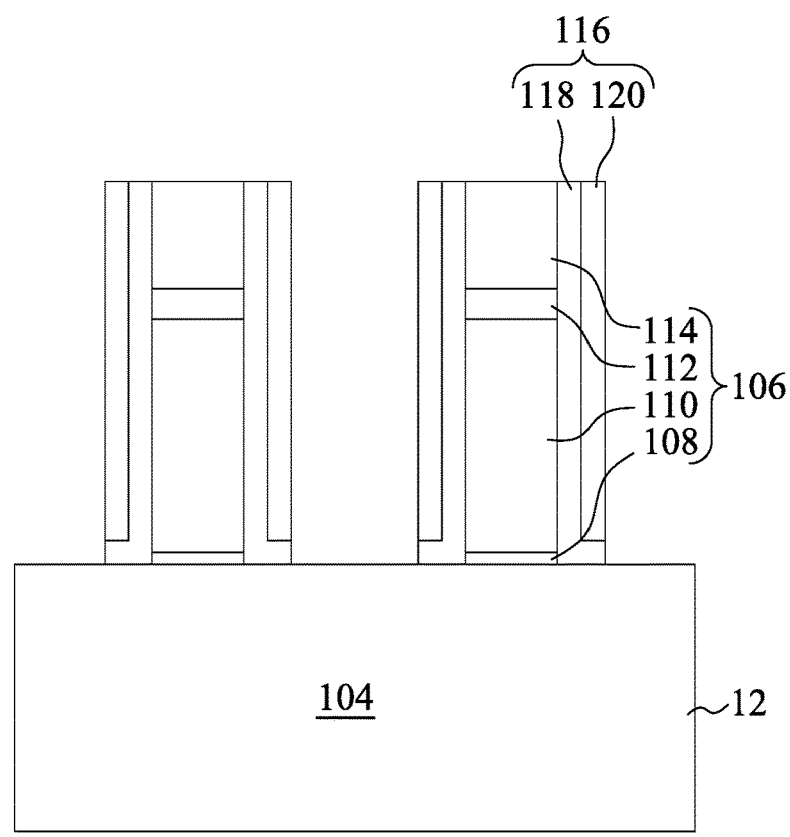

Next, as illustrated in FIG. 4, gate spacers 116 formed on sidewalls of the dummy gate structures 106. In some embodiments of the gate spacer formation operations, a spacer material layer is deposited on the substrate 12. The spacer material layer may be a conformal layer that is subsequently etched back to form gate spacers 116. In some embodiments, the spacer material layer includes multiple layers, such as a first spacer layer 118 and a second spacer layer 120 formed over the first spacer layer 118. The first and second spacer layers 118 and 120 each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers 118 and 120 may be formed by depositing in sequence two different dielectric materials over the dummy gate structures 106 using processes such as, CVD process, a subatmospheric CVD (SACVD) process, a flowable CVD process, an ALD process, a PVD process, or other suitable process. An anisotropic etching process is then performed on the deposited spacer layers 118 and 120 to expose portions of the fins 104 not covered by the dummy gate structures 106 (e.g., in source/drain regions of the fins 104). Portions of the spacer layers 118 and 120 directly above the dummy gate structures 106 may be removed by this anisotropic etching process. Portions of the spacer layer 118 and 120 on sidewalls of the dummy gate structures 106 may remain, forming gate sidewall spacers, which are denoted as the gate spacers 116, for the sake of simplicity. In some embodiments, the first spacer layer 118 is formed of silicon oxide that has a lower dielectric constant than silicon nitride, and the second spacer layer 120 is formed of silicon nitride that has a higher etch resistance against subsequent etching processing (e.g., etching source/drain recesses in the fin 104) than silicon oxide. In some embodiments, the gate spacers 116 may be used to offset subsequently formed doped regions, such as source/drain regions. The gate spacers 116 may further be used for designing or modifying the source/drain region profile.

Figure 5:
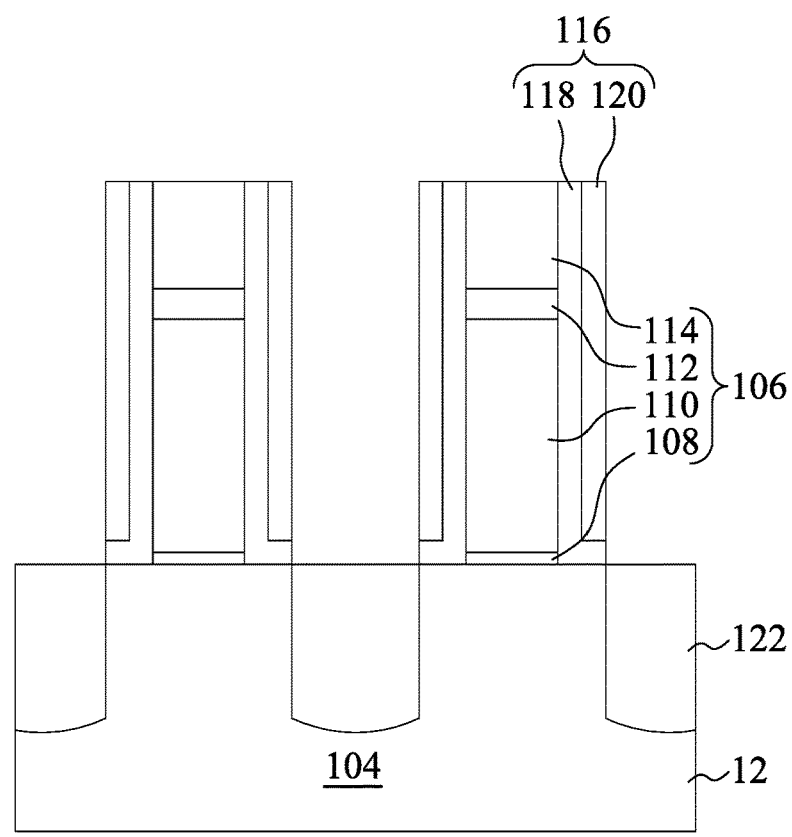

After formation of the gate spacers 116 is completed, source/drain structures 122 are formed on source/drain regions of the fin 104 that are not covered by the dummy gate structures 106 and the gate spacers 116. The resulting structure is illustrated in FIG. 5. In some embodiments, formation of the source/drain structures 122 includes recessing source/drain regions of the fin 104, followed by epitaxially growing semiconductor materials in the recessed source/drain regions of the fin 104.

The source/drain regions of the fin 104 can be recessed using suitable selective etching processing that attacks the semiconductor fin 104, but barely attacks the gate spacers 116 and the top masks 114 of the dummy gate structures 106. For example, recessing the semiconductor fin 104 may be performed by a dry chemical etch with a plasma source and an etchant gas. The plasma source may be inductively coupled plasma (ICP) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fin 104 at a faster etch rate than it etches the gate spacers 116 and the top masks 114 of the dummy gate structures 106. In some other embodiments, recessing the semiconductor fin 104 may be performed by a wet chemical etch, such as ammonium peroxide mixture (APM), NH$_4$OH, tetramethylammonium hydroxide (TMAH), combinations thereof, or the like, which etches the semiconductor fin 104 at a faster etch rate than it etches the gate spacers 116 and the top masks 114 of the dummy gate structures 106. In some other embodiments, recessing the semiconductor fin 104 may be performed by a combination of a dry chemical etch and a wet chemical etch.

Once recesses are created in the source/drain regions of the fin 104, source/drain epitaxial structures 122 are formed in the source/drain recesses in the fin 104 by using one or more epitaxy or epitaxial (epi) processes that provides one or more epitaxial materials on the semiconductor fin 104. During the epitaxial growth process, the gate spacers 116 limit the one or more epitaxial materials to source/drain regions in the fin 104. In some embodiments, the lattice constants of the epitaxy structures 122 are different from the lattice constant of the semiconductor fin 104, so that the channel region in the fin 104 and between the epitaxy structures 122 can be strained or stressed by the epitaxy structures 122 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 104.

In some embodiments, the source/drain epitaxial structures 122 may include Ge, Si, GaAs, AlGaAs, SiGe, GaAsP, SiP, or other suitable material. The source/drain epitaxial structures 122 may be in-situ doped during the epitaxial process by introducing doping species including: p-type dopants, such as boron or BF$_2$; n-type dopants, such as phosphorus or arsenic; and/or other suitable dopants including combinations thereof. If the source/drain epitaxial structures 122 are not in-situ doped, an implantation process (i.e., a junction implant process) is performed to dope the source/drain epitaxial structures 122. In some exemplary embodiments, the source/drain epitaxial structures 122 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed fins 104 in the p-type device regions. The mask may then be removed. Subsequently, a mask, such as a photoresist, may be formed over the p-type device region while exposing the n-type device regions, and n-type epitaxial structures may be formed on the exposed fins 104 in the n-type device region. The mask may then be removed.

Once the source/drain epitaxial structures 122 are formed, an annealing process can be performed to activate the p-type dopants or n-type dopants in the source/drain epitaxial structures 122. The annealing process may be, for example, a rapid thermal anneal (RTA), a laser anneal, a millisecond thermal annealing (MSA) process or the like.

Figure 6:
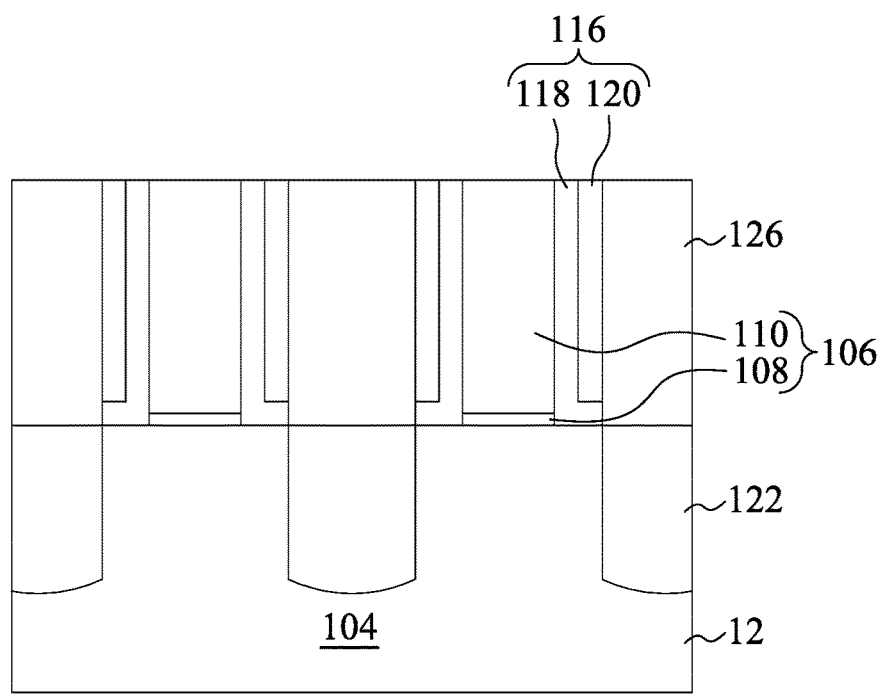

Next, in FIG. 6, an interlayer dielectric (ILD) layer 126 is formed on the substrate 12. In some embodiments, a contact etch stop layer (CESL) is also formed prior to forming the ILD layer 126. In some examples, the CESL includes a silicon nitride layer, silicon oxide layer, a silicon oxynitride layer, and/or other suitable materials having a different etch selectivity than the ILD layer 126. The CESL may be formed by plasma-enhanced chemical vapor deposition (PECVD) process and/or other suitable deposition or oxidation processes. In some embodiments, the ILD layer 126 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicate glass (BSG), and/or other suitable dielectric materials having a different etch selectivity than the CESL. The ILD layer 126 may be deposited by a PECVD process or other suitable deposition technique. In some embodiments, after formation of the ILD layer 126, the wafer may be subject to a high thermal budget process to anneal the ILD layer 126.

In some examples, after forming the ILD layer 126, a planarization process may be performed to remove excessive materials of the ILD layer 126. For example, a planarization process includes a chemical mechanical planarization (CMP) process which removes portions of the ILD layer 126 (and the CESL, if present) overlying the dummy gate structures 106. In some embodiments, the CMP process also removes hard mask layers 112, 114 (as shown in FIG. 5) and exposes the dummy gate electrodes 110.

Figure 7:
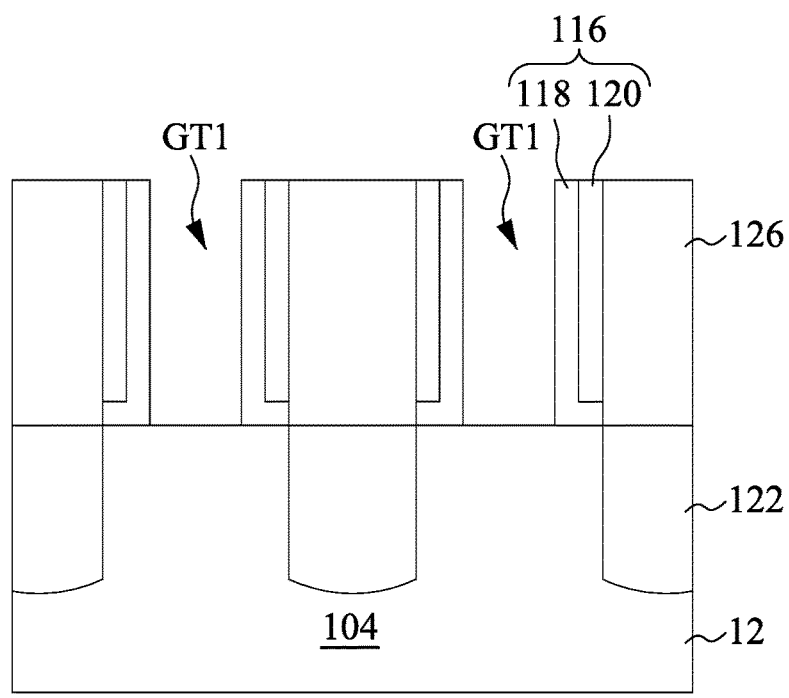

Next, as illustrates in FIG. 7, the remaining dummy gate structures 106 (see FIG. 6) are removed, resulting in gate trenches GT1 between corresponding gate spacers 116. The dummy gate structures 106 are removed using a selective etching process (e.g., selective dry etching, selective wet etching, or a combination thereof) that etches materials in the dummy gate structures 106 at a faster etch rate than it etches other materials (e.g., the gate spacers 116, the CESL, and/or the ILD layer 126).

Figure 8:
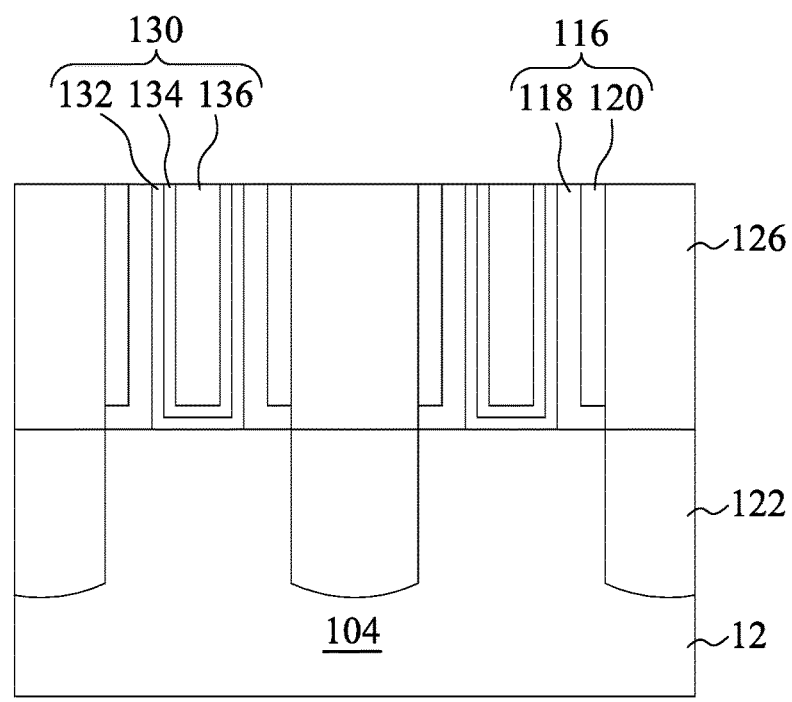

Thereafter, replacement gate structures 130 are respectively formed in the gate trenches GT1, as illustrated in FIG. 8. The gate structures 130 may be the final gates of FinFETs. The final gate structures each may be a high-k/metal gate stack, however other compositions are possible. In some embodiments, each of the gate structures 130 forms the gate associated with the three-sides of the channel region provided by the fin 104. Stated another way, each of the gate structures 130 wraps around the fin 104 on three sides. In various embodiments, the high-k/metal gate structure 130 includes a gate dielectric layer 132 lining the gate trench GT1, a work function metal layer 134 formed over the gate dielectric layer 132, and a fill metal 136 formed over the work function metal layer 134 and filling a remainder of gate trenches GT1. The gate dielectric layer 132 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 134 and/or fill metal 136 used within high-k/metal gate structures 130 may include a metal, metal alloy, or metal silicide. Formation of the high-k/metal gate structures 130 may include multiple deposition processes to form various gate materials, one or more liner layers, and one or more CMP processes to remove excessive gate materials.

In some embodiments, the interfacial layer of the gate dielectric layer 132 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 132 may include hafnium oxide ($HfO_2$). Alternatively, the gate dielectric layer 132 may include other high-k dielectrics, such as hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), silicon oxynitride (SiON), and combinations thereof.

The work function metal layer 134 may include work function metals to provide a suitable work function for the high-k/metal gate structures 130. For an n-type FinFET, the work function metal layer 134 may include one or more n-type work function metals (N-metal). The n-type work function metals may exemplarily include, but are not limited to, titanium aluminide (TiAl), titanium aluminium nitride (TiAlN), tantalum carbo-nitride (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 134 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 136 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 9:
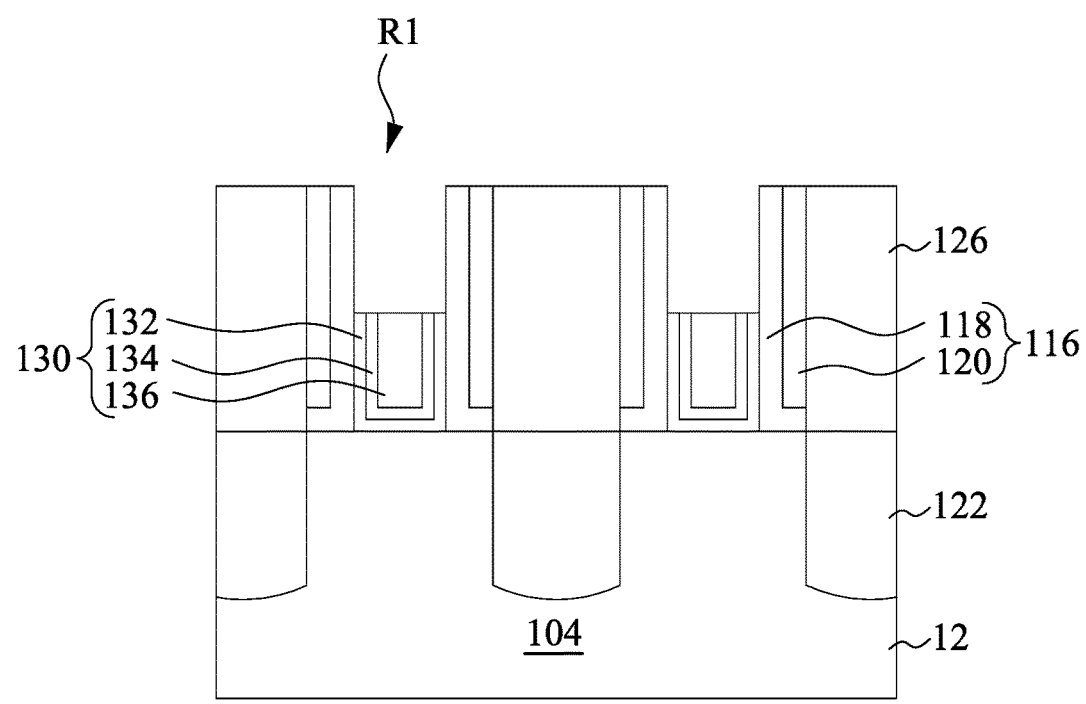

Reference is then made to FIG. 9. An etching back process is performed to etch back the replacement gate structures 130, resulting in recesses R1 over the etched-back gate structures 130. In some embodiments, because the materials of the replacement gate structures 130 have a different etch selectivity than the gate spacers 116, a selective etching process may be performed to etch back the replacement gate structures 130 to lower the replacement gate structures 130. As a result, the top surfaces of the replacement gate structures 130 may be at a lower level than the top surfaces of the gate spacers 116.

Figure 10:
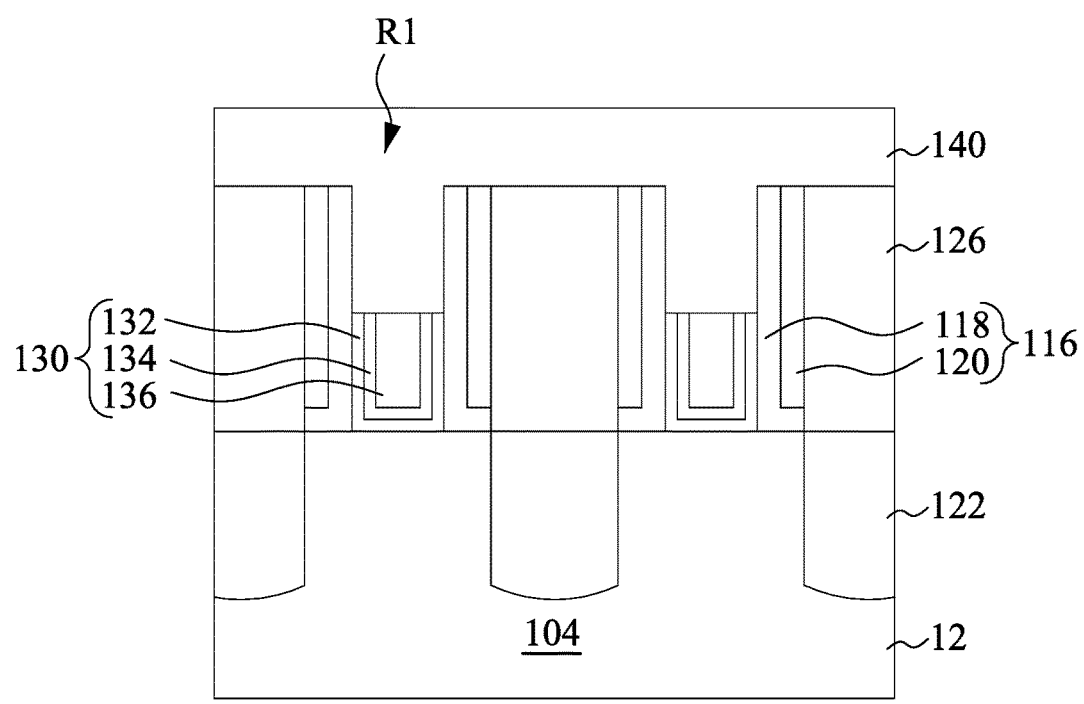
Figure 11:
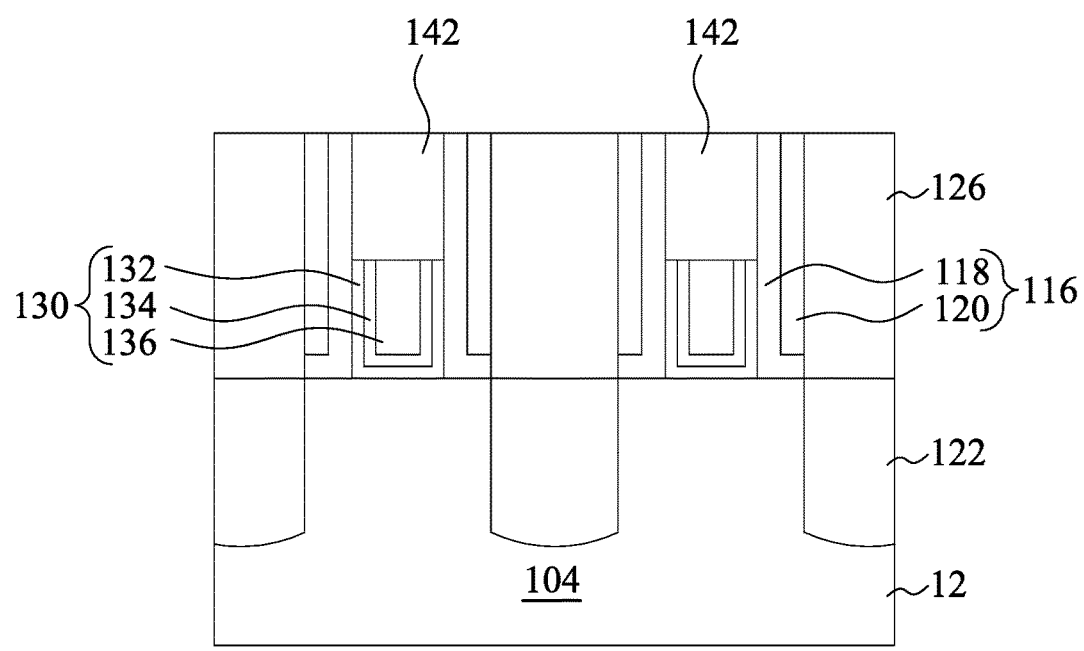

Subsequently, a dielectric cap layer 140 is deposited over the substrate 12 until the recesses R1 are overfilled, as illustrated in FIG. 10. The dielectric cap layer 140 includes $SiN_x$, $Al_xO_y$, AlON, $SiO_xC_y$, $SiC_xN_y$, boron nitride (BN), boron carbonitride (BNC), combinations thereof or the like, and is formed by a suitable deposition technique such as CVD, plasma-enhanced CVD (PECVD), ALD, remote plasma ALD (RPALD), plasma-enhanced ALD (PEALD), combinations thereof or the like. A CMP process is then performed to remove the cap layer outside the recesses R1, leaving portions of the dielectric cap layer 140 in the recesses R1 to serve as dielectric caps 142. The resulting structure is illustrated in FIG. 11. The dielectric cap 142 is in direct contact with the replacement gate structures 130 as shown in FIG. 11.

Figure 12:
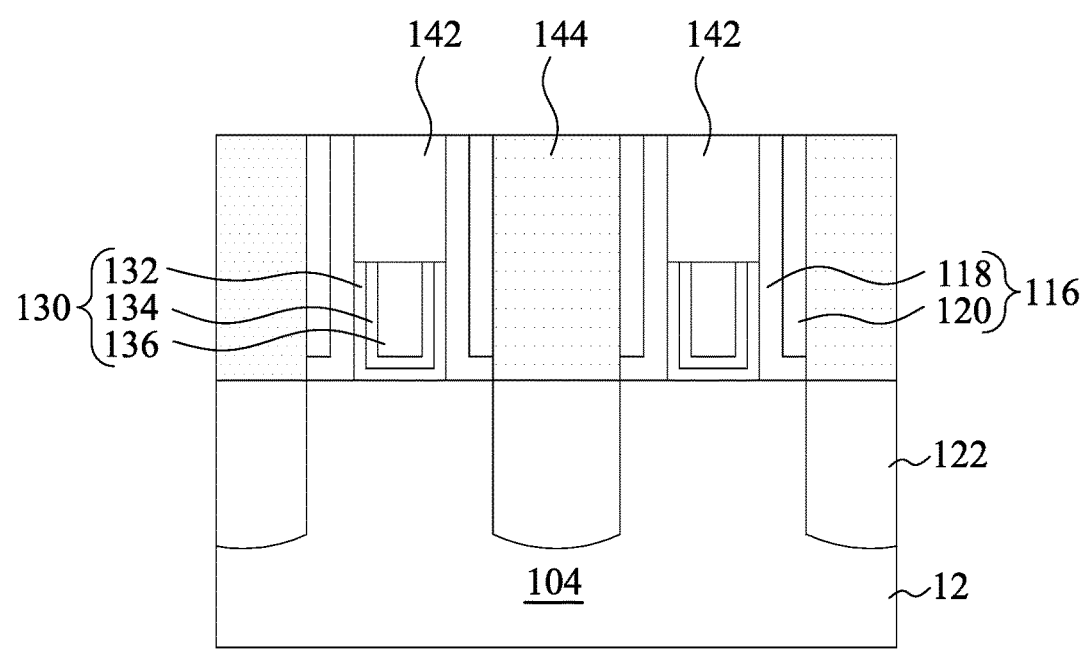

Referring to FIG. 12, source/drain contacts 144 are formed extending through the ILD layer 126 (and the CESL, if present) (see FIG. 11). Formation of the source/drain contacts 144 includes, by way of example and not limitation, performing one or more etching processes to form contact openings extending though the ILD layer 126 (and the CESL, if present) to expose the source/drain epitaxy structures 122, depositing one or more metal materials overfilling the contact openings, and then performing a CMP process to remove excessive metal materials outside the contact openings. In some embodiments, the one or more etching processes are selective etching that etches the ILD layer 126 at a faster etch rate than etching the dielectric caps 142 and the gate spacers 116. As a result, the selective etching is performed using the dielectric caps 142 and the gate spacers 116 as an etch mask, such that the contact openings and hence source/drain contacts 144 are formed self-aligned to the source/drain epitaxy structures 122 without using an additional photolithography process. In that case, the dielectric caps 142 allowing for forming the source/drain contacts 144 in a self-aligned manner can be called self-aligned-contact (SAC) caps 142.

Figure 13:
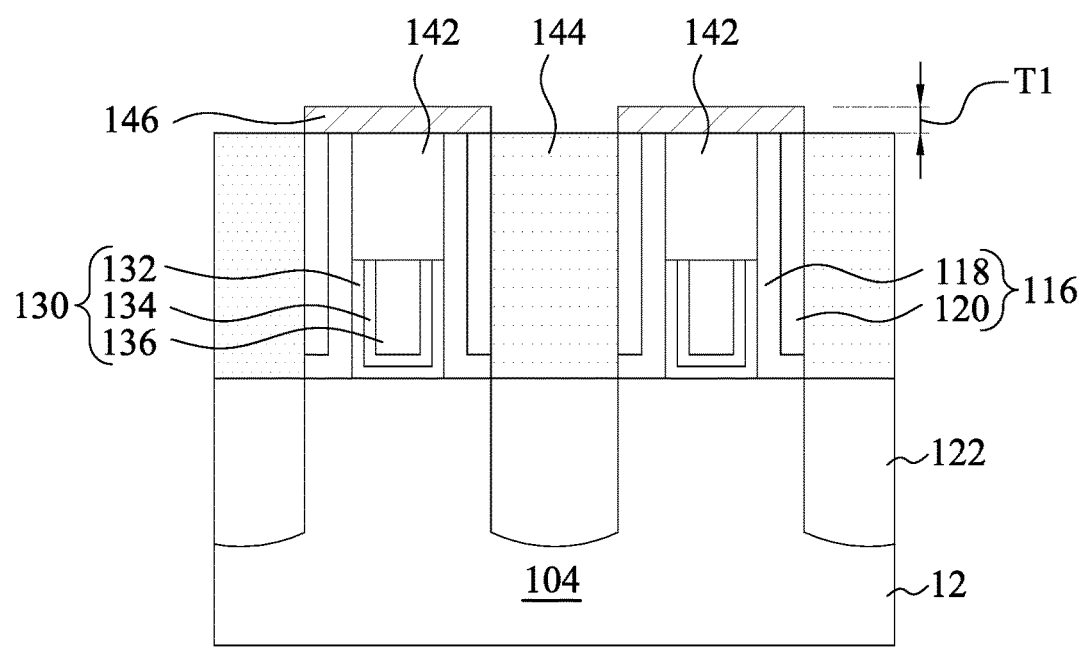

Once the self-aligned source/drain contacts 144 have been formed, in FIG. 13, an etch stop layer (ESL) 146 is selectively formed over the dielectric materials (e.g., the SAC caps 142 and the gate spacers 116). In some embodiments, the ESL 146 is formed by a selective atomic layer deposition (ALD) process that exhibits a faster deposition rate on dielectric surfaces than on metal surfaces. The selective ALD process includes providing alternating pulses of a metal precursor and a hydroxyl precursor to a reaction chamber. Pulses of reactants saturate the surface in a self-limiting manner.

An exemplary selective ALD process in which the ESL 146 is formed includes the following operations. The structure of FIG. 12 is loaded into a reaction chamber. Subsequently, a pulse of a precursor is injected into the reaction chamber loaded with the structure for a first period of time. Here, the precursor includes a chemical selected from the group consisting of $H_2O$, $H_2O_2$, and/or $O_3$. For example, the precursor includes hydroxyl precursor.

As the hydroxyl precursor is injected into the reaction chamber, a chemisorption layer of the hydroxyl precursor is selectively formed on the exposed surfaces of the dielectric materials (e.g., the SAC caps 142 and the gate spacers 116), but not formed on exposed surfaces of the metal materials (e.g., the source/drain contacts 144). Subsequently, the residual hydroxyl precursor is discharged from the reaction chamber for a second period of time. To more effectively discharge the residual hydroxyl precursor from the reaction chamber, purge gas may be injected into the reaction chamber during this purging period, wherein the purge gas may include an inert gas such as $N_2$, Ar, He, or similar inert gases.

After discharging the residual hydroxyl precursor from the reaction chamber, a pulse of a metal precursor is injected into the reaction chamber for a third period of time. Here, the metal precursor possesses a high reaction probability with the chemisorption layer of the hydroxyl precursor. As some examples, the metal precursor includes a tetrachloro transition metal complex. In some embodiments, the tetrachloro transition metal complex includes a chemical selected from the group consisting of $ZrCl_4$, $HfCl_4$, $AlCl_4$, and $TiCl_4$. The metal precursor reacts with the chemisorption layer of the hydroxyl precursor. As a result, an atomic layer of ESLs 146 are formed on the exposed surfaces of the dielectric materials (e.g., the SAC caps 142 and the gate spacers 116), but not formed on the exposed surfaces of metal materials (e.g., the source/drain contacts 144). In FIG. 13, the ESLs 146 is a high-κ dielectric layer including a metal oxide. In some embodiments, the metal oxide includes zirconium oxide, hafnium oxide, aluminum oxide, titanium oxide, and/or other suitable materials. In some other embodiments, the ESLs 146 can be made of $SiO_2$, $SiN_x$, $Al_xO_y$, AlON, $SiO_xC_y$, $SiC_xN_y$, boron nitride (BN), boron carbonitride (BNC), or other suitable materials.

Subsequently, the residual metal precursor is discharged from the reaction chamber for a fourth period of time. To more effectively discharge the residual metal precursor from the reaction chamber during this fourth purging period, an inert gas such as $N_2$, Ar, He, or the like may be injected into the reaction chamber.

In some embodiments, the selective ALD process includes a sequence of selective ALD cycles, i.e., the first through fourth time periods, as described above, during which each of the hydroxyl precursor and the metal precursor is alternately injected into and thereafter discharged from the reaction chamber, when taken together are regarded as one deposition or layer formation cycle. By repeating this cycle multiple times, the ESLs 146 with a desired thickness is thereby formed. The ESL 146 may have a thickness T1 of about 3 nm to about 10 nm. If the thickness T1 is less than about 3 nm, the ESL 146 may be too thin to slow down or stop a subsequent etching process; if the thickness T1 is greater than about 10 nm, the resulting integrated circuit structure may have high parasitic capacitance. In some embodiments, a CMP process is optionally performed to planarize the ESL 146 after the selective ALD process is completed.

Figure 14:
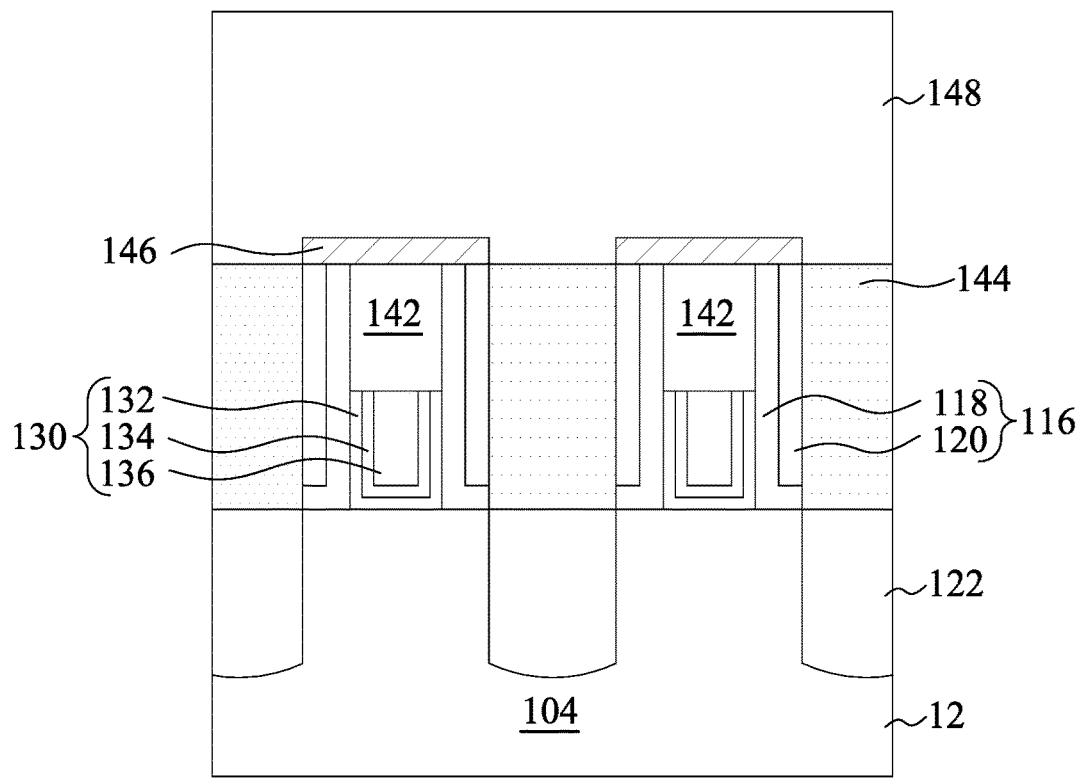

Referring to FIG. 14, another ILD layer 148 is formed over the ESL 146. In some embodiments, the ILD layer 148 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicate glass (BSG), SiOC, $SiCH_x$, and/or other suitable dielectric materials having a different etch selectivity than the ESL 146. In certain embodiments, the ILD layer 148 is formed of silicon oxide ($SiO_x$). The ILD layer 148 may be deposited by a PECVD process or other suitable deposition technique. In some embodiments, the ESL 146 has sufficient etch selectivity (e.g., about 7 times to about 10 times or higher) with respect to the ILD layer 148 in a subsequent via etching process. Stated differently, in the subsequent via etching process an etch rate of the ILD layer 148 is about 7 times to about 10 times or higher than an etch rate of the ESL 146. That is, the subsequent via etching process etches the ILD layer 148 at a faster etch rate than etching the ESL 146 by more than about 7 times. As such, the ESL 146 can slow down or even stop the etching process of forming via openings (see FIGS. 15A and 15B), which in turn prevents over-etching the dielectric materials near the source/drain contacts 144.

Figure 15A:
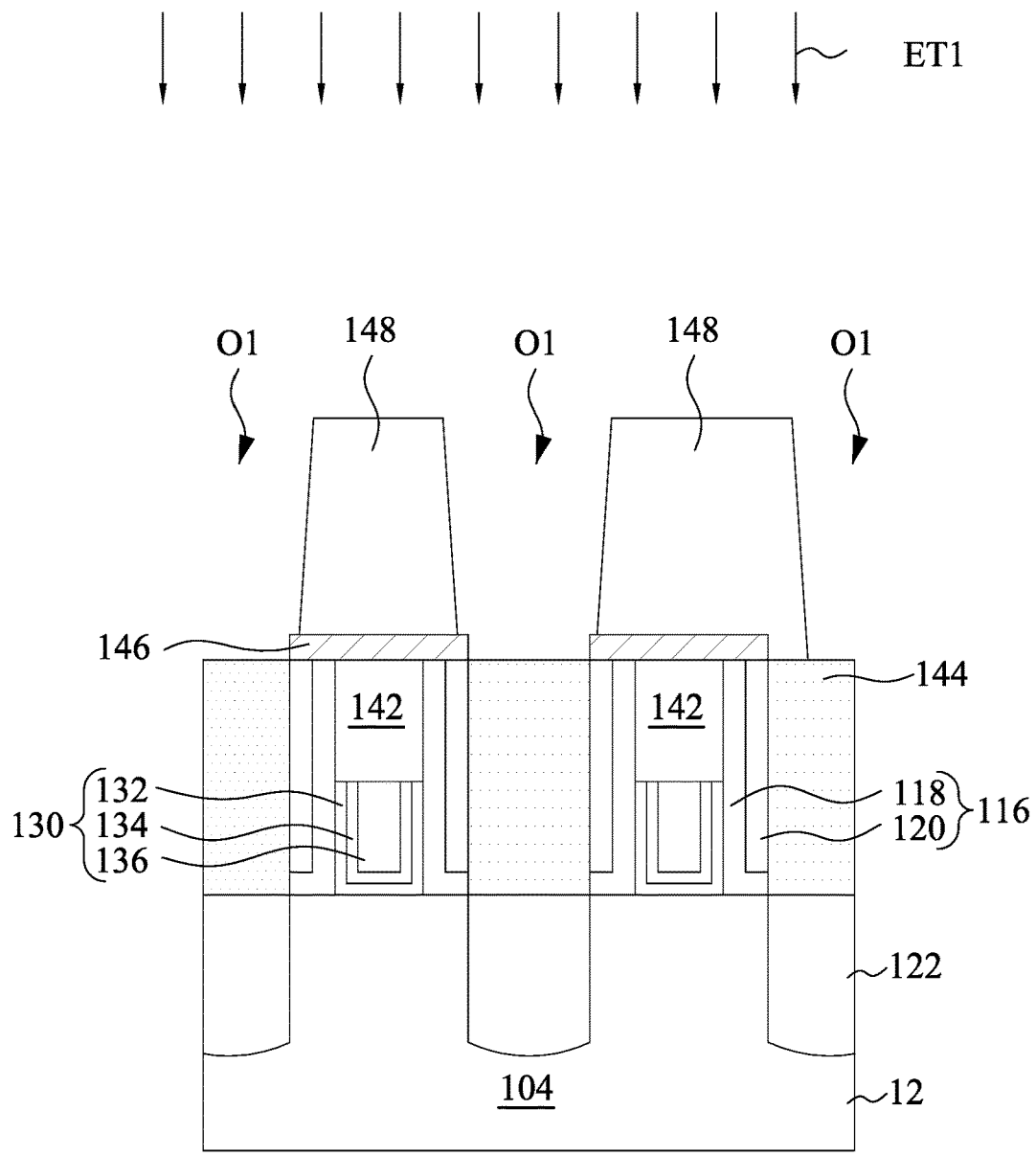

Referring to FIG. 15A, the ILD layer 148 is patterned to form via openings O1 extending through the ILD layer 148 by using an etching process (also called via etching process) ET1. The etching duration time of the via etching process ET1 is controlled to break through the ILD layer 148. As a result of the etching process ET1, the source/drain contacts 144 get exposed at bottoms of the via openings O1.

In some embodiments, before the via etching process ET1, a photolithography process is performed to define expected top-view patterns of the via openings O1. For example, the photolithography process may include spin-on coating a photoresist layer over the ILD layer 148 as illustrated in FIG. 14, performing post-exposure bake processes, and developing the photoresist layer to form a patterned mask with the top-view patterns of the via openings O1. In some embodiments, patterning the photoresist to form the patterned mask may be performed using an electron beam (e-beam) lithography process or an extreme ultraviolet (EUV) lithography process.

In some embodiments, the via etching process ET1 is an anisotropic selective etching process, such as a plasma etching. Take plasma etching for example, the semiconductor substrate 12 having the structure illustrated in FIG. 14 is loaded into a plasma tool and exposed to a plasma environment generated by RF or microwave power in a gaseous mixture of a fluorine containing gas, such as $C_4F_6$, $C_5F_8$, $C_4F_6$, $CHF_3$ or similar species, an inert gas, such as argon or helium, an optional weak oxidant, such as $O_2$ or CO or similar species, for a duration time sufficient to etch through the ILD layer 148. A plasma generated in a gaseous mixture comprising $C_4F_6$, $CF_4$, $CHF_3$, $O_2$ and argon can be used to etch through the ILD layer 148. The chemistry described above allows for selectively etching the ILD layer 148 at a faster etch rate than etching the ESL 146. For example, in the anisotropic selective etching process ET1 the etch rate of the ILD layer 148 is about 7 times to about 10 times or higher than an etch rate of the ESL 146.

In some embodiments, due to process variations, certain misalignment (or overlay error) may exist between the via openings O1 and the source/drain contacts 144. Or, the size (or width) of the via openings O1 may be greater than the size (or the width) of the source/drain contacts 144 in some embodiments. Either way, the via openings O1 may expose portions of the ESL 146. However, due to the etch selectivity between the ILD layer 148 and the ESL 146, the ESL 146 can slow down or even stop the etching process of forming the via openings O1, which in turn prevents over-etching the dielectric materials (e.g., gate spacers 116 and/or the dielectric caps 142) and results in reduced risk of leakage current.

In some embodiments, the foregoing etchants and etching conditions of the via etching process ET1 are selected in such a way that the ESL 146 (e.g., metal-containing dielectric) exhibits a slower etch rate than the ILD layer 148 (e.g., $SiO_x$). In this way, the ESL 146 can act as a detectable etching end point, which in turn prevents punching or breaking through the ESL 146 and thus prevents over-etching the dielectric materials covered by the ESL 146. Stated differently, the via etching process ET1 is tuned to etch silicon oxide at a faster etch rate than etching metal-containing dielectric or silicon nitride.

In some embodiments, the ILD layer 148 includes silicon oxide and the ESL 146 includes metal-containing dielectric. The via etching process ET1 may include a suitable wet etch, dry (plasma) etch, and/or other processes. For example, a dry etching process may use chlorine-containing gases, fluorine-containing gases, other etching gases, or a combination thereof. The wet etching solutions may include $NH_4OH$, HF (hydrofluoric acid) or diluted HF, deionized water, TMAH (tetramethylammonium hydroxide), other suitable wet etching solutions, or combinations thereof. In this way, etch rate of metal-containing dielectric keeps low in the via etching process ET1, which in turn allows for etching silicon oxide (i.e., ILD material) at a faster etch rate than etching metal-containing dielectric (i.e., ESL 146).

In some embodiments, the ILD layer 148 includes silicon oxide and the ESL 146 includes silicon nitride. It has been observed that the etch rate of silicon nitride increases when the etching plasma is generated from a gaseous mixture containing a hydrogen ($H_2$) gas. As a result, the via etching process ET1 is performed using a hydrogen-free gaseous mixture for reducing silicon nitride etch rate, in accordance with some embodiments of the present disclosure. Stated differently, the plasma in the via etching process ET1 is generated in a gaseous mixture without hydrogen ($H_2$) gas. In this way, etch rate of silicon nitride keeps low in the via etching process ET1, which in turn allows for etching silicon oxide (i.e., ILD material) at a faster etch rate than etching silicon nitride (i.e., ESL 146).

Figure 15B:
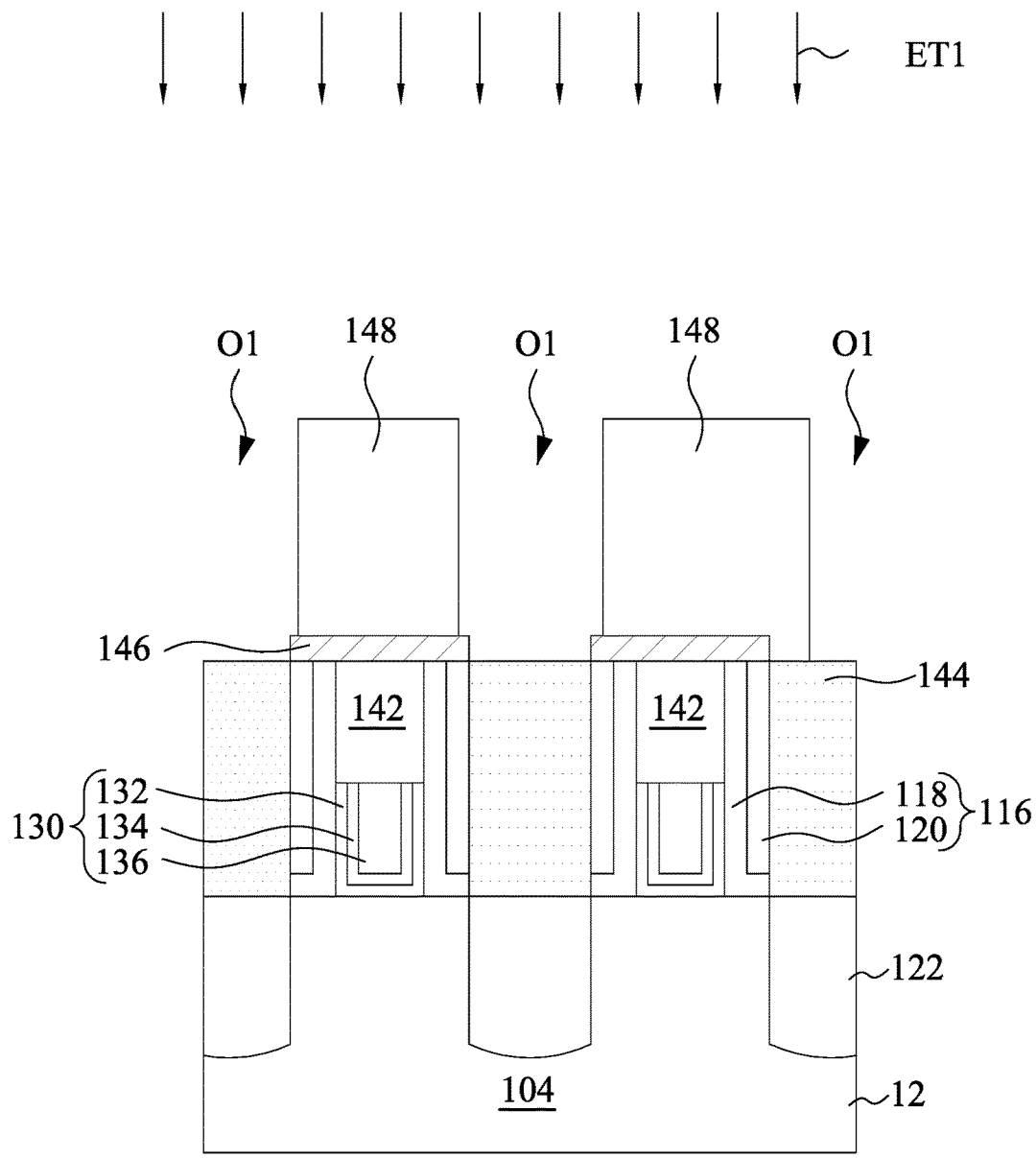

In some embodiments as depicted in FIG. 15A, the via openings O2 have tapered sidewall profile due to the nature of anisotropic etching of the etching process ET1. However, in some other embodiments, the etching conditions of the etching process ET1 may be fined-tune to allow the via openings O1 having vertical sidewall profile, as illustrated in FIG. 15B.

Figure 16A:
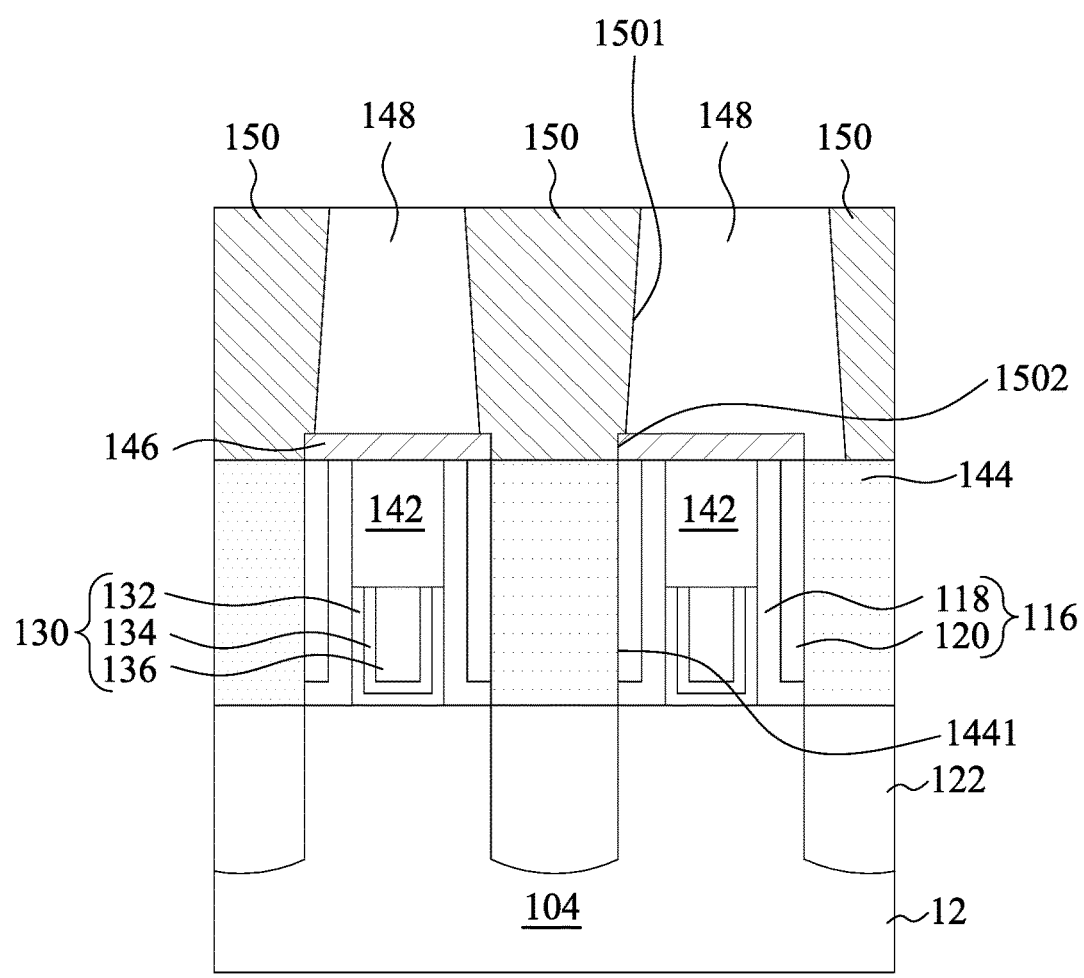

Referring to FIG. 16A, source/drain vias 150 are then formed in the via openings O1 to make physical and electrical connection to the source/drain contacts 144. The source/drain vias 150 are formed using, by way of example and not limitation, depositing one or more metal materials overfilling the via openings O1, followed by a CMP process to remove excessive metal material(s) outside the via openings O1. As a result of the CMP process, the source/drain vias 150 have top surfaces substantially coplanar with the ILD layer 148. The source/drain vias 150 may include metal materials such as copper, aluminum, tungsten, combinations thereof, or the like, and may be formed using PVD, CVD, ALD, or the like. In some embodiments, the source/drain vias 150 may further include one or more barrier/adhesion layers (not shown) to protect the ILD layer 148 and/or the ESL 146 from metal diffusion (e.g., copper diffusion). The one or more barrier/adhesion layers may include titanium, titanium nitride, tantalum, tantalum nitride, or the like, and may be formed using PVD, CVD, ALD, or the like.

Figure 16B:
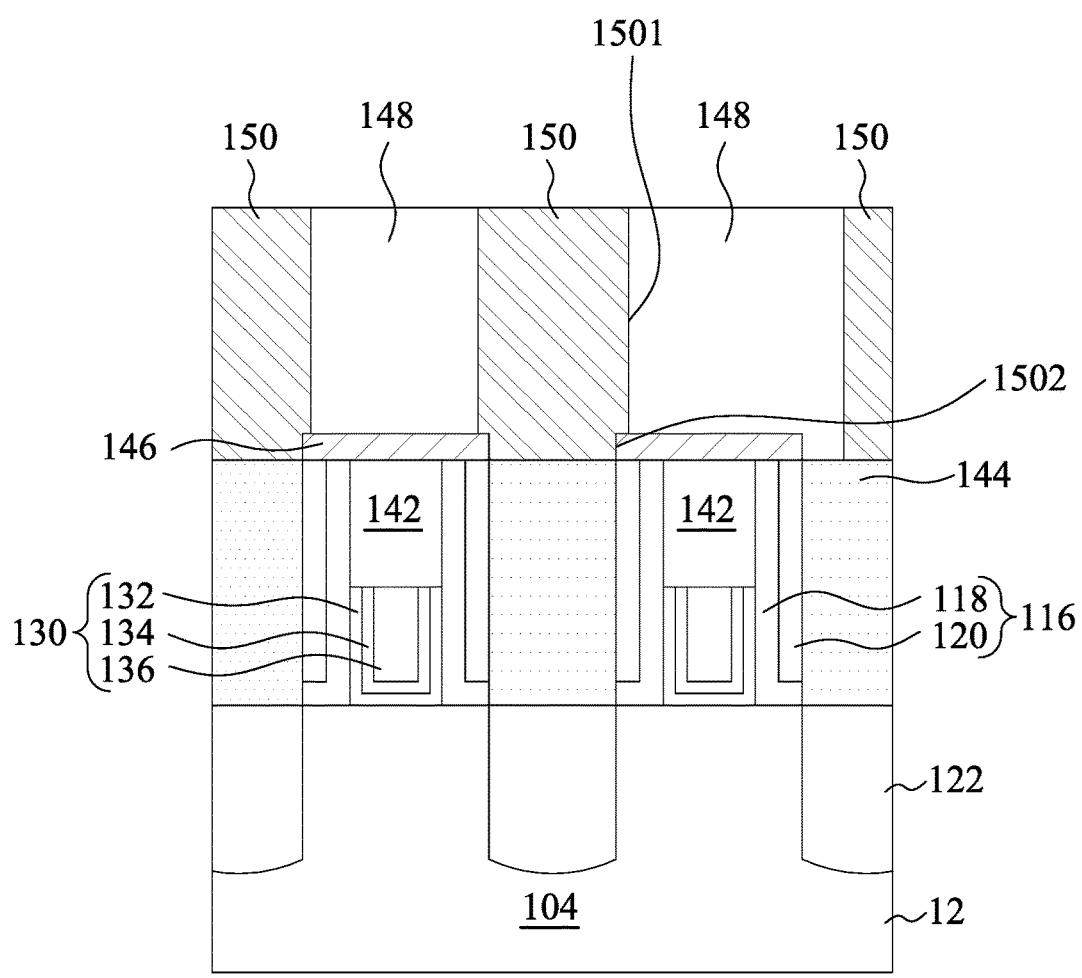

As shown in FIGS. 16A and 16B, the source/drain vias 150 may be aligned with the source/drain contact 144 or be misaligned with the source/drain contact 144 due to lithography overlay errors. The source/drain vias 150 inherit the geometry of the via openings O1. Stated differently, sidewalls of the source/drain vias 150 extend linearly through the ILD layer 148 and have steps (or notched corner) formed at the interface between the ILD 148 and the ESL 146. For example, the ILD layer 148 has a stepped bottom surface with an upper step contacting the etch stop layer 146 and a lower step contacting the source/drain contact 144. In greater detail, a source/drain via 150 forms a first linear interface 1501 with the ILD layer 148, and a second linear interface 1502 with the ESL 146. The first linear interface 1501 and the second linear interface 1502 are not coterminous, and the first linear interface 1501 and the second linear interface 1502 are misaligned with each other. In some embodiments, the first linear interface 1501 is more slanted than the second linear interface 1502. Further, the second linear interface 1502 is substantially aligned with a sidewall 1441 of the source/drain contact 144. That is, the etch stop layer 146 has a step distance above the source/drain contact 144.

In some embodiments as depicted in FIG. 16A, the source/drain vias 150 have tapered sidewall profile due to the nature of anisotropic etching of the etching process ET1. However, in some other embodiments, the etching conditions of the etching process ET1 may be fined-tune to allow the via openings O1 and hence the source/drain vias 150 having vertical sidewall profile, as illustrated in FIG. 16B.

Figure 17:
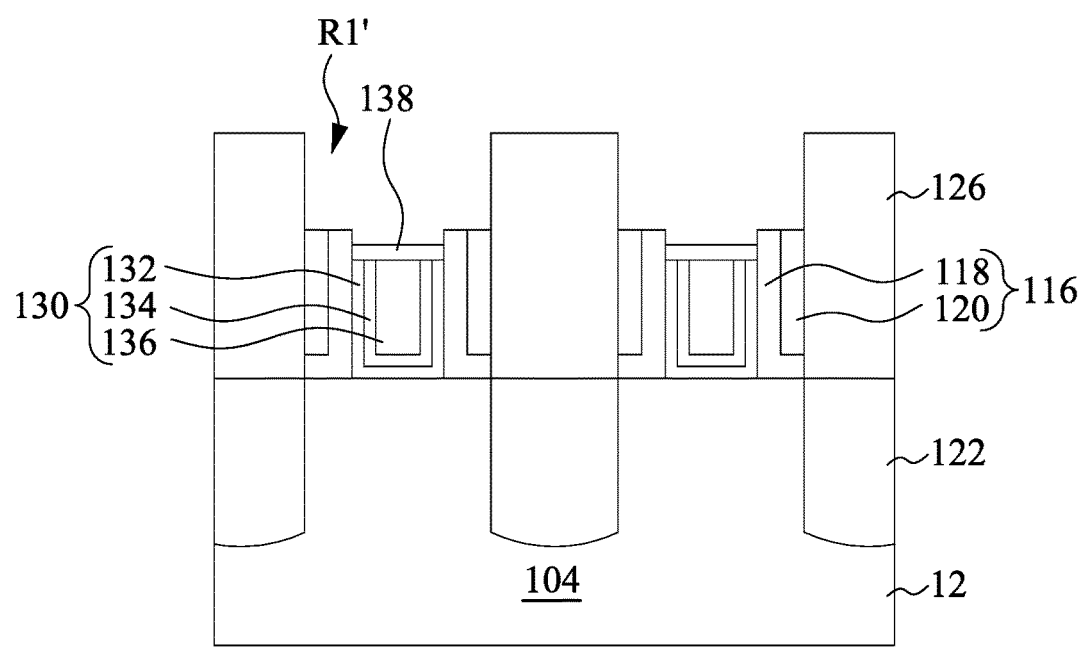
FIGS. 17, 18A, and 18B illustrate exemplary cross sectional views of various stages for manufacturing an integrated circuit structure according to some other embodiments of the present disclosure.
Figure 18A:
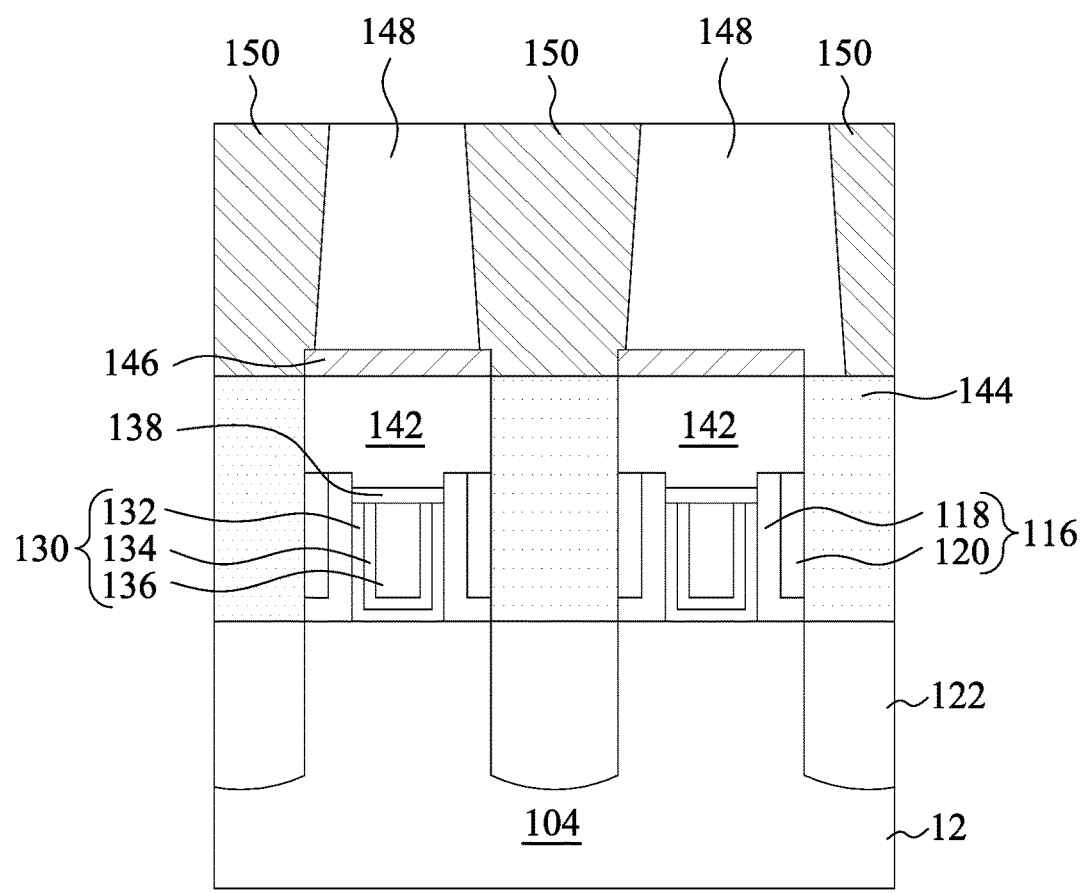
Figure 18B:
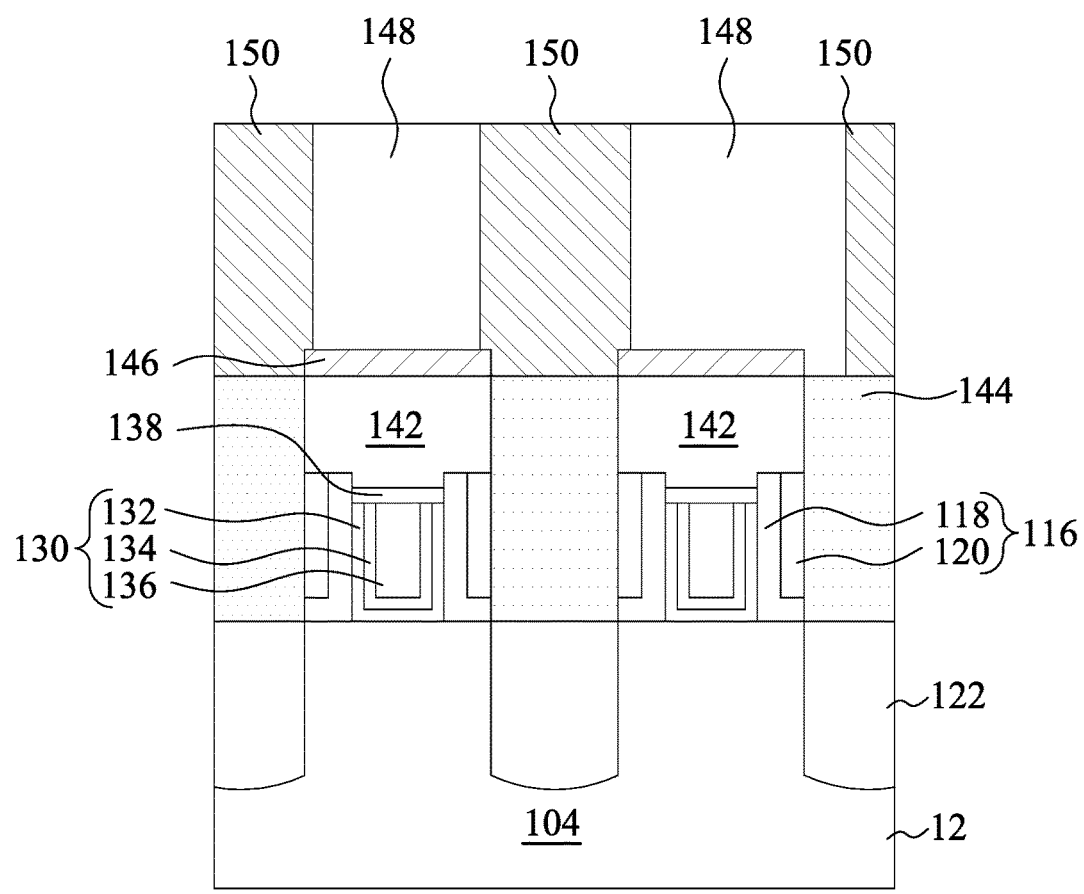

FIGS. 17-18B illustrate exemplary cross sectional views of various stages for manufacturing an integrated circuit structure 100 according to some other embodiments of the present disclosure. It is understood that additional operations can be provided before, during, and after processes shown by FIGS. 17-18B, and some of the operations described below can be replaced or eliminated, for additional embodiments of the method. The order of the operations/processes may be interchangeable. The same or similar configurations, materials, processes and/or operation as described with FIGS. 1-18B may be employed in the following embodiments, and the detailed explanation may be omitted.

After the structure as shown in FIG. 8 is formed, an etching back process is performed to etch back the replacement gate structures 130 and the gate spacers 116, resulting in recesses R1' over the etched-back gate structures 130 and the etched-back gate spacers 116. In some embodiments, because the materials of the replacement gate structures 130 have a different etch selectivity than the gate spacers 116, a first selective etching process may be performed to etch back the replacement gate structures 130 to lower the replacement gate structures 130. Then, a second selective etching process is performed to lower the gate spacers 116. As a result, the top surfaces of the replacement gate structures 130 may be at a lower level than the top surfaces of the gate spacers 116. For example, in the depicted embodiment as illustrated in FIG. 17, the replacement gate structures 130 have top surfaces lower than the top surfaces of the gate spacers 116. However, in some other embodiments, the top surfaces of the replacement gate structures 130 may be level with or higher than the top surfaces of the gate spacers 116.

In some embodiments, metal caps 138 are formed respectively atop the replacement gate structures 130 by suitable process, such as CVD or ALD. In some embodiments, the metal caps 138 are formed on the replacement gate structures 130 using a bottom-up approach. For example, the metal caps 138 are selectively grown on the metal surface, such as the work function metal layer 134 and the fill metal 136, and thus the sidewalls of the gate spacers 116 are substantially free from the growth of the metal caps 138. The metal caps 138 may be, by way of example and not limitation, substantially fluorine-free tungsten (FFW) films having an amount of fluorine contaminants less than 5 atomic percent and an amount of chlorine contaminants greater than 3 atomic percent. The FFW films or the FFW-comprising films may be formed by ALD or CVD using one or more non-fluorine based tungsten precursors such as, but not limited to, tungsten pentachloride ($WCl_5$), tungsten hexachloride ($WCl_6$). In some embodiments, portions of the metal caps 138 may overflow over the gate dielectric layer 132, such that the metal caps 138 may also cover the exposed surface of the gate dielectric layers 132. Since the metal caps 138 are formed in a bottom-up manner, the formation thereof may be simplified by, for example, reducing repeated etching back processes which are used to remove unwanted metal materials resulting from conformal growth.

The structure of FIG. 17 then undergoes the processes shown in FIGS. 10-16A to complete the formation of the source/drain vias 150 as shown in FIG. 18A. In some embodiments as depicted in FIG. 18A, the source/drain vias 150 have tapered sidewall profile due to the nature of anisotropic etching of the etching process ET1. However, in some other embodiments, the etching conditions of the etching process ET1 may be fined-tune to allow the via openings O1 and hence the source/drain vias 150 having vertical sidewall profile, as illustrated in FIG. 18B.

Figure 19:
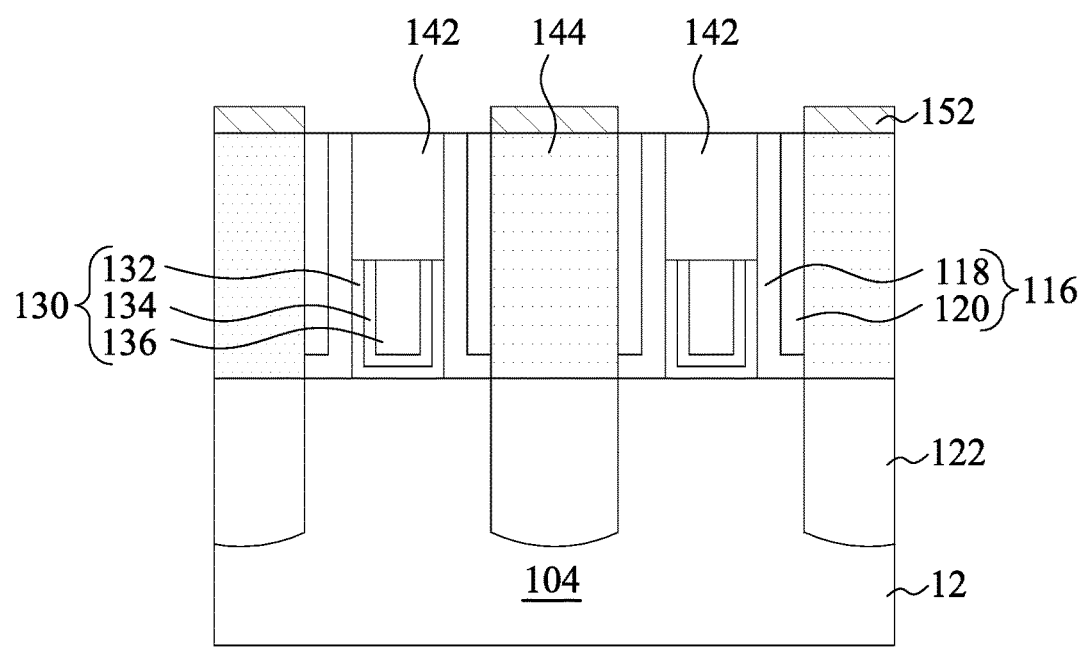
FIGS. 19-21 illustrate exemplary cross sectional views of various stages for manufacturing an integrated circuit structure according to some other embodiments of the present disclosure.
Figure 20:
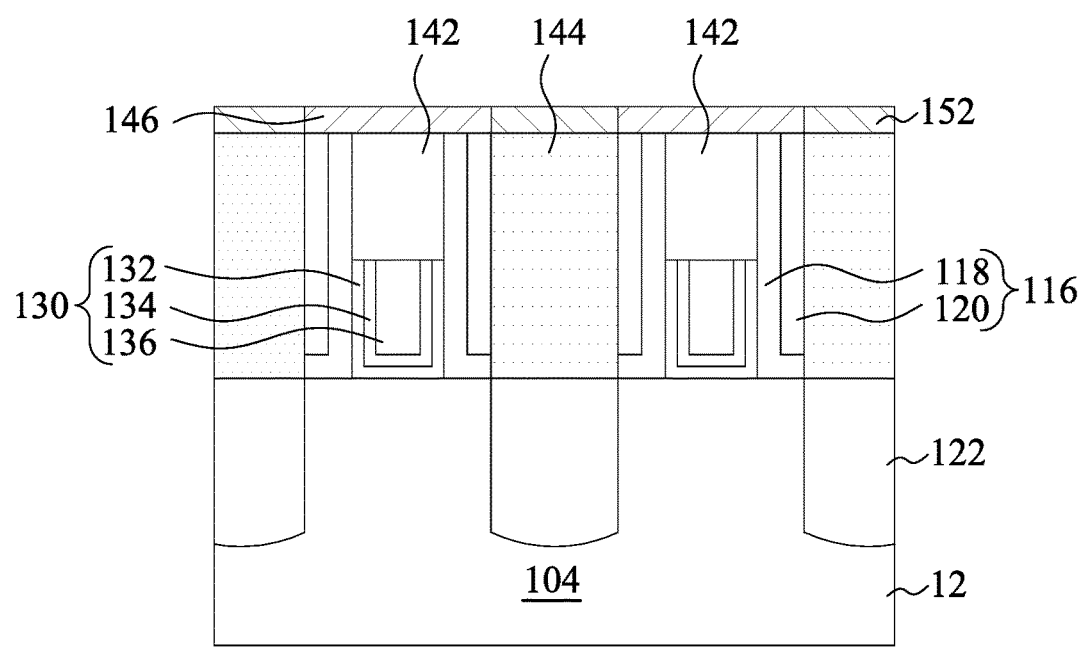
Figure 21:
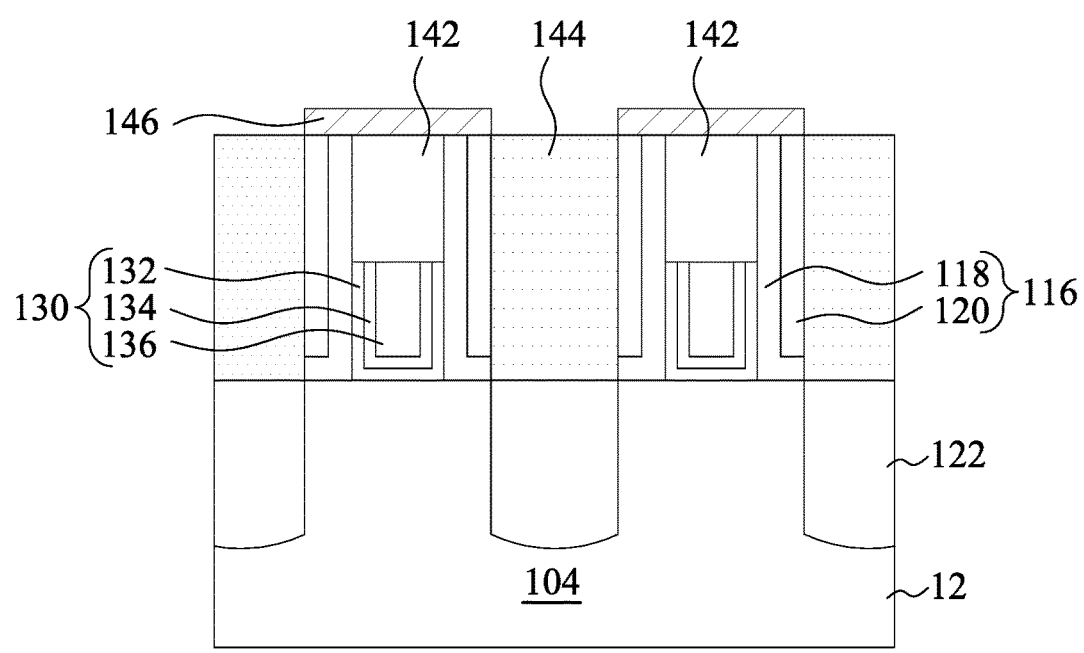

The formation of the ESL 146 is not limited to the processes shown in FIG. 13. In some other embodiments, the ESL 146 is formed with the assistance of a blocking layer. FIGS. 19-21 illustrate exemplary cross sectional views of various stages for manufacturing an integrated circuit structure 100 according to some other embodiments of the present disclosure. After the structure as shown in FIG. 12 is formed, blocking layers 152 are respectively formed over metals (e.g., the source/drain contacts 144 in this case). In some embodiments, the blocking layers 152 are polymer, benzotriazole (BTA), or self-assemble monolayer (SAM).

In some embodiments, the blocking layers 152 are made of BTA. The structure of FIG. 12 can be disposed in a depositing chamber, and (vapored or liquid) BTA as well as reaction gases are introduced into the depositing chamber. Due to the material properties, BTA molecules have a tendency not to adhere to the surface of dielectric materials (e.g., the SAC caps 142 and the gate spacers 116) and have a tendency to adhere to the surfaces of metals (e.g., the source/drain contacts 144 in this case). As such, the blocking layers 152 are respectively formed over the source/drain contacts 144.

In some other embodiments, the blocking layers 152 are made of SAM. The SAM includes silane-type inhibitor or thiol-type inhibitor. In some embodiments, the silane-type inhibitor may be Octadecyltrichlorosilane ($CH_3(CH_2)_{17}SiCl_3$), Trichloro(1H, 1H, 2H, 2H-perfluorooctyl)silane ($CF_3(CF_2)_5(CH_2)_2SiCl_3$), Dimethyldichlorosilane (($CH_3)_2SiCl_2$)/(Dimethylamino)trimethyl silane (($CH_3)_2NSi(CH_3)_3$), 1-(Trimethylsilyl)pyrrolidine (($CH_3)_3Si$—$NC_4H_8$), Hexamethyldisilazane ($[(CH_3)_3Si]_2NH$), or Bis(dimethylamino)dimethylsilane ($[(CH_3)_2N]_2Si(CH_3)_2$). In some other embodiments, the thiol-type inhibitor are alkanethiol, propanethiol, butanethiol, hexanethiol, heptanethiol, Octadecanethiol, nonanethiol, or dodecanethiol. In some embodiments, thiol-type inhibitor are selectively formed on a metal layer, and not formed on a dielectric layer.

In some embodiments where the blocking layers 152 are self-assemble monolayer (SAM), the molecules of the blocking layers 152 each have a first protruding end portion (e.g., head group) and a second protruding end portion (e.g., terminal group) that are located on opposite sides of an optional middle portion (molecular chain). The first protruding end portion includes a group that is selectively attached to hydroxyl group terminated surfaces (i.e., —OH terminated surfaces, such as silicon oxide surfaces), while not attaching to hydrogen terminated surfaces (such as silicon nitride surfaces having H termination) after native oxide removal by $NH_4F$. The second protruding end portion includes a metal oxide deposition inhibitor group. The optional middle portion may include an alkyl chain. The Van der Waals interactions between these chains cause the self-assembled monolayers to be ordered. In some embodiments where the blocking layers 152 includes alkanethiosls (X—$(CH_2)_n$—SH), the head group can be bound to a surface of a metal material. As such, the blocking layers 152 can be selectively formed (grown) on a metal layer and not on a dielectric layer.

Referring to FIG. 20, a deposition process (e.g., an ALD process) is employed to form the ESL 146 over the dielectric materials (e.g., the SAC caps 142 and the gate spacers 116). Due to the material properties, precursors of the ALD process have a tendency not to adhere to the surface of the blocking layers 152. Thus, during the ALD process, the ESLs 146 are formed over the SAC caps 142 and the gate spacers 116, but leaving the top surfaces of the blocking layers 152 uncovered.

Referring to FIG. 21. The blocking layers 152 (referring to FIG. 20) are removed to expose the top surfaces of the source/drain contacts 144. In some embodiments where the blocking layers 152 are removed by baking, the baking temperature may be in a range of about 1° C. to about 60° C. to decompose C—H bonding of the blocking layers 152. Then, the decomposed portion of blocking layers 152 may be washed by dilute acidic solution, such as $H_3PO_4$, HCl, or other suitable solutions. In some other embodiments where the blocking layers 152 is removed by etching, the etchants may include $CF_3$, $C_4F_6$, $CHF_3$, $CH_2F_2$, $CH_3F$, $NF_3$, or other suitable materials. The structure of FIG. 21 then undergoes the processes shown in FIGS. 14-16A (or 14-15B and 16B) to complete the formation of the source/drain vias 150.

FIGS. 22-25 illustrate exemplary cross sectional views of various stages for manufacturing an integrated circuit structure 100a according to some other embodiments of the present disclosure. It is understood that additional operations can be provided before, during, and after processes shown by FIGS. 22-25, and some of the operations described below can be replaced or eliminated, for additional embodiments of the method. The order of the operations/processes may be interchangeable. The same or similar configurations, materials, processes and/or operation as described with FIGS. 1-16B may be employed in the following embodiments, and the detailed explanation may be omitted.

Figure 22:
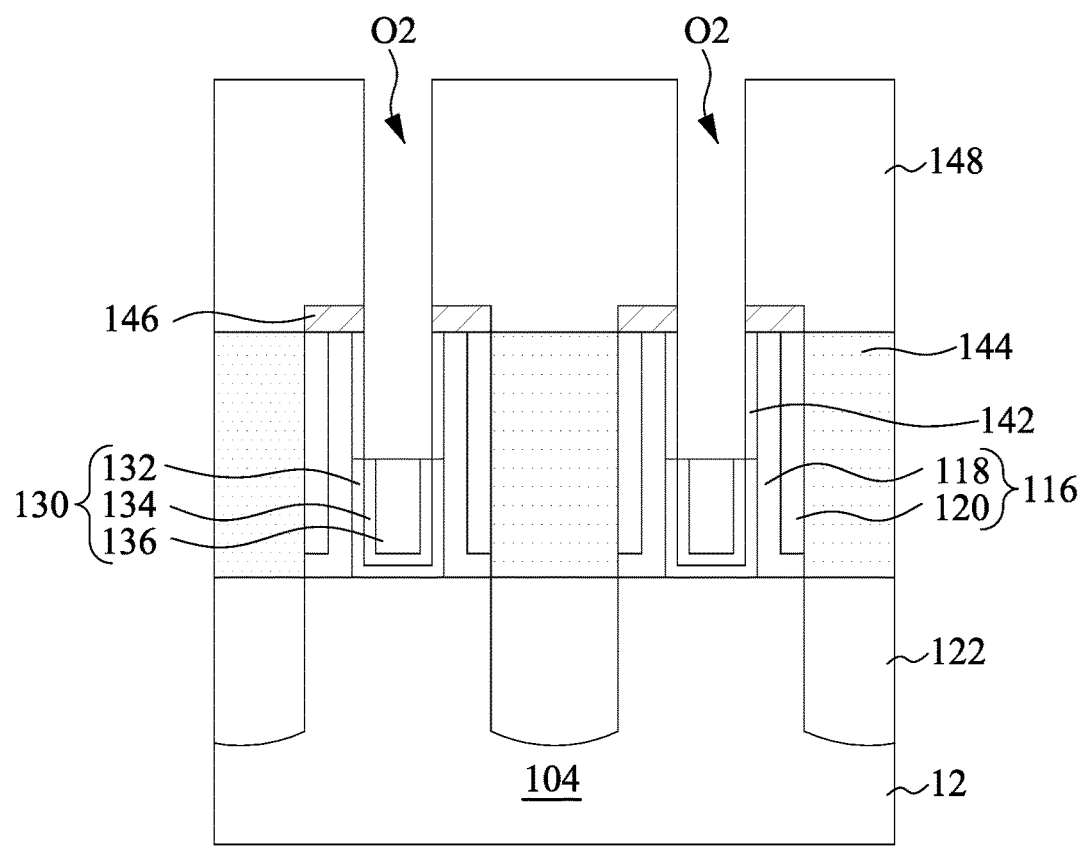
FIGS. 22-25 illustrate exemplary cross sectional views of various stages for manufacturing an integrated circuit structure according to some other embodiments of the present disclosure.

After the structure as shown in FIG. 14 is formed, the ILD layer 148 is patterned to form gate contact openings O2 extending downward though the ILD layer 148, the ESL 146 and the dielectric cap 142 to the replacement gate structures 130. The resulting structure is illustrated in FIG. 22. The ILD layer 148 can be patterned by using suitable photolithography and etching techniques.

Figure 23:
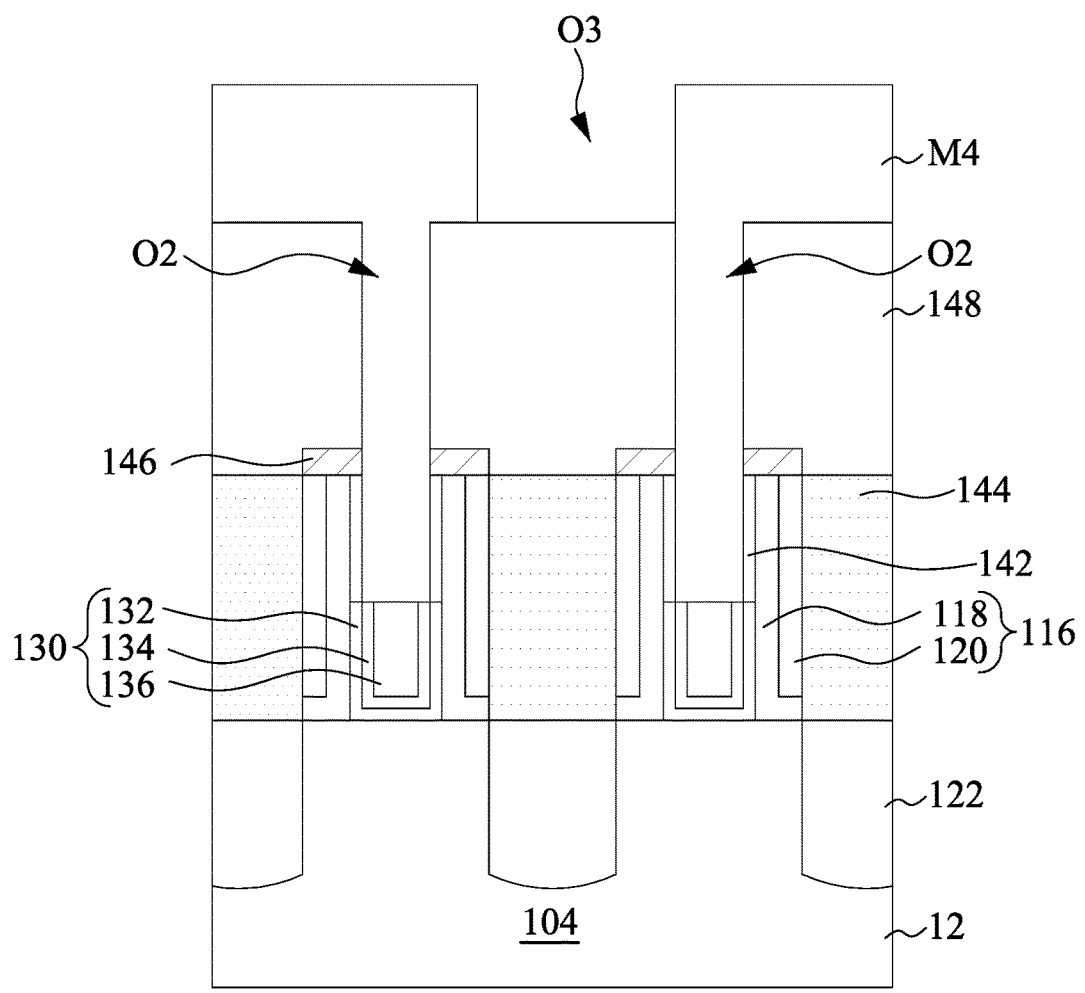

Next, as illustrated in FIG. 23, a patterned mask layer M4 is formed over the substrate 12 to fill the gate contact openings O2. The patterned mask layer M4 has an opening O3 vertically above a source/drain contact 144. In some embodiments, the patterned mask layer M4 may be a photoresist mask formed by suitable photolithography process. For example, the photolithography process may include spin-on coating a photoresist layer over the structure as illustrated in FIG. 22, performing post-exposure bake processes, and developing the photoresist layer to form the patterned mask layer M4. In some embodiments, patterning the resist to form the patterned mask element may be performed using an electron beam (e-beam) lithography process or an extreme ultraviolet (EUV) lithography process.

Figure 24:
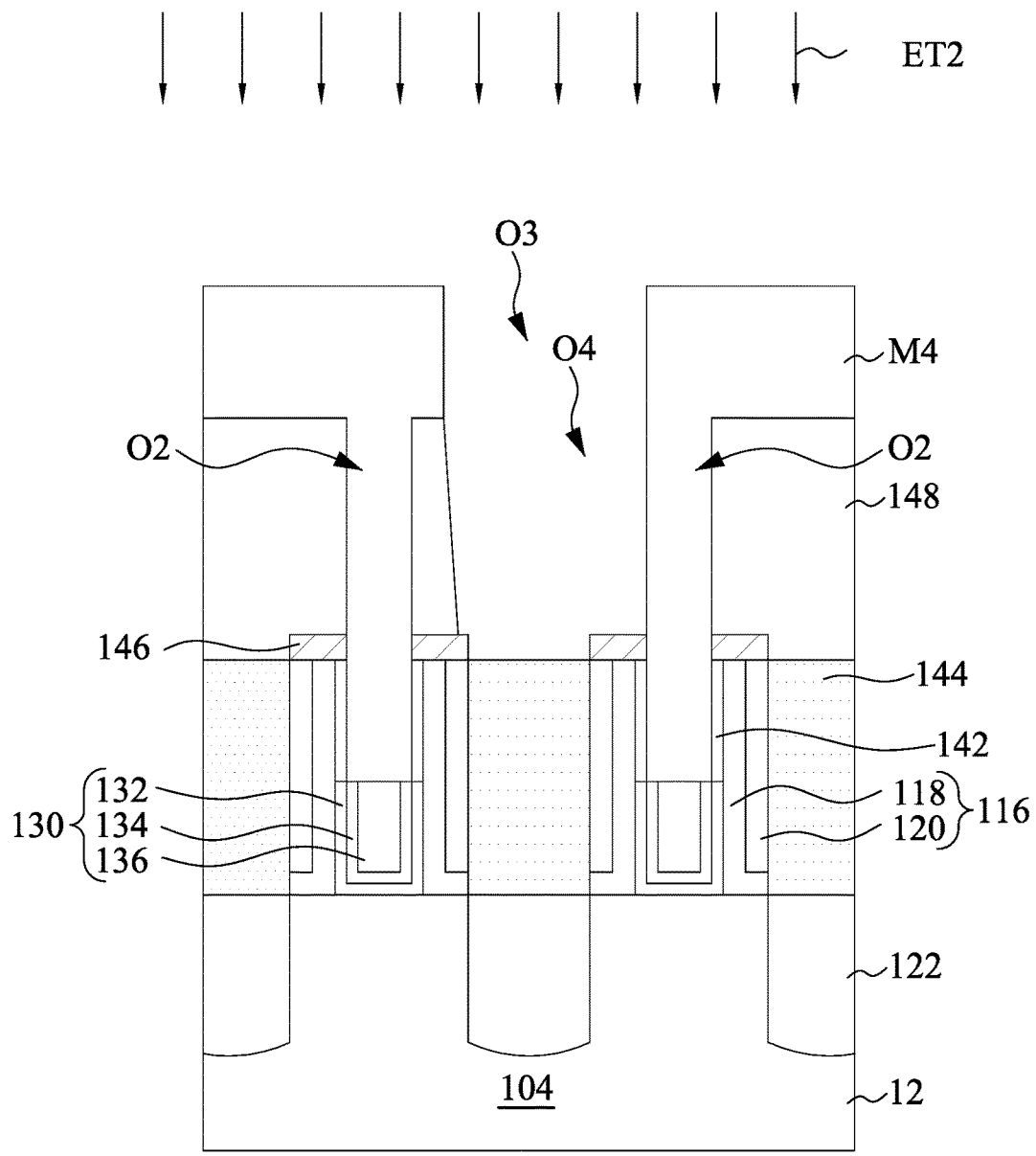

Referring to FIG. 24, with the patterned mask layer M4 in place, a via etching process ET2 is performed to form a via opening O4 extending through the ILD layer 148. The etching duration time of the via etching process ET2 is controlled to break through the ILD layer 148. As a result of the etching process ET2, the source/drain contacts 144 get exposed at bottoms of the via openings O4. Process details about the via etching process ET2 are discussed previously with respect to the via etching process ET1, and thus they are not repeated herein for the sake of brevity.

Figure 25:
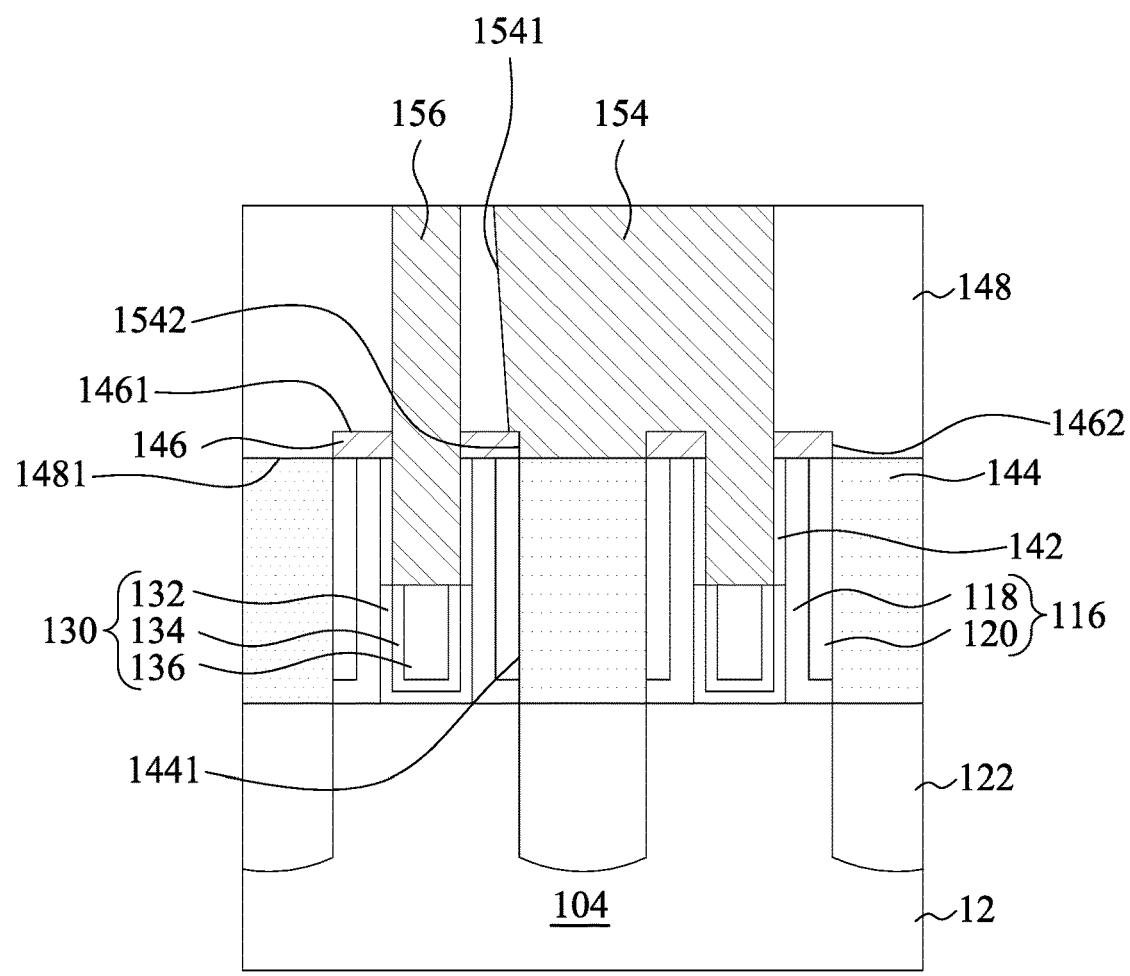

Referring to FIG. 25, the patterned mask layer M4 (referring to FIG. 24) is removed from the gate contact openings O2 by ashing and/or wet stripping, and then a butted contact (or butted via) 154 is formed to fill the via opening O4 and the gate contact opening O2 and a gate contact 156 is formed to fill another gate contact opening O2. The resulting structure is illustrated in FIG. 25. Materials and fabrication process details about the butted contact 154 and the gate contact 156 are similar to that about the source/drain vias 150, and thus they are not repeated herein for the sake of brevity.

In FIG. 25, the ILD layer 148 has a bottom surface 1481 lower than a top surface 1461 of the ESL 146. Also, the top surface 1461 of the ESL 146 is higher than a top surface of the source/drain contact 144. The ILD layer 148 is further in contact with sidewalls 1462 of the ESL 146. Further, the ILD layer 148 is in contact with some of the source/drain contacts 144.

The butted contact 154 inherits the geometry of the via openings O2 and O4. Stated differently, sidewalls of the butted contact extend linearly through the ILD layer 148 and have steps (or notched corner) formed at the interface between the ILD layer 148 and the ESL 146. For example, the ILD layer 148 has a stepped bottom surface with an upper step contacting the top surface 1461 of the etch stop layer 146 and a lower step contacting a top surface (i.e., the surface 1481) of the source/drain contact 144. In greater detail, the butted contact 154 forms a first linear interface 1541 with the ILD layer 148, and a second linear interface 1542 with the ESL 146. The first linear interface 1541 and the second linear interface 1542 are not coterminous, and the first linear interface 1541 and the second linear interface 1542 are misaligned with each other. In some embodiments, the first linear interface 1541 is more slanted than the second linear interface 1542. Further, the second linear interface 1542 is substantially aligned with a sidewall 1441 of the source/drain contact 144 connected to the butted contact 154. Moreover, the butted contact 154 has a greater thickness over the gate structure 130 than over the source/drain contact 144.

FIGS. 26-43B illustrate perspective views and cross-sectional views of intermediate stages in the formation of an integrated circuit structure 200 in accordance with some embodiments of the present disclosure. The formed transistors may include a p-type transistor (such as a p-type GAA FET) and an n-type transistor (such as an n-type FAA FET) in accordance with some exemplary embodiments. Throughout the various views and illustrative embodiments, like reference numbers are used to designate like elements. It is understood that additional operations can be provided before, during, and after the processes shown by FIGS. 26-43B, and some of the operations described below can be replaced or eliminated, for additional embodiments of the method. The order of the operations/processes may be interchangeable.

FIGS. 26, 27, 28, 29A, 30A, 31A, and 32A are perspective views of some embodiments of the integrated circuit structure 200 at intermediate stages during fabrication. FIGS. 29B, 30B, 31B, 32B, 33-35, 36A, 37-43B are cross-sectional views of some embodiments of the integrated circuit structure 200 at intermediate stages during fabrication along a first cut (e.g., cut X-X in FIG. 29A), which is along a lengthwise direction of the channel and perpendicular to a top surface of the substrate. FIG. 36B is a cross-sectional view of some embodiments of the integrated circuit structure 200 at intermediate stages during fabrication along a second cut (e.g., cut Y-Y in FIG. 29A), which is in the gate region and perpendicular to the lengthwise direction of the channel.

Figure 26:
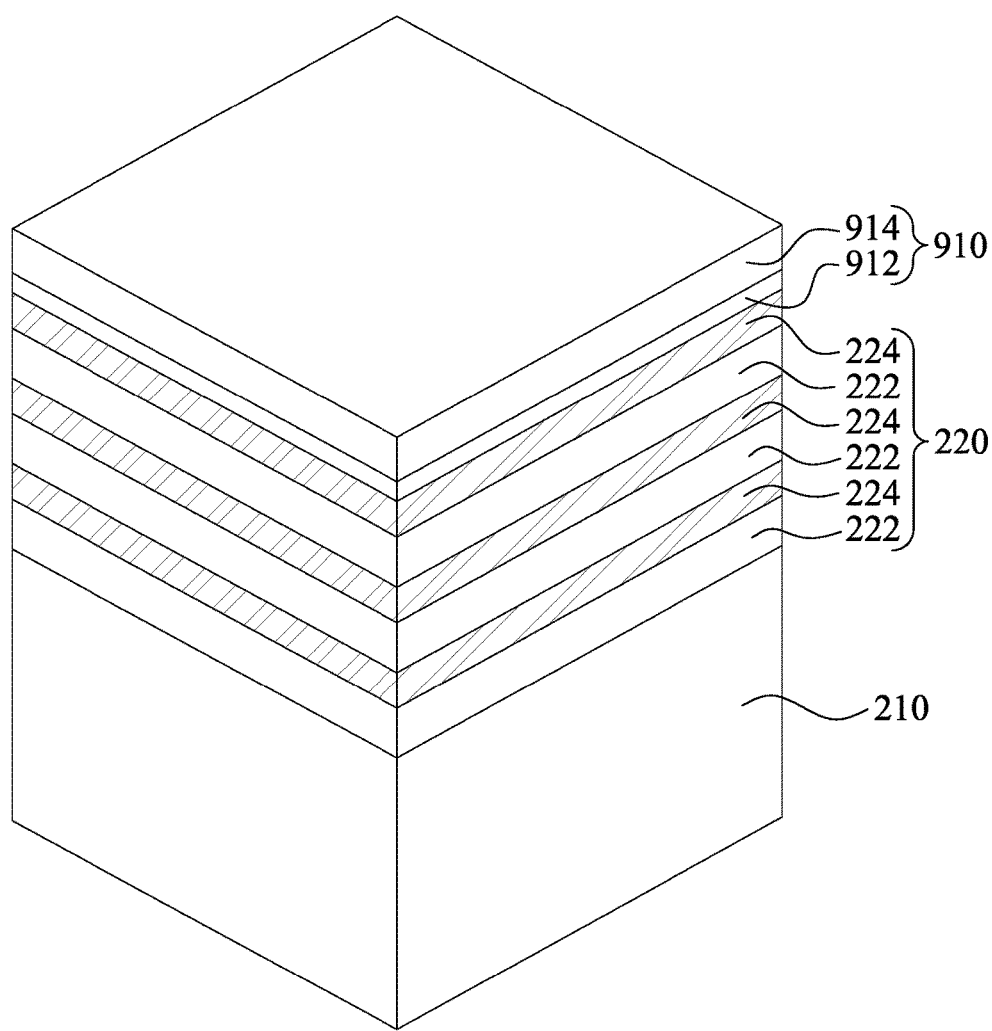
FIGS. 26, 27, 28, 29A, 29B, 30A, 30B, 31A, 31B, 32A, 32B, 33, 34, 35, 36A, 36B, 37, 38, 39, 40, 41, 42A, 42B, 43A, and 43B illustrate perspective views and cross-sectional views of intermediate stages in the formation of an integrated circuit structure in accordance with some embodiments of the present disclosure.

Referring to FIG. 26, an epitaxial stack 220 is formed over the substrate 210. In some embodiments, the substrate 210 may include silicon (Si). Alternatively, the substrate 210 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or another appropriate method.

The epitaxial stack 220 includes epitaxial layers 222 of a first composition interposed by epitaxial layers 224 of a second composition. The first and second compositions can be different. In some embodiments, the epitaxial layers 222 are SiGe and the epitaxial layers 224 are silicon (Si). However, other embodiments are possible including those that provide for a first composition and a second composition having different oxidation rates and/or etch selectivity. In some embodiments, the epitaxial layers 222 include SiGe and where the epitaxial layers 224 include Si, the Si oxidation rate of the epitaxial layers 224 is less than the SiGe oxidation rate of the epitaxial layers 222.

The epitaxial layers 224 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 224 to define a channel or channels of a device is further discussed below.

It is noted that three layers of the epitaxial layers 222 and three layers of the epitaxial layers 224 are alternately arranged as illustrated in FIG. 26, which is for illustrative purposes only and not intended to be limiting beyond what is specifically recited in the claims. It can be appreciated that any number of epitaxial layers can be formed in the epitaxial stack 220; the number of layers depending on the desired number of channels regions for the transistor. In some embodiments, the number of epitaxial layers 224 is between 2 and 10.

As described in more detail below, the epitaxial layers 224 may serve as channel region(s) for a subsequently-formed multi-gate device and the thickness is chosen based on device performance considerations. The epitaxial layers 222 in channel regions(s) may eventually be removed and serve to define a vertical distance between adjacent channel region(s) for a subsequently-formed multi-gate device and the thickness is chosen based on device performance considerations. Accordingly, the epitaxial layers 222 may also be referred to as sacrificial layers, and epitaxial layers 224 may also be referred to as channel layers.

By way of example, epitaxial growth of the layers of the epitaxial stack 220 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 224 include the same material as the substrate 210. In some embodiments, the epitaxially grown layers 222 and 224 include a different material than the substrate 210. As stated above, in at least some examples, the epitaxial layers 222 include an epitaxially grown silicon germanium (SiGe) layer and the epitaxial layers 224 include an epitaxially grown silicon (Si) layer. Alternatively, in some embodiments, either of the epitaxial layers 222 and 224 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 222 and 224 may be chosen based on providing differing oxidation and/or etching selectivity properties. In some embodiments, the epitaxial layers 222 and 224 are substantially dopant-free (i.e., having an extrinsic dopant concentration from about 0 $cm^{-3}$ to about $1 \times 10^{18}$ $cm^{-3}$), where for example, no intentional doping is performed during the epitaxial growth process.

Figure 27:
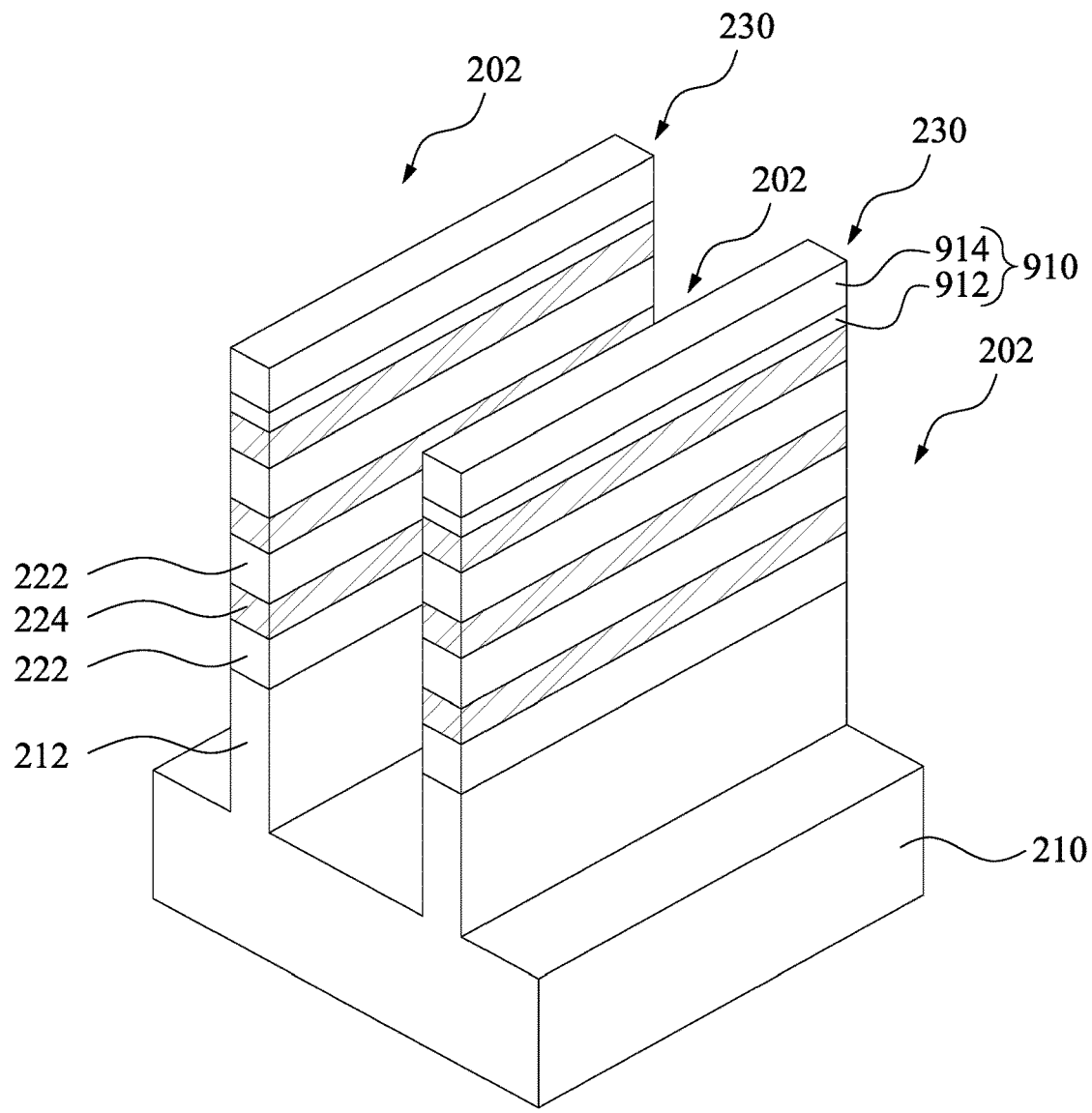

Referring to FIG. 27, a plurality of semiconductor fins 230 extending from the substrate 210 are formed. In various embodiments, each of the fins 230 includes a substrate portion 212 formed from the substrate 210 and portions of each of the epitaxial layers of the epitaxial stack including epitaxial layers 222 and 224. The fins 230 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 230 by etching initial epitaxial stack 220. The etching process can include dry etching, wet etching, reactive ion etching (RIE), and/or other suitable processes.

In the illustrated embodiment as illustrated in FIGS. 26 and 27, a hard mask (HM) layer 910 is formed over the epitaxial stack 220 prior to patterning the fins 230. In some embodiments, the HM layer includes an oxide layer 912 (e.g., a pad oxide layer that may include $SiO_2$) and a nitride layer 914 (e.g., a pad nitride layer that may include $Si_3N_4$) formed over the oxide layer. The oxide layer 912 may act as an adhesion layer between the epitaxial stack 220 and the nitride layer 914 and may act as an etch stop layer for etching the nitride layer 914. In some examples, the HM oxide layer 912 includes thermally grown oxide, chemical vapor deposition (CVD)-deposited oxide, and/or atomic layer deposition (ALD)-deposited oxide. In some embodiments, the HM nitride layer 914 is deposited on the HM oxide layer 912 by CVD and/or other suitable techniques.

The fins 230 may subsequently be fabricated using suitable processes including photolithography and etch processes. The photolithography process may include forming a photoresist layer (not shown) over the HM layer 910, exposing the photoresist to a pattern, performing post-exposure bake processes, and developing the photoresist to form a patterned mask including the photoresist. In some embodiments, patterning the photoresist to form the patterned mask element may be performed using an electron beam (e-beam) lithography process or an extreme ultraviolet (EUV) lithography process using light in EUV region, having a wavelength of, for example, about 1-200 nm. The patterned mask may then be used to protect regions of the substrate 210, and layers formed thereupon, while an etch process forms trenches 202 in unprotected regions through the HM layer 910, through the epitaxial stack 220, and into the substrate 210, thereby leaving the plurality of extending fins 230. The trenches 202 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 220 in the form of the fins 230.

Figure 28:
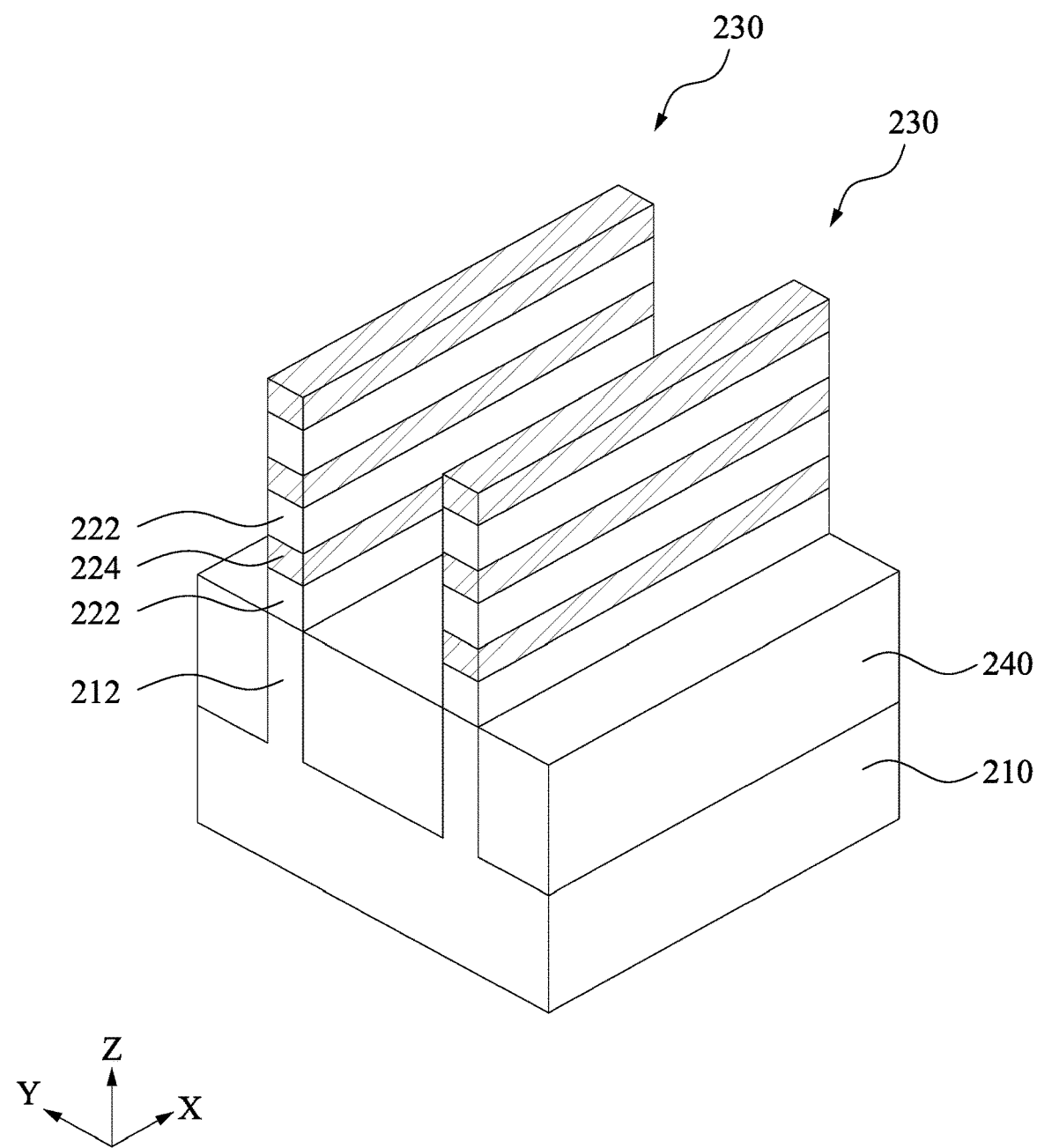

Next, as illustrated in FIG. 28, isolation regions 240 are formed interposing the fins 230. Materials and process details about the isolation regions 240 are similar to that of the isolation regions 14 discussed previous, and thus they are not repeated for the sake of brevity.

Figure 29A:
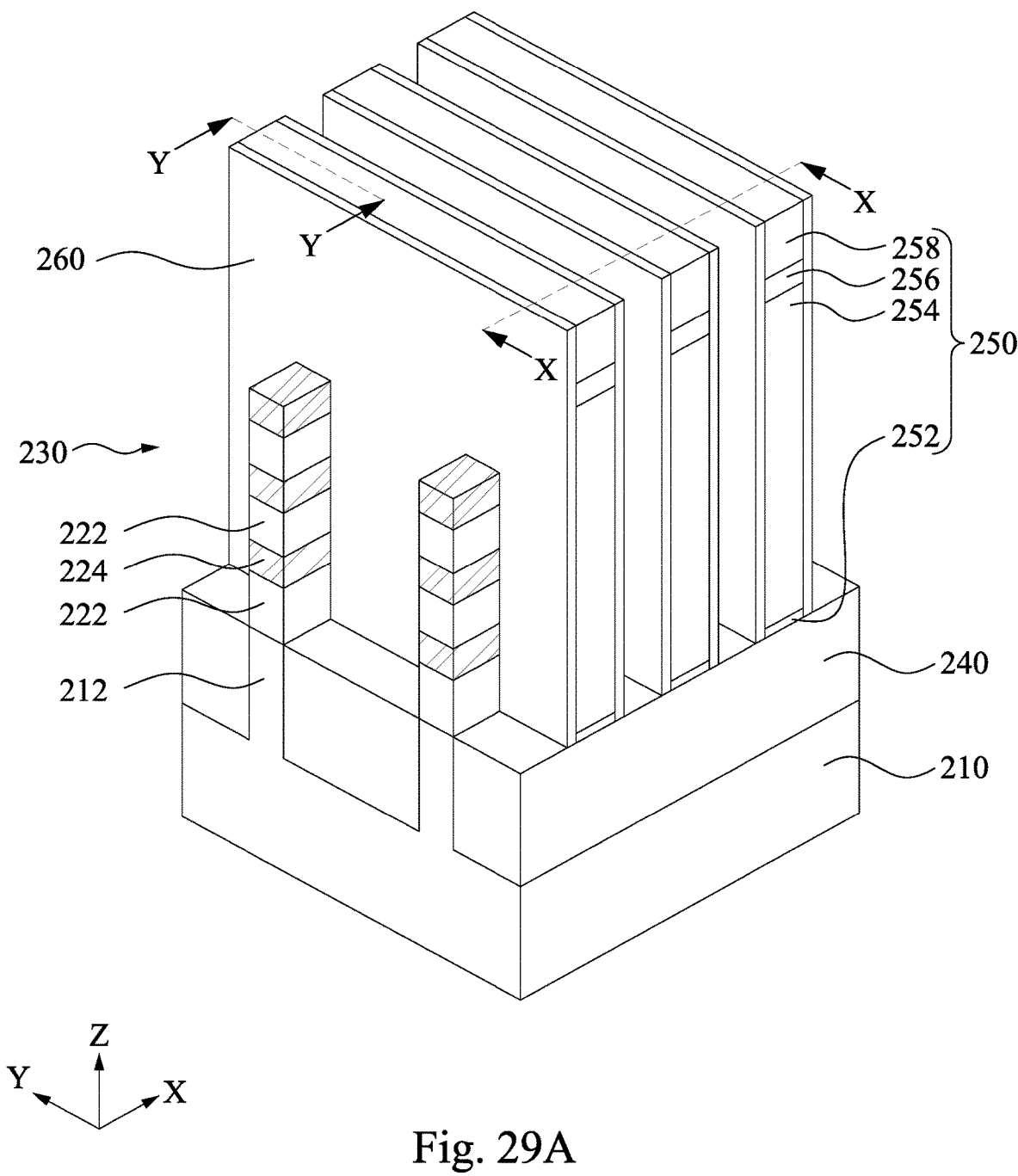
Figure 29B:
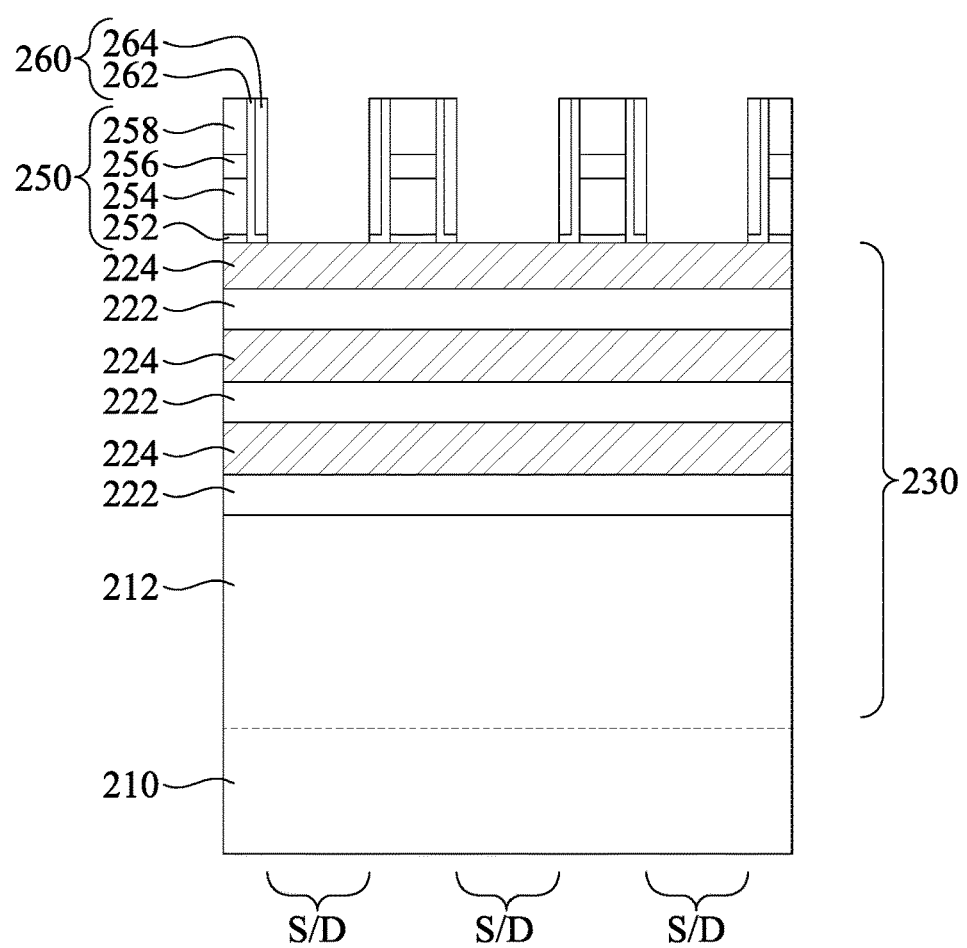

Reference is made to FIGS. 29A and 29B. Dummy gate structures 250 are formed over the substrate 210 and are at least partially disposed over the fins 230. The portions of the fins 230 underlying the dummy gate structures 250 may be referred to as the channel region. The dummy gate structures 250 may also define source/drain (S/D) regions of the fins 230, for example, the regions of the fins 230 adjacent and on opposing sides of the channel regions.

Dummy gate formation operation first forms a dummy gate dielectric layer 252 over the fins 230. Subsequently, a dummy gate electrode layer 254 and a hard mask which may include multiple layers 256 and 258 (e.g., an oxide layer 256 and a nitride layer 258) are formed over the dummy gate dielectric layer 252. The hard mask is then patterned, followed by patterning the dummy gate electrode layer 252 by using the patterned hard mask as an etch mask. In some embodiments, after patterning the dummy gate electrode layer 254, the dummy gate dielectric layer 252 is removed from the S/D regions of the fins 230. The etch process may include a wet etch, a dry etch, and/or a combination thereof. The etch process is chosen to selectively etch the dummy gate dielectric layer 252 without substantially etching the fins 230, the dummy gate electrode layer 254, the oxide mask layer 256 and the nitride mask layer 258. Materials of the dummy gate dielectric layer and dummy gate electrode layer are similar to that of the gate dielectric layer 108 and dummy gate electrode 110 discussed previously, and thus they are not repeated for the sake of brevity.

After formation of the dummy gate structures 250 is completed, gate spacers 260 are formed on sidewalls of the dummy gate structures 250. For example, a spacer material layer is deposited on the substrate 210. The spacer material layer may be a conformal layer that is subsequently etched back to form gate sidewall spacers. In the illustrated embodiment, a spacer material layer 260 is disposed conformally on top and sidewalls of the dummy gate structures 250. The spacer material layer 260 may include a dielectric material such as silicon oxide, silicon nitride, silicon carbide, silicon oxynitride, SiCN films, silicon oxycarbide, SiOCN films, and/or combinations thereof. In some embodiments, the spacer material layer 260 includes multiple layers, such as a first spacer layer 262 and a second spacer layer 264 (illustrated in FIG. 29B) formed over the first spacer layer 262. By way of example, the spacer material layer 260 may be formed by depositing a dielectric material over the dummy gate structures 250 using suitable deposition processes. An anisotropic etching process is then performed on the deposited spacer material layer 260 to expose portions of the fins 230 not covered by the dummy gate structure 250 (e.g., in source/drain regions of the fins 230). Portions of the spacer material layer directly above the dummy gate structure 250 may be completely removed by this anisotropic etching process. Portions of the spacer material layer on sidewalls of the dummy gate structure 250 may remain, forming gate sidewall spacers, which are denoted as the gate spacers 260, for the sake of simplicity. It is noted that although the gate spacers 260 are multi-layer structures in the cross-sectional view of FIG. 29B, they are illustrated as single-layer structures in the perspective view of FIG. 29A for the sake of simplicity.

Figure 30A:
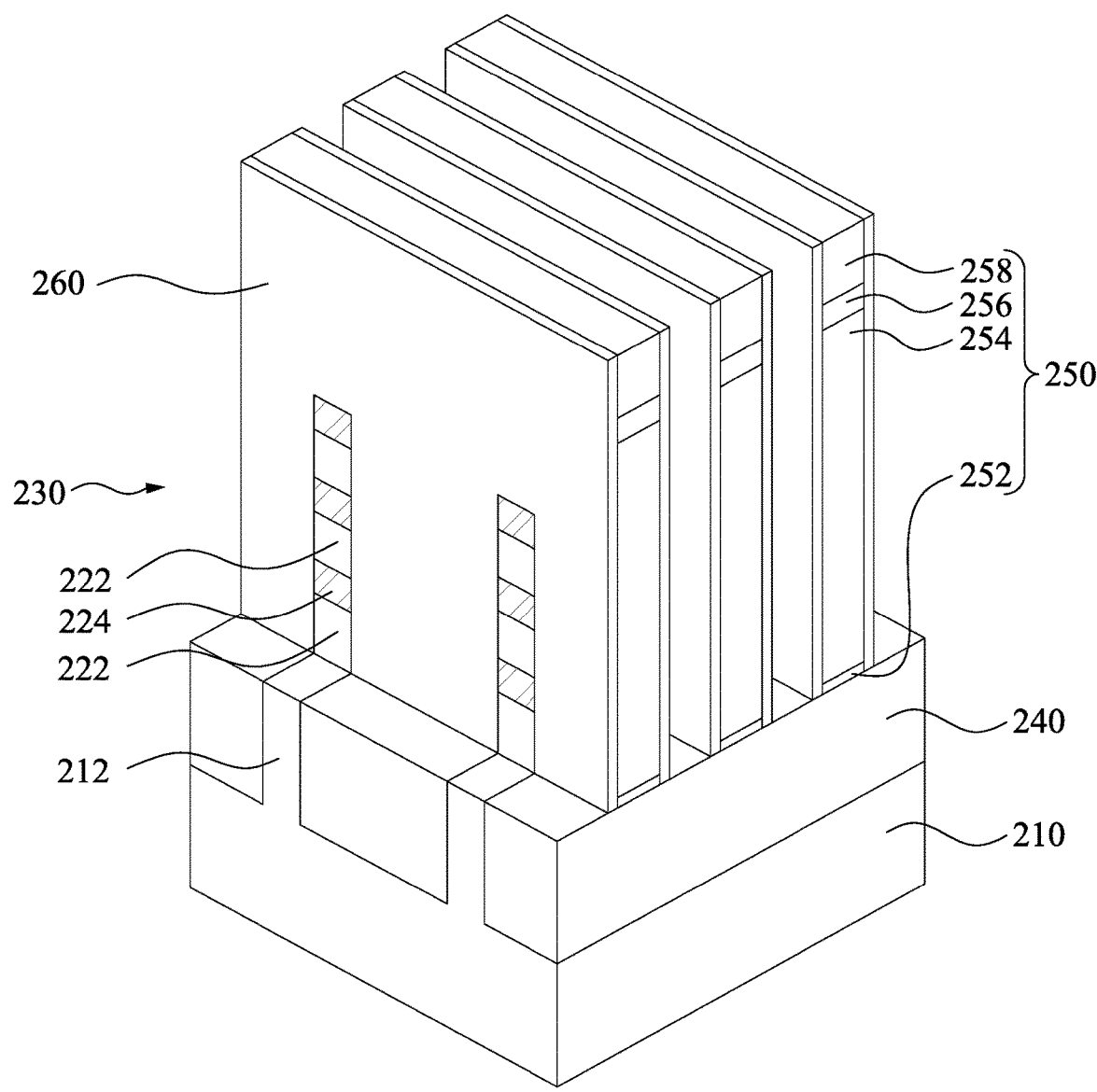
Figure 30B:
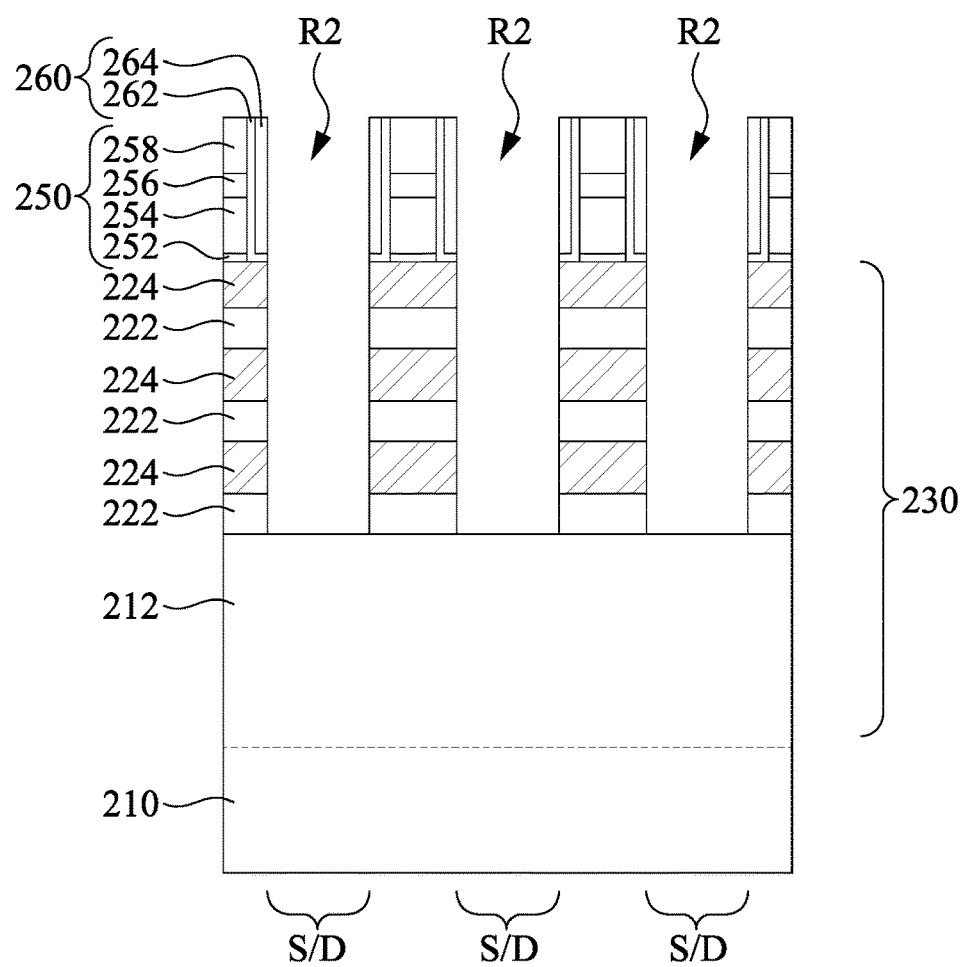

Next, as illustrated in FIGS. 30A and 30B, exposed portions of the semiconductor fins 230 that extend laterally beyond the gate spacers 260 (e.g., in source/drain regions of the fins 230) are etched by using, for example, an anisotropic etching process that uses the dummy gate structure 250 and the gate spacers 260 as an etch mask, resulting in recesses R2 into the semiconductor fins 230 and between corresponding dummy gate structures 250. After the anisotropic etching, end surfaces of the epitaxial layers 222 and channel layers 224 are aligned with respective outermost sidewalls of the gate spacers 260, due to the anisotropic etching. In some embodiments, the anisotropic etching may be performed by a dry chemical etch with a plasma source and a reaction gas. The plasma source may be an inductively coupled plasma (ICP) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 31A:
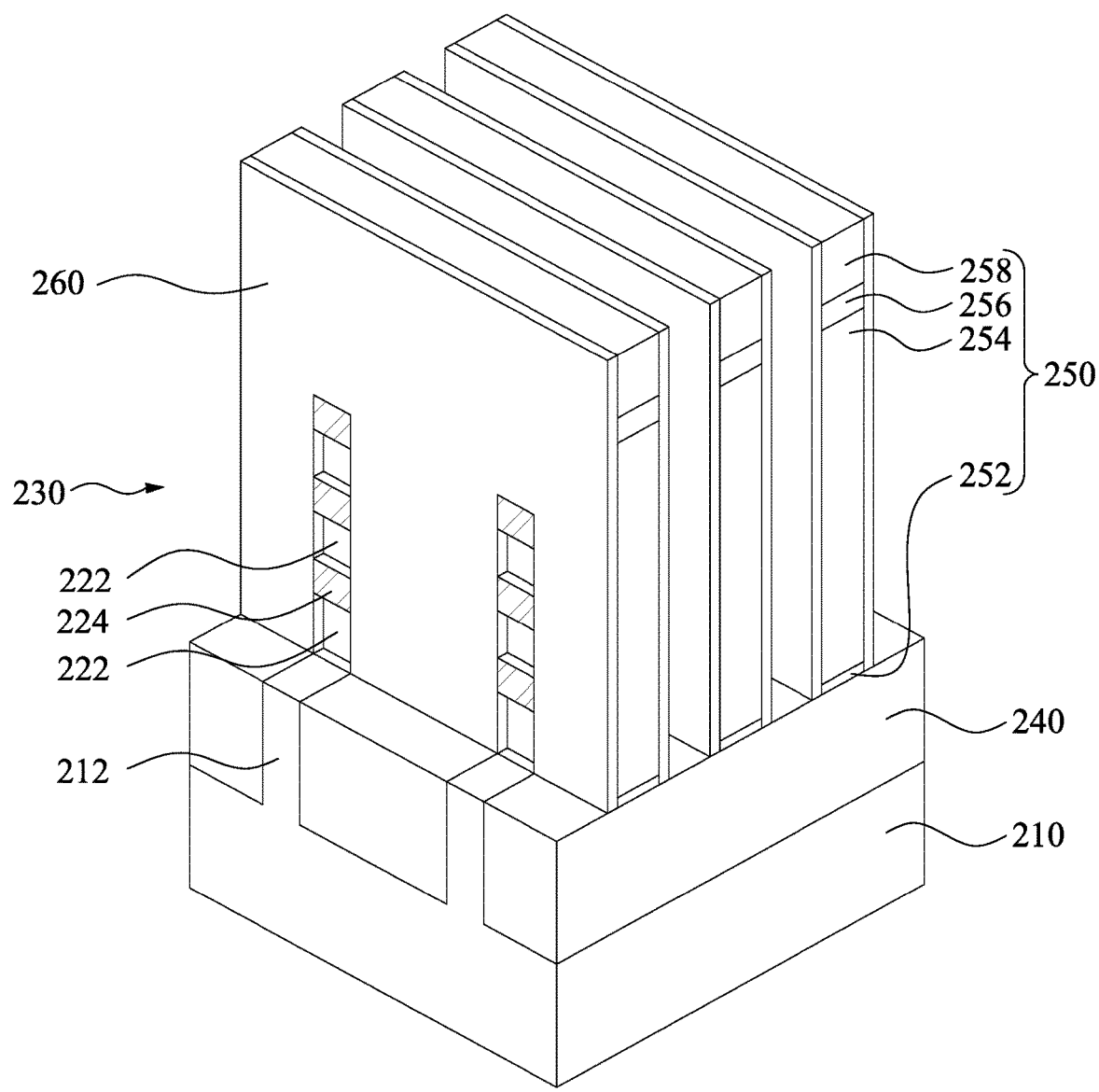
Figure 31B:
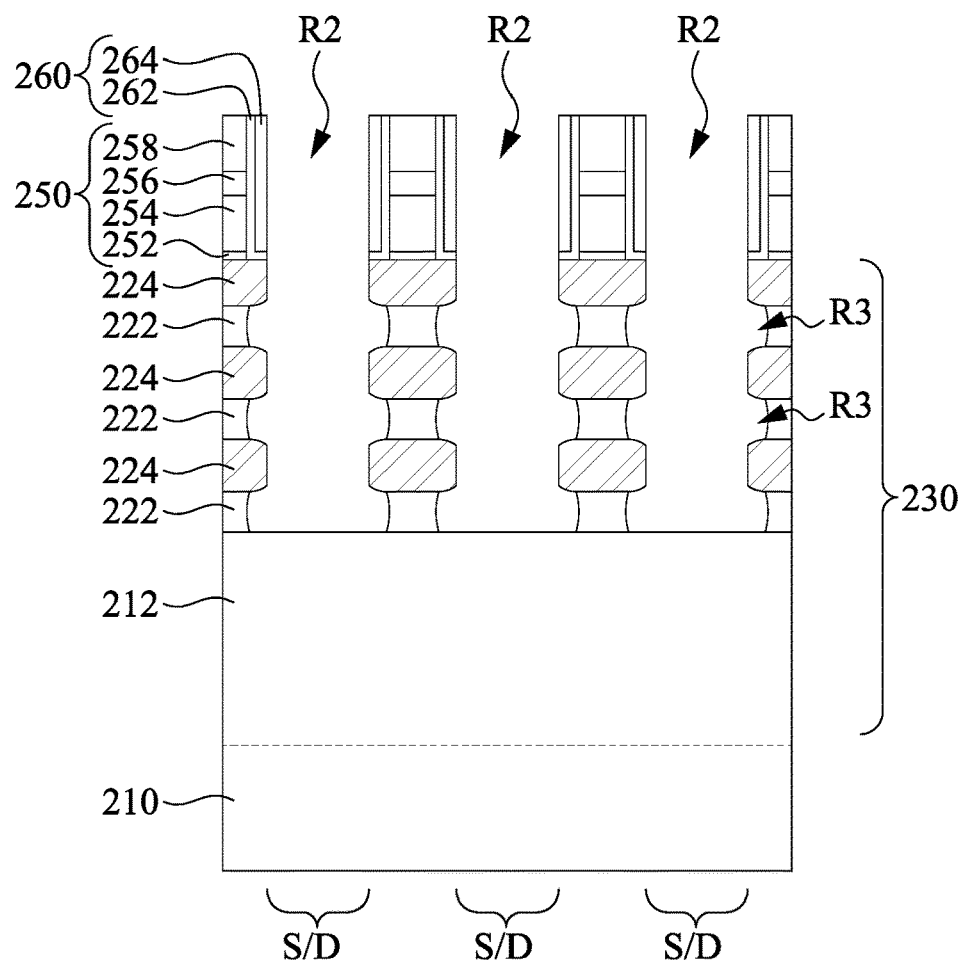

Next, in FIGS. 31A and 31B, the epitaxial layers 222 are laterally or horizontally recessed by using suitable etch techniques, resulting in lateral recesses R3 each vertically between corresponding channel layers 224. This operation may be performed by using a selective etching process. By way of example and not limitation, the epitaxial layers 222 are SiGe and the channel layers 224 are silicon allowing for the selective etching of the epitaxial layers 222. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 224 is not significantly etched by the process of laterally recessing the epitaxial layers 222. As a result, the channel layers 224 laterally extend past opposite end surfaces of the epitaxial layers 222.

Figure 32A:
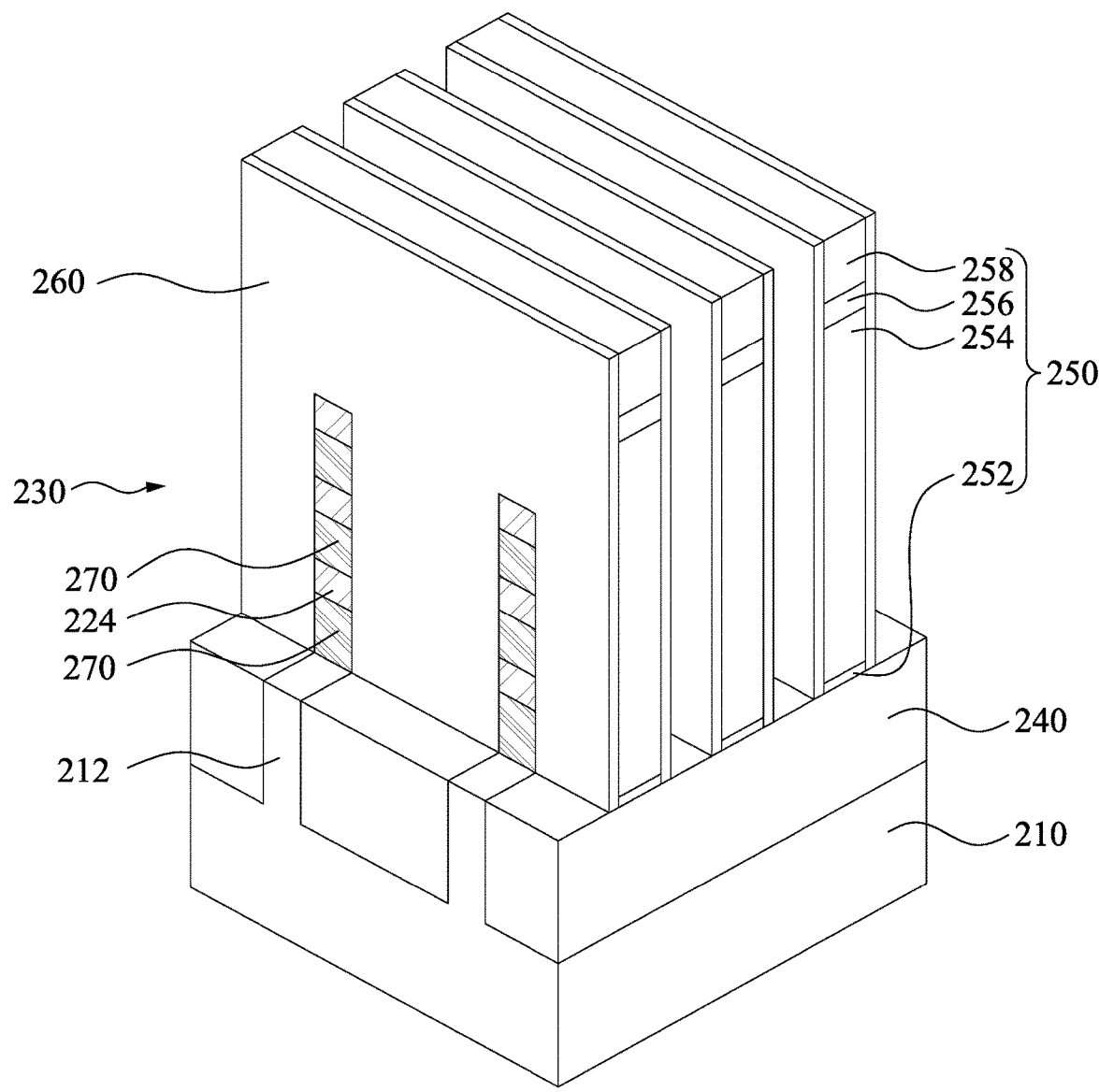
Figure 32B:
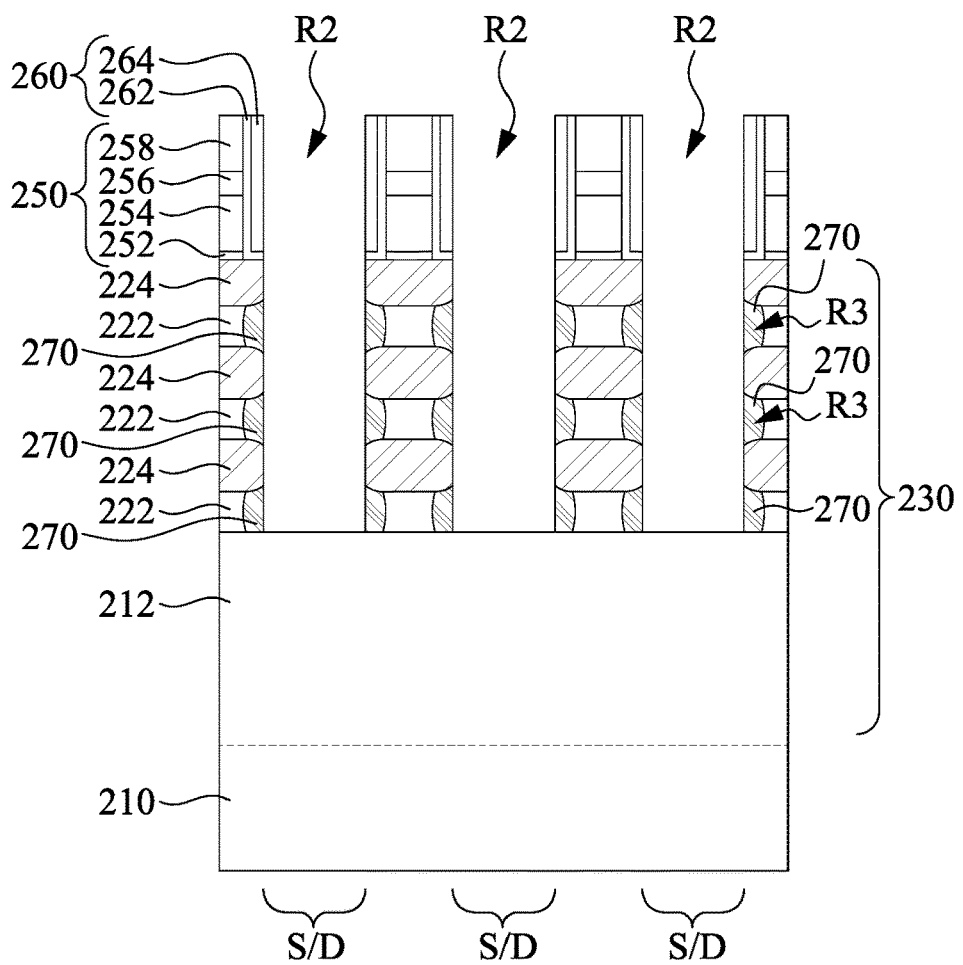

In FIGS. 32A and 32B, an inner spacer material layer 270 is formed to fill the recesses R3 left by the lateral etching of the epitaxial layers 222 discussed above with reference to FIGS. 32A and 32B. The inner spacer material layer 270 may be a low-k dielectric material, such as $SiO_2$, SiN, SiCN, or SiOCN, and may be formed by a suitable deposition method, such as ALD. After the deposition of the inner spacer material layer 270, an anisotropic etching process may be performed to trim the deposited inner spacer material 270, such that only portions of the deposited inner spacer material 270 that fill the recesses R3 left by the lateral etching of the epitaxial layers 222 are left. After the trimming process, the remaining portions of the deposited inner spacer material are denoted as inner spacers 270, for the sake of simplicity. The inner spacers 270 serve to isolate metal gates from source/drain regions formed in subsequent processing. In the example of FIGS. 32A and 32B, sidewalls of the inner spacers 270 are aligned with sidewalls of the channel layers 224.

Figure 33:
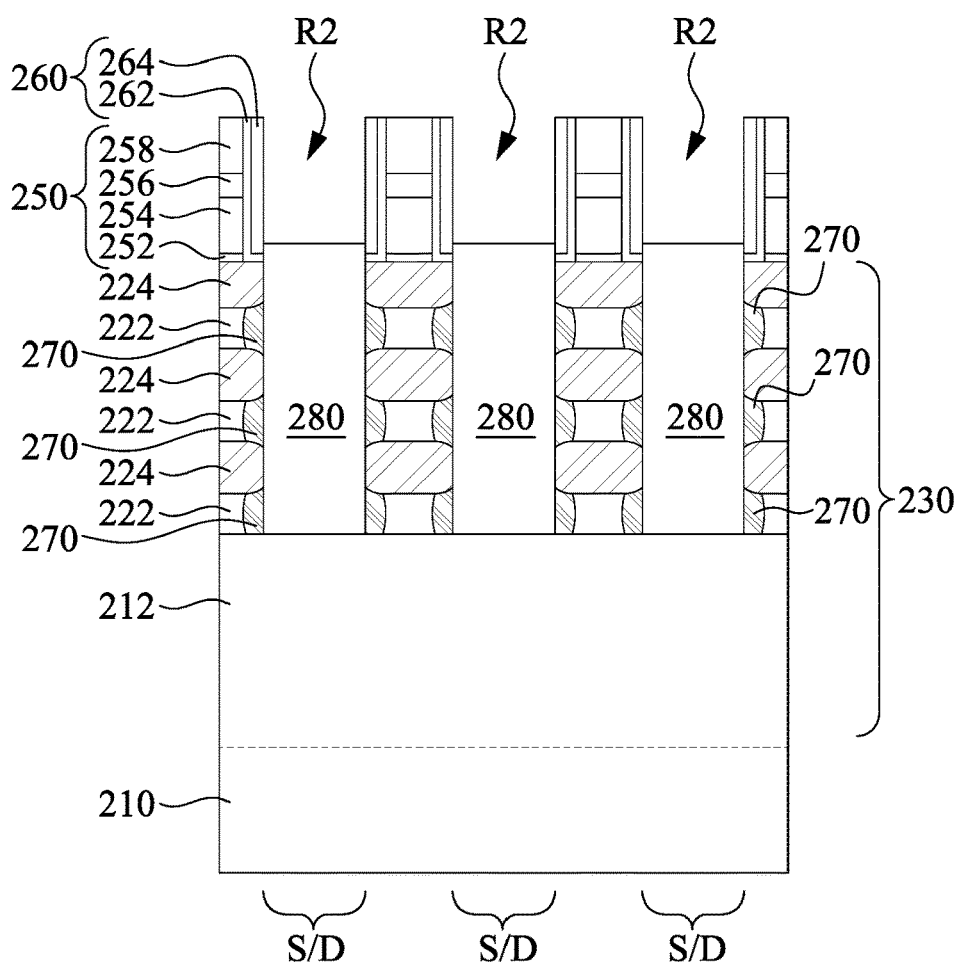

In FIG. 33, source/drain epitaxial structures 280 are formed over the source/drain regions S/D of the semiconductor fins 230. The source/drain epitaxial structures 280 may be formed by performing an epitaxial growth process that provides an epitaxial material on the fins 230. During the epitaxial growth process, the dummy gate structures 250, gate sidewall spacers 260 and the inner spacers 270 limit the source/drain epitaxial structures 280 to the source/drain regions S/D. Materials and process details about the source/drain epitaxy structures 280 of GAA FETs are similar to that of the source/drain epitaxial structures 122 of FinFETs discussed previously, and thus they are not repeated for the sake of brevity.

Figure 34:
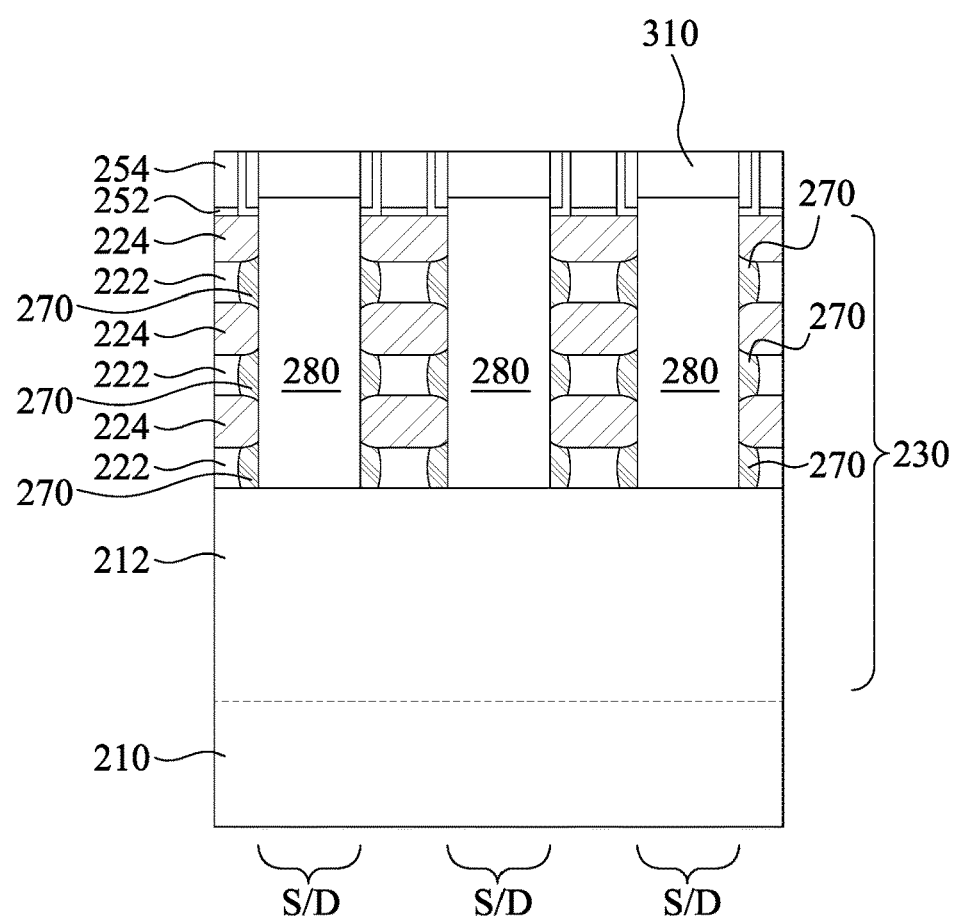
Figure 35:
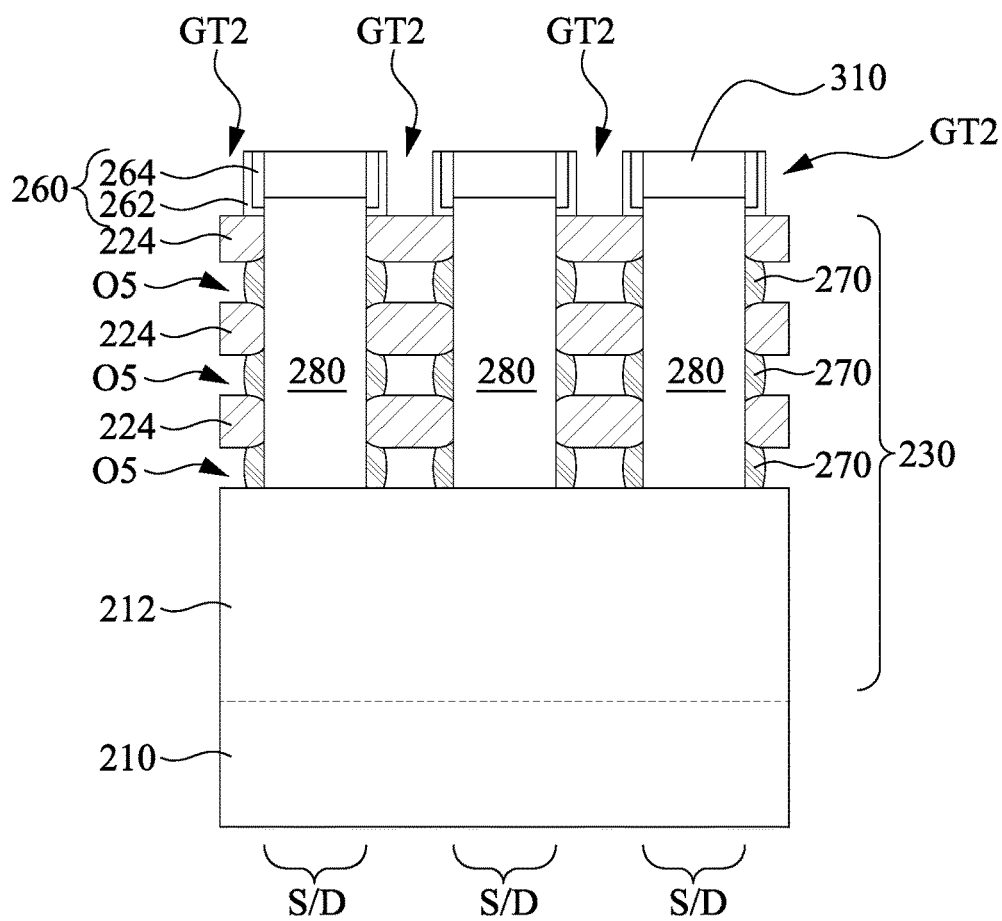

In FIG. 34, an interlayer dielectric (ILD) layer 310 is formed on the substrate 210. In some embodiments, a contact etch stop layer (CESL) is also formed prior to forming the ILD layer 310. Materials and process details about the CESL and the ILD layer 310 are similar to those of the CESL and the ILD layer 126, and thus they are not repeated for the sake of brevity. In some examples, after depositing the ILD layer 310, a planarization process may be performed to remove excessive materials of the ILD layer 310. For example, a planarization process includes a chemical mechanical planarization (CMP) process which removes portions of the ILD layer 310 (and CESL layer, if present) overlying the dummy gate structures 250 and planarizes a top surface of the integrated circuit structure 200. In some embodiments, the CMP process also removes hard mask layers 256, 258 (as shown in FIG. 33) and exposes the dummy gate electrode layer 254.

Thereafter, dummy gate structures 250 (as shown in FIG. 34) are removed first, and then the epitaxial layers (i.e., sacrificial layers) 222 (as shown in FIG. 34) are removed. The resulting structure is illustrated in FIG. 35. In some embodiments, the dummy gate structures 250 are removed by using a selective etching process (e.g., selective dry etching, selective wet etching, or a combination thereof) that etches the materials in dummy gate structures 250 at a faster etch rate than it etches other materials (e.g., gate spacers 260 and/or ILD layer 310), thus resulting in gate trenches GT2 between corresponding gate sidewall spacers 260, with the epitaxial layers 222 exposed in the gate trenches GT2. Subsequently, the epitaxial layers 222 in the gate trenches GT2 are removed by using another selective etching process that etches the epitaxial layers 222 at a faster etch rate than it etches the channel layers 224, thus forming openings O5 between neighboring epitaxial layers (i.e., channel layers) 224. In this way, the epitaxial layers 224 become nanosheets suspended over the substrate 210 and between the source/drain epitaxial structures 280. This operation is also called a channel release process. At this interim processing operation, the openings O5 between the epitaxial layers (i.e., nanosheets) 224 may be filled with ambient environment conditions (e.g., air, nitrogen, etc). In some embodiments, the epitaxial layers 224 can be interchangeably referred to as nanowires, nanoslabs and nanorings, depending on their geometry. For example, in some other embodiments the epitaxial layers 224 may be trimmed to have a substantial rounded shape (i.e., cylindrical) due to the selective etching process for completely removing the epitaxial layers 222. In that case, the resultant epitaxial layers 224 can be called nanowires.

In some embodiments, the epitaxial layers 222 are removed by using a selective wet etching process. In some embodiments, the epitaxial layers 222 are SiGe and the epitaxial layers 224 are silicon allowing for the selective removal of the epitaxial layers 222. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 224 may not be significantly etched by the channel release process. It can be noted that both the channel release operation and the previous operation of laterally recessing sacrificial layers (the operation as shown in FIGS. 31A and 31B) use a selective etching process that etches SiGe at a faster etch rate than etching Si, and therefore these two operations may use the same etchant chemistry in some embodiments. In this case, the etching time/duration of channel release operation is longer than the etching time/duration of the previous operation of laterally recessing sacrificial layers, so as to completely remove the sacrificial SiGe layers.

Figure 36A:
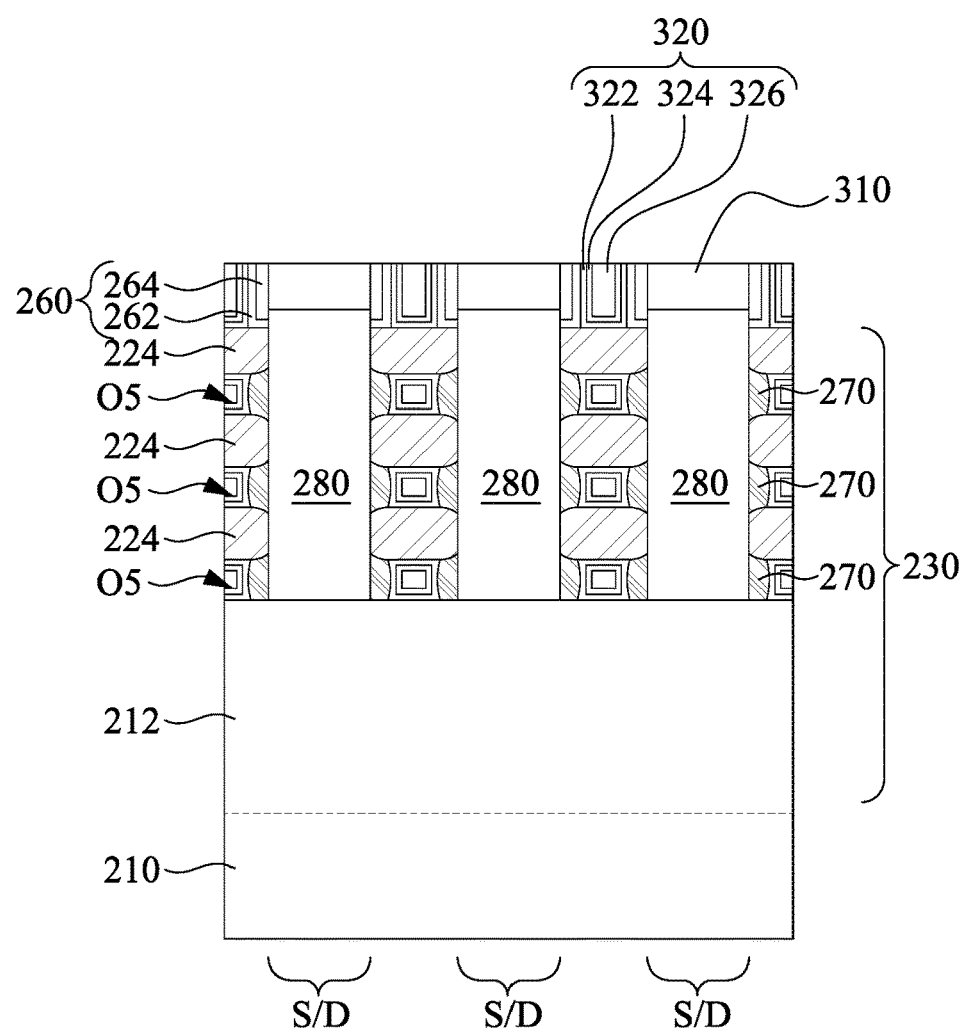
Figure 36B:
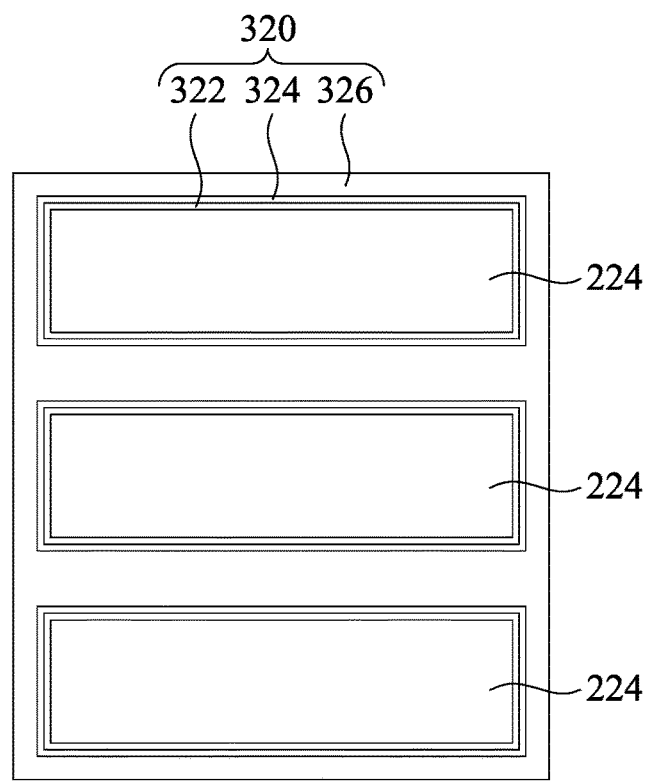

In FIGS. 36A and 36B, replacement gate structures 320 are respectively formed in the gate trenches GT2 to surround each of the epitaxial layers 224 suspended in the gate trenches GT2. The gate structure 320 may be the final gate of a GAA FET. The final gate structure may be a high-k/metal gate stack, however other compositions are possible. In some embodiments, each of the gate structures 320 forms the gate associated with the multi-channels provided by the plurality of epitaxial layers 224. For example, high-k/metal gate structures 320 are formed within the openings O5 (as illustrated in FIG. 36A) provided by the release of epitaxial layers 224. In various embodiments, the high-k/metal gate structure 320 includes a gate dielectric layer 322 formed around the epitaxial layers 224, a work function metal layer 324 formed around the gate dielectric layer 322, and a fill metal 326 formed around the work function metal layer 324 and filling a remainder of gate trenches GT2. The gate dielectric layer 322 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 324 and/or fill metal 326 used within high-k/metal gate structures 320 may include a metal, metal alloy, or metal silicide. Formation of the high-k/metal gate structures 320 may include depositions to form various gate materials, one or more liner layers, and one or more CMP processes to remove excessive gate materials. As illustrated in a cross-sectional view of FIG. 36B that is taken along a longitudinal axis of a high-k/metal gate structure 320, the high-k/metal gate structure 320 surrounds each of the epitaxial layers 224, and thus is referred to as a gate of a GAA FET. Materials and process details about the gate structures 320 of GAA FETs are similar to the gate structures 130 of FinFETs, and thus they are not repeated for the sake of brevity.

Figure 37:
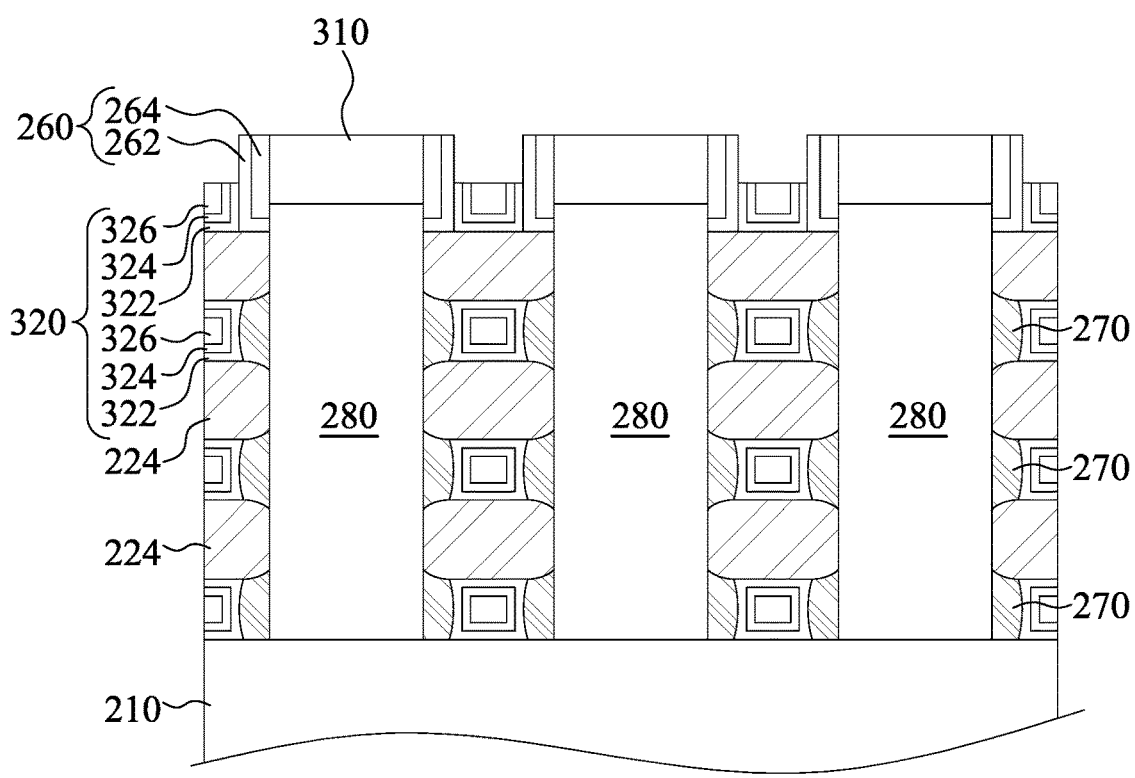

In FIG. 37, an etching back process is performed to etch back the replacement gate structures 320, resulting in recesses over the etched-back gate structures 320. In some embodiments, because the materials of the replacement gate structures 320 have a different etch selectivity than the gate spacers 260, the top surfaces of the replacement gate structures 320 may be at a lower level than the top surfaces of the gate spacers 260.

Figure 38:
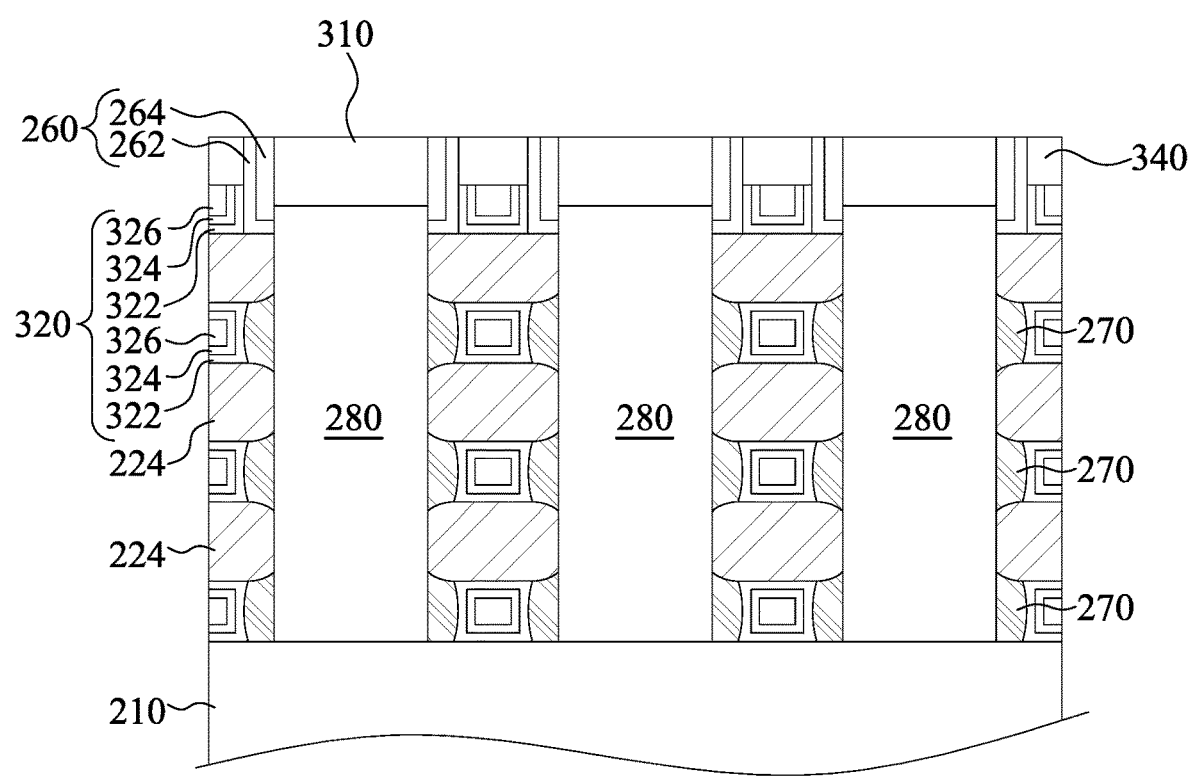

In FIG. 38, dielectric caps 340 are formed over the metal caps 330. Materials and process details about the dielectric caps 340 are similar to that of the dielectric caps 142 discussed previously, and thus they are not repeated for the sake of brevity.

Figure 39:
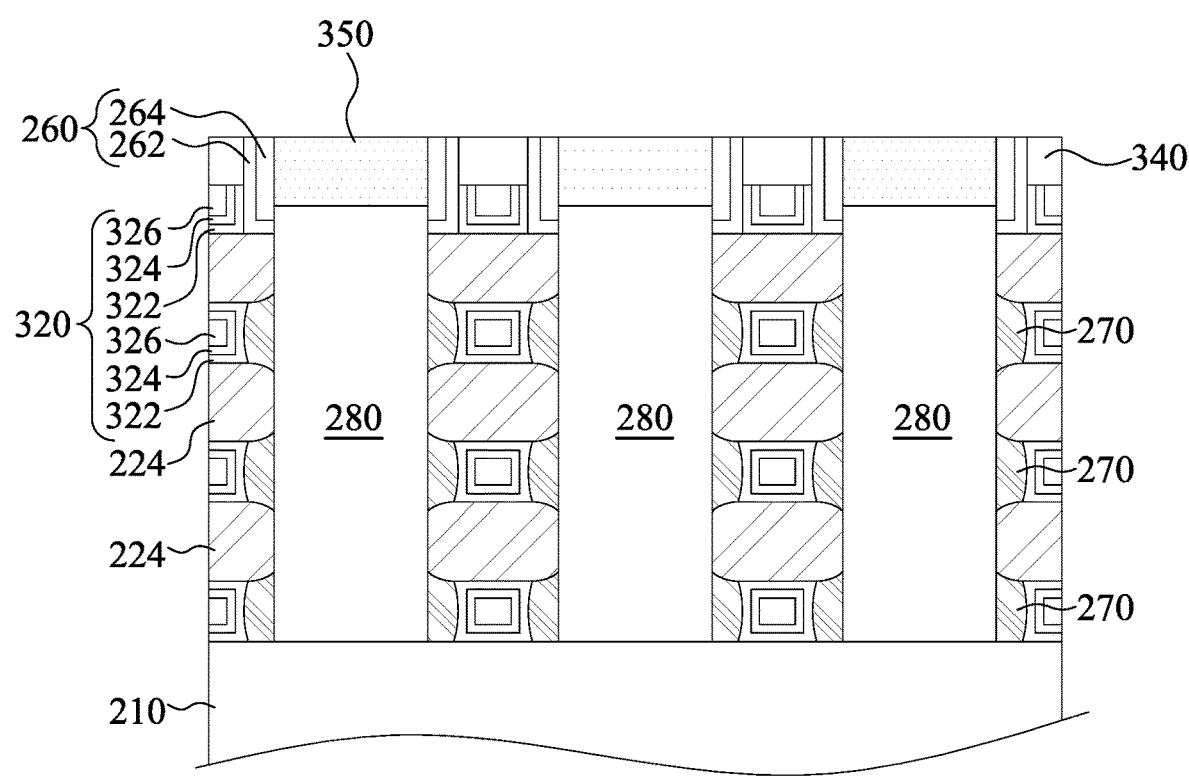

In FIG. 39, source/drain contacts 350 are formed extending through the ILD layer 310 (and the CESL layer, if present). Formation of the source/drain contacts 350 includes, by way of example and not limitation, performing one or more etching processes to form contact openings extending though the ILD layer 310 to expose the source/drain epitaxy structures 280, depositing one or more metal materials overfilling the contact openings, and then performing a CMP process to remove excessive metal materials outside the contact openings. In some embodiments, the one or more etching processes are selective etching that etches the ILD layer 310 at a faster etch rate than etching the dielectric caps 340 and the gate spacers 260. As a result, the selective etching is performed using the dielectric caps 340 and the gate spacers 260 as an etch mask, such that the contact openings and hence source/drain contacts 350 are formed self-aligned to the source/drain epitaxy structures 280 without using an additional photolithography process. In that case, dielectric caps 340 allowing for forming the self-aligned contacts 350 can be called SAC caps 340.

Figure 40:
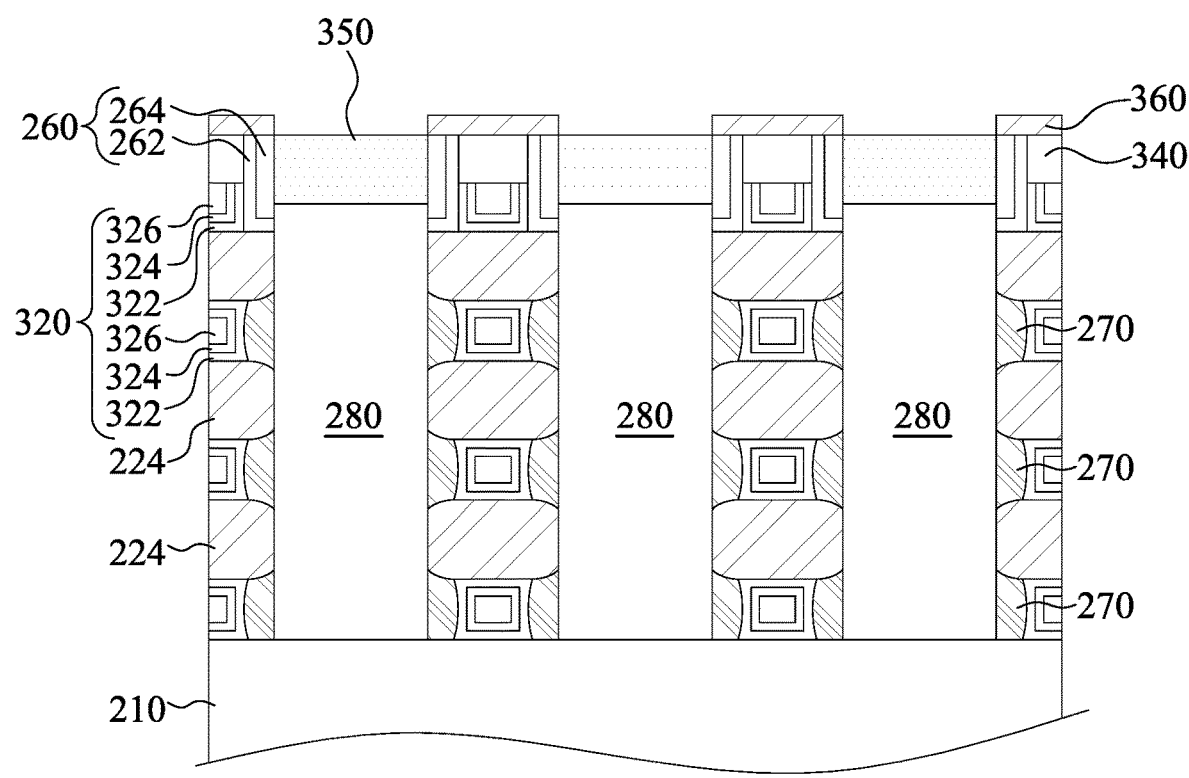

Once the self-aligned source/drain contacts 350 have been formed, in FIG. 40, etch stop layers (ESLs) 360 are selectively formed over the dielectric materials (e.g., the SAC caps 340 and the gate spacers 260). Materials and process details about the ESLs 360 are similar to that of the ESLs 146 discussed previously, and thus they are not repeated for the sake of brevity.

Figure 41:
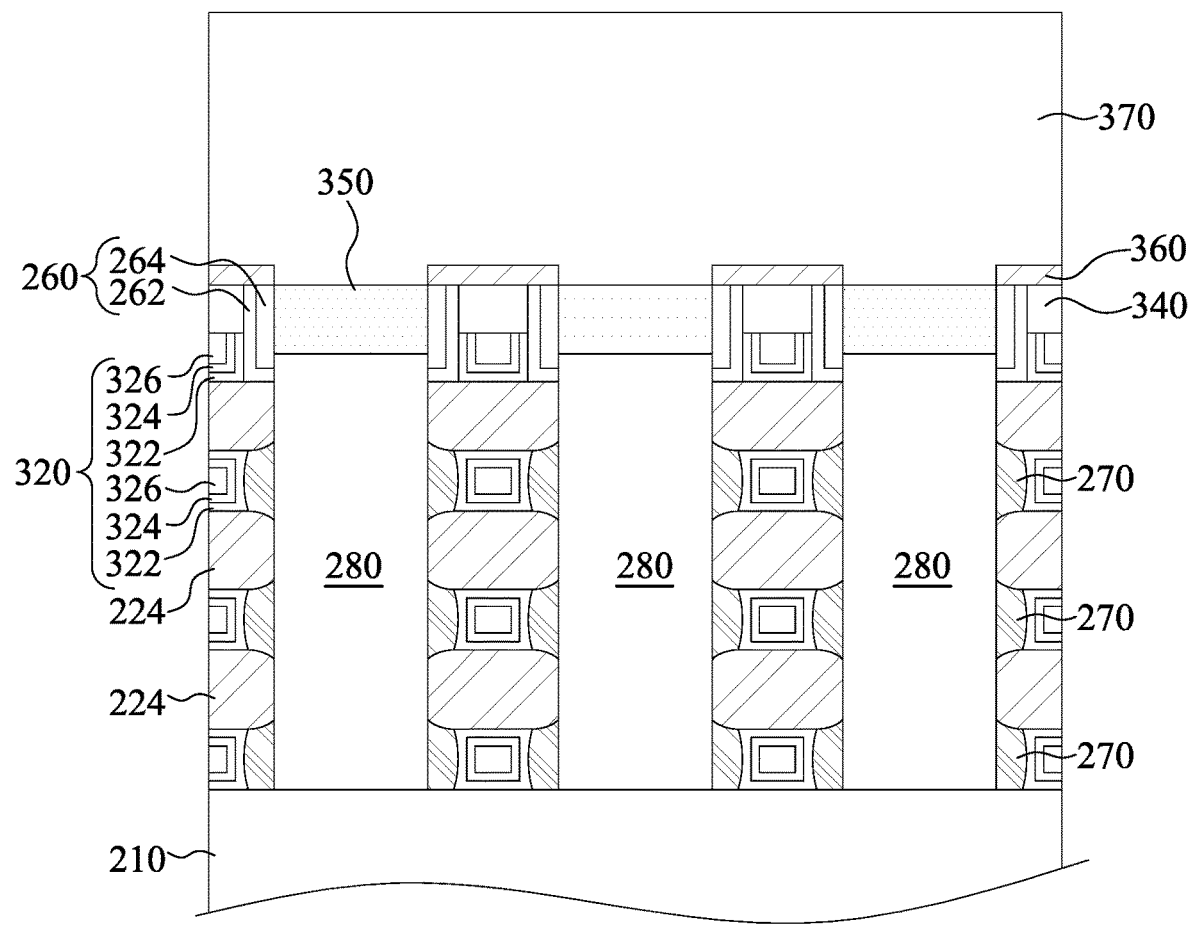

Subsequently, another ILD layer 370 is deposited over the ESLs 360 as shown in FIG. 41. In some embodiments, the ILD layer 370 is silicon oxide ($SiO_x$). Materials and process details about the ESLs 360 are similar to that of the ILD layer 148 discussed previously, and thus they are not repeated for the sake of brevity.

Figure 42A:
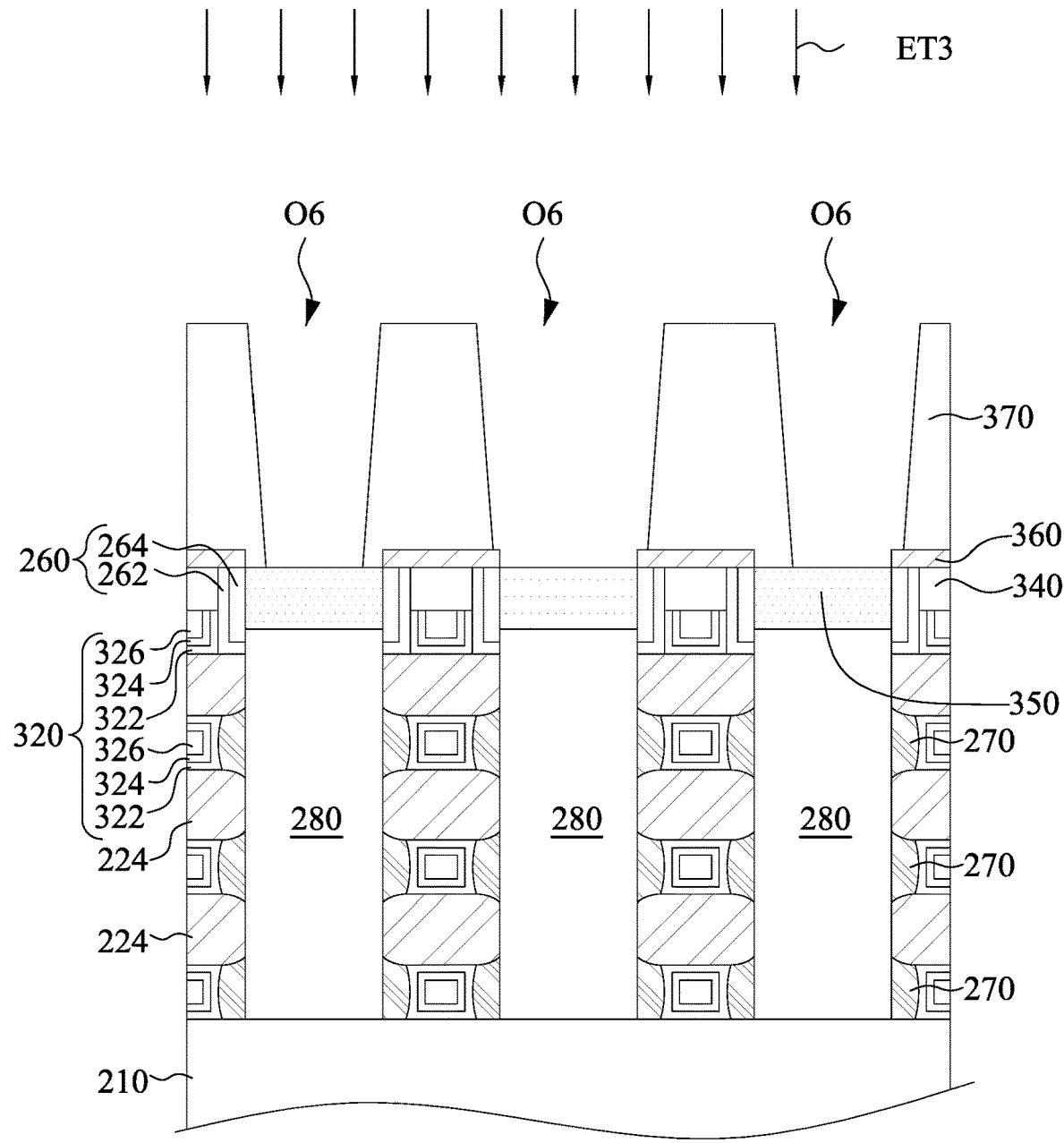

Referring to FIG. 42A, the ILD layer 370 is patterned to form via openings O6 extending through the ILD layer 370 by using an etching process (also called via etching process) ET3. The etching duration time of the via etching process ET3 is controlled to break through the ILD layer 370. As a result of the etching process ET3, the source/drain contacts 350 get exposed at bottoms of the via openings O6. Process details about the via etching process ET3 are discussed previously with respect to the via etching process ET1, and thus they are not repeated herein for the sake of brevity.

Figure 42B:
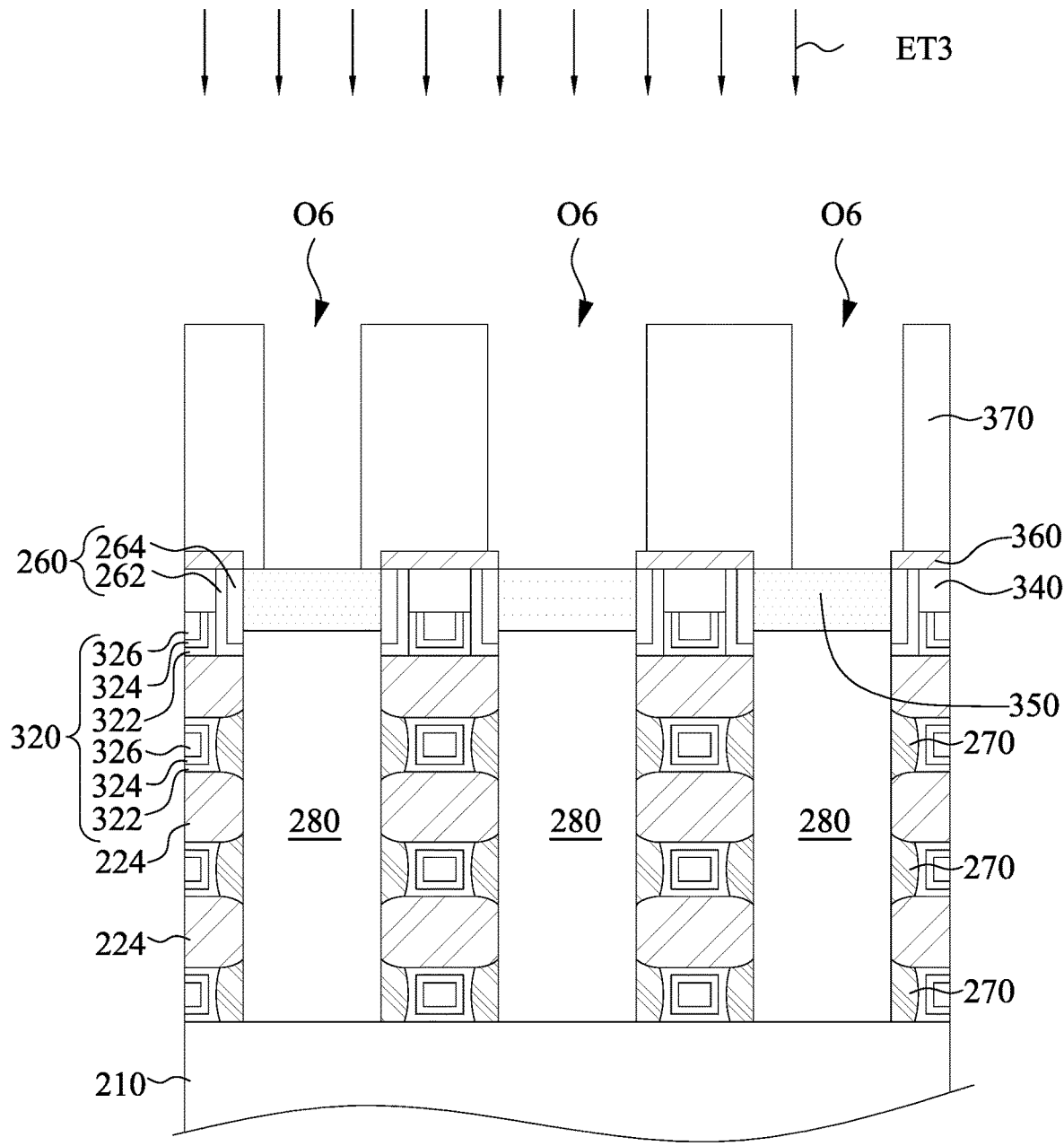

In some embodiments as depicted in FIG. 42A, the via openings O6 have tapered sidewall profile due to the nature of anisotropic etching of the etching process ET3. However, in some other embodiments, the etching conditions of the etching process ET3 may be fined-tune to allow the via openings O6 having vertical sidewall profile, as illustrated in FIG. 42B.

Figure 43A:
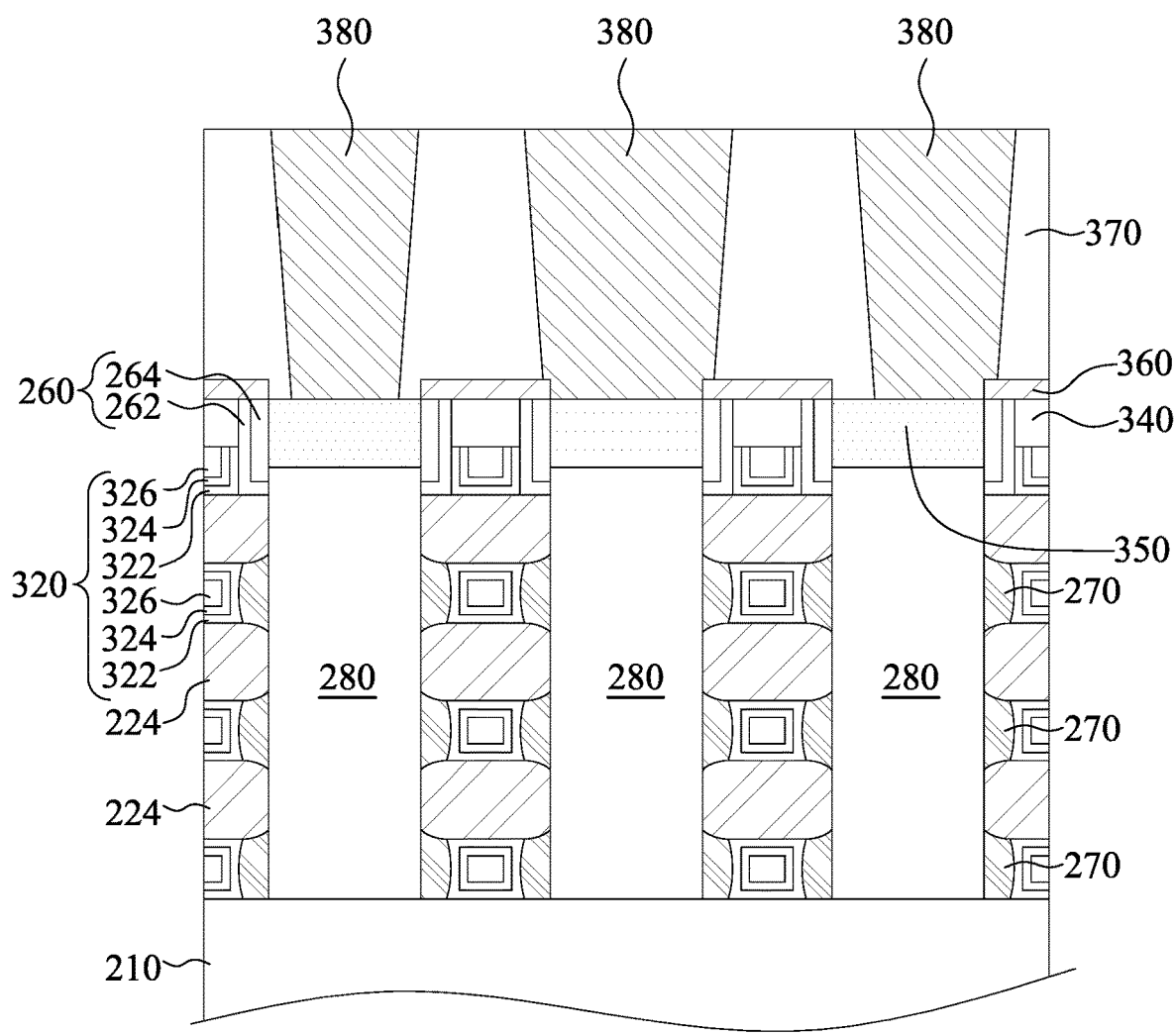
Figure 43B:
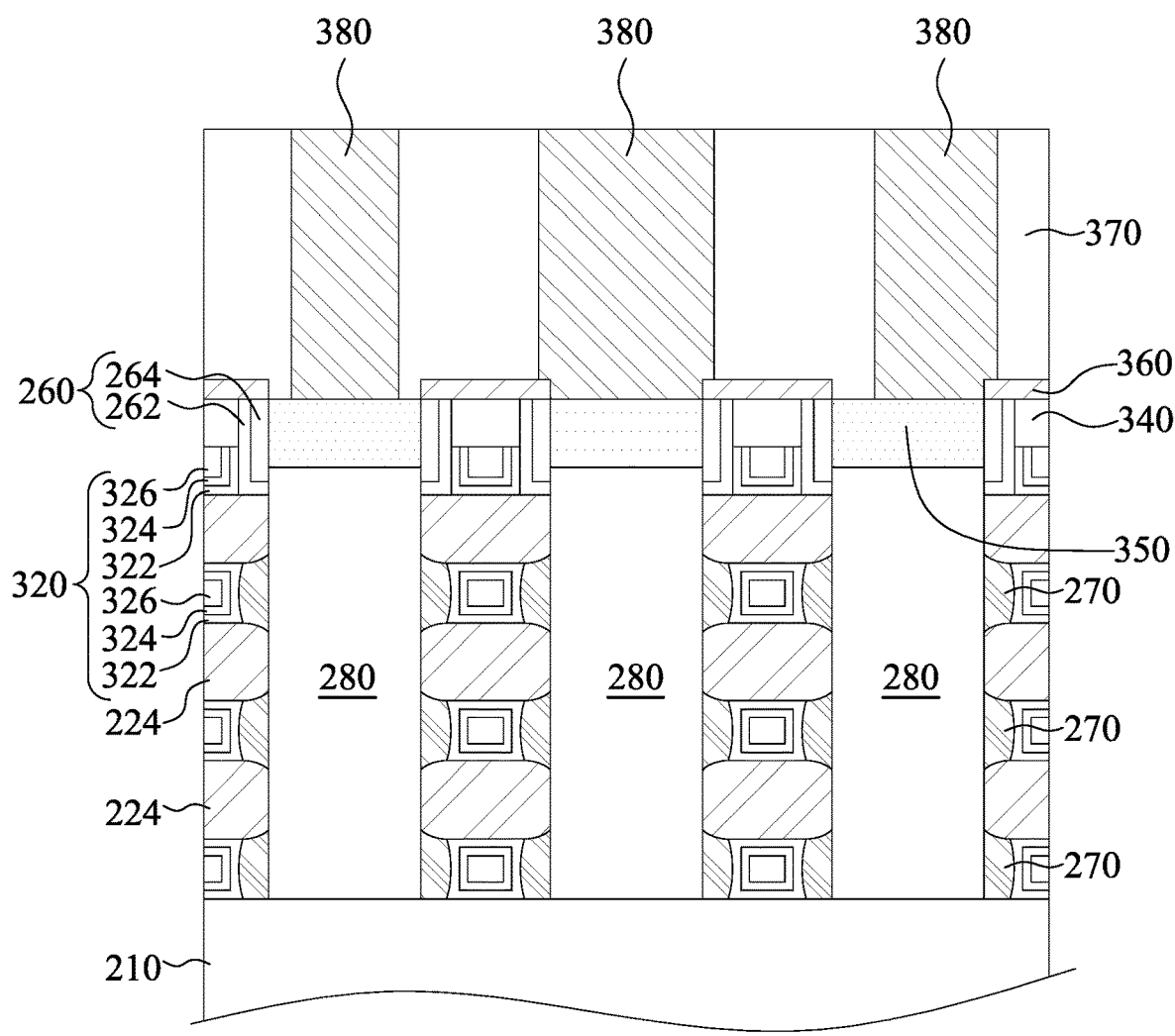

Referring to FIG. 43A, source/drain vias 380 are then formed in the via openings O6 to make physical and electrical connection to the source/drain contacts 350. Materials and process details about the source/drain vias 380 are similar to that of the source/drain vias 150 discussed previously, and thus they are not repeated for the sake of brevity. In some embodiments as depicted in FIG. 43A, the source/drain vias 380 have tapered sidewall profile due to the nature of anisotropic etching of the etching process ET3. However, in some other embodiments, the etching conditions of the etching process ET3 may be fined-tune to allow the via openings O6 and hence the source/drain vias 380 having vertical sidewall profile, as illustrated in FIG. 43B.

Figure 44A:
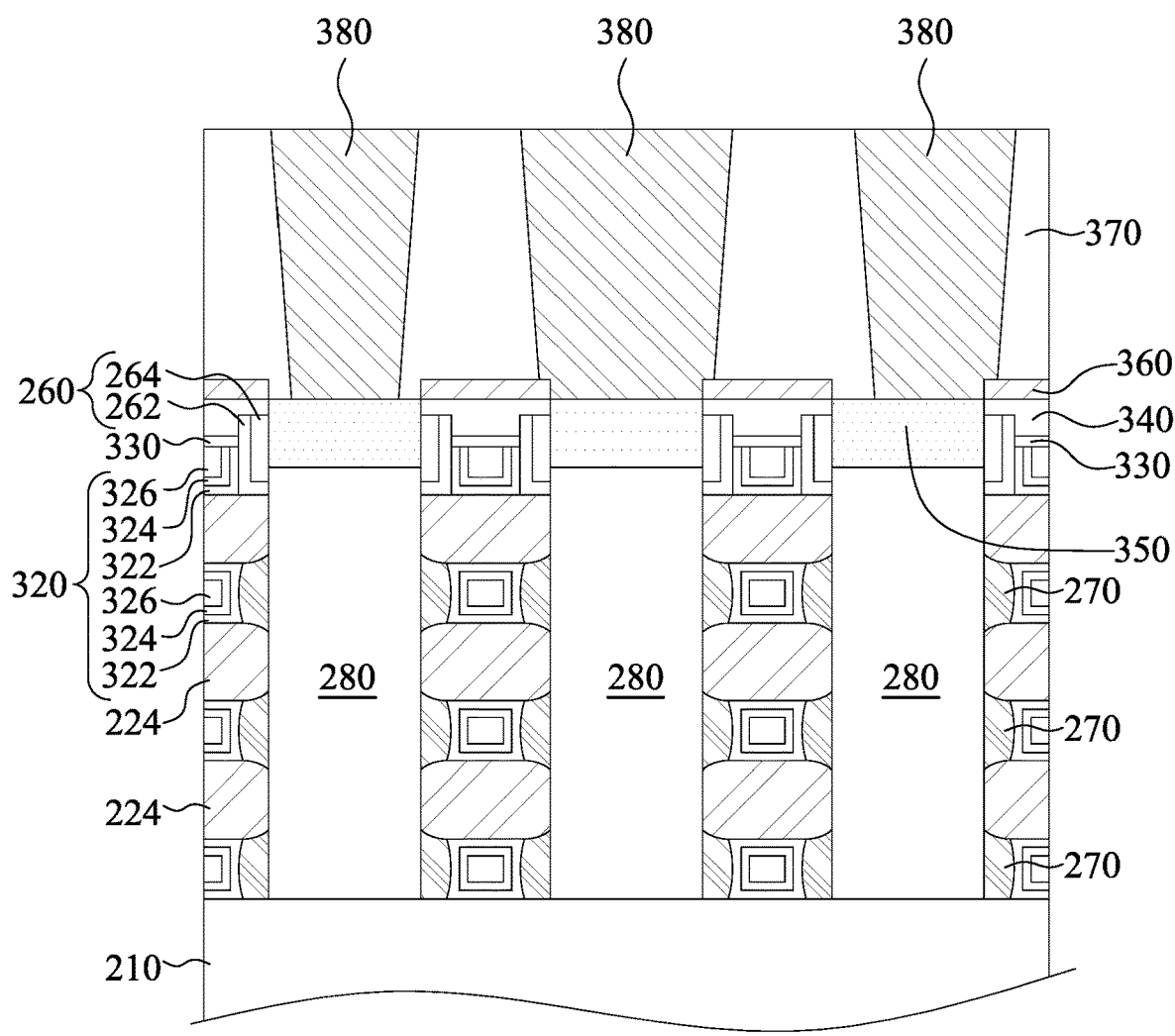
FIGS. 44A and 44B are cross-sectional view of integrated circuit structures according to some embodiments.
Figure 44B:
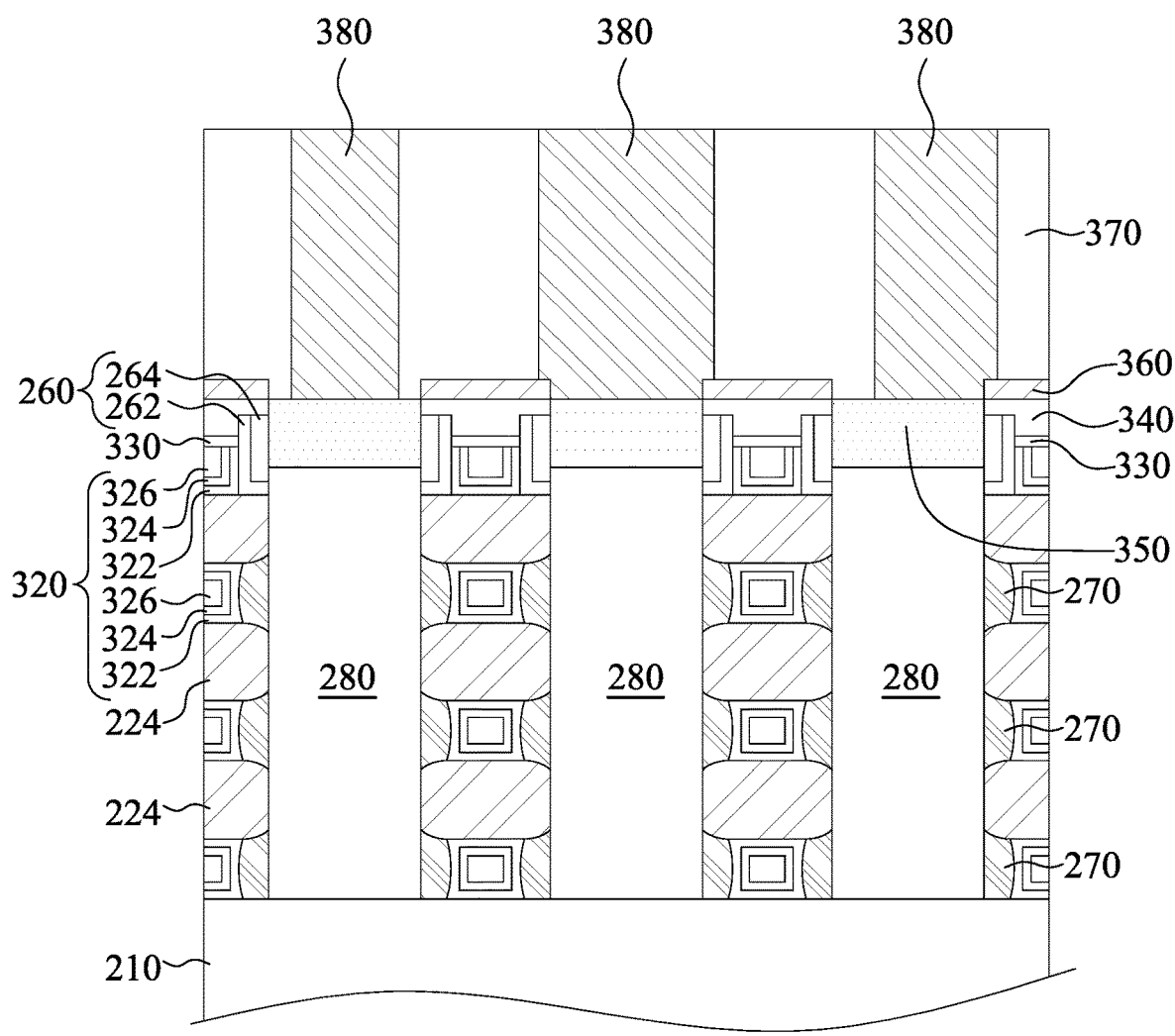

FIGS. 44A and 44B are cross-sectional view of integrated circuit structures 200 according to some embodiments. In FIGS. 44A and 44B, the gate spacers 260 are also etched back during the process shown in FIG. 37. Process details about the etching of the gate spacers 260 are discussed previously with respect to the etching of the gate spacers 116, and thus they are not repeated herein for the sake of brevity. Further, metal caps 330 are formed respectively atop the replacement gate structures 320 by suitable process, such as CVD or ALD. The metal caps 330 may be, by way of example and not limitation, substantially fluorine-free tungsten (FFW) films having an amount of fluorine contaminants less than 5 atomic percent and an amount of chlorine contaminants greater than 3 atomic percent. Process Detail about FFW formation is discussed previously with respect to the metal caps 138, and thus they are not repeated for the sake of brevity.

FIGS. 45-48 illustrate exemplary cross sectional views of various stages for manufacturing an integrated circuit structure 200a according to some other embodiments of the present disclosure. It is understood that additional operations can be provided before, during, and after processes shown by FIGS. 45-48, and some of the operations described below can be replaced or eliminated, for additional embodiments of the method. The order of the operations/processes may be interchangeable. The same or similar configurations, materials, processes and/or operation as described with FIGS. 26-43B may be employed in the following embodiments, and the detailed explanation may be omitted.

Figure 45:
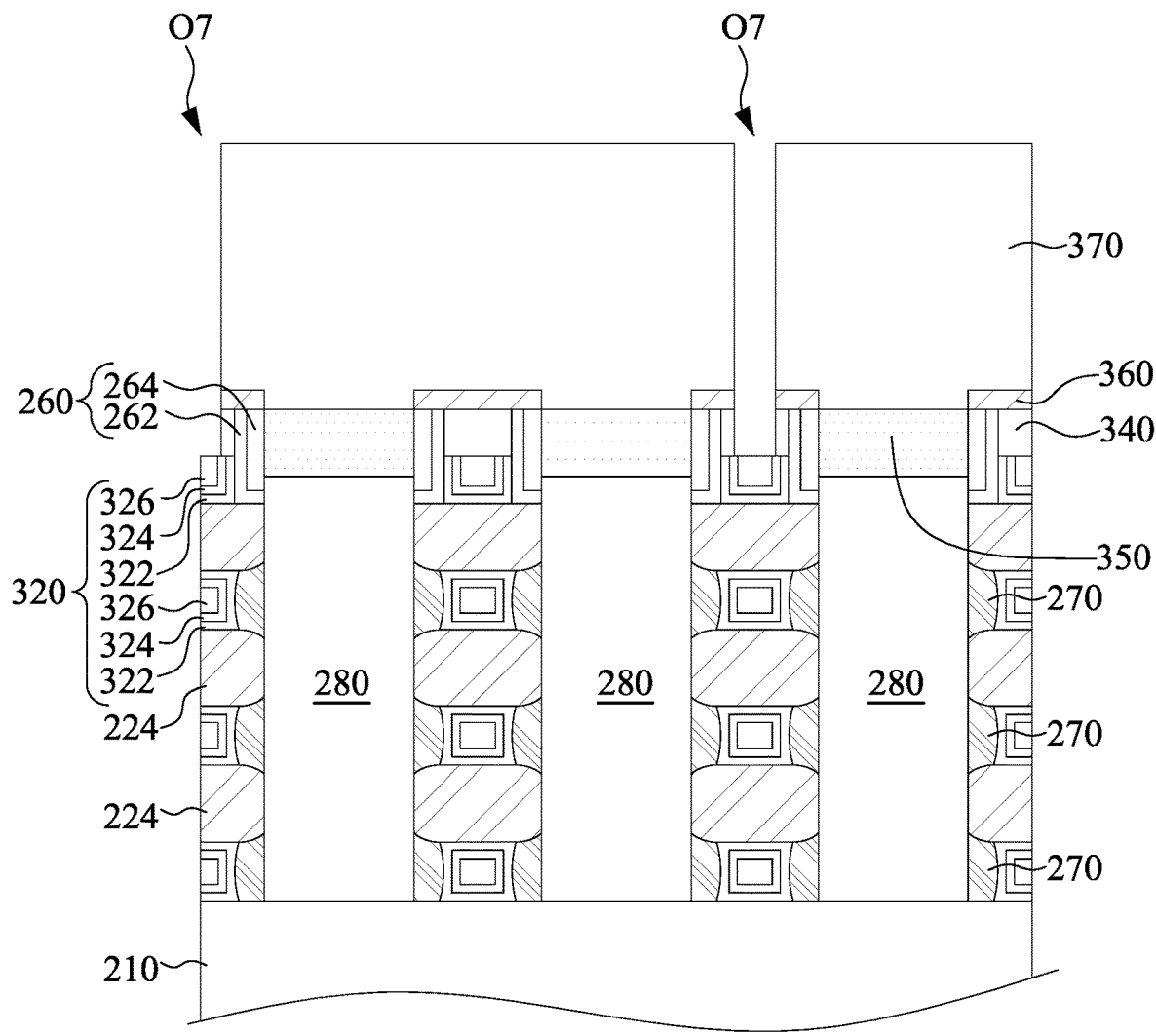
FIGS. 45-48 illustrate exemplary cross sectional views of various stages for manufacturing an integrated circuit structure according to some other embodiments of the present disclosure.

After the structure as shown in FIG. 41 is formed, the ILD layer 370 is patterned to form gate contact openings O7 extending downward though the ILD layer 370, the ESL 360 and the dielectric cap 340 to the replacement gate structures 320. The resulting structure is illustrated in FIG. 45. The ILD layer 148 can be patterned by using suitable photolithography and etching techniques.

Figure 46:
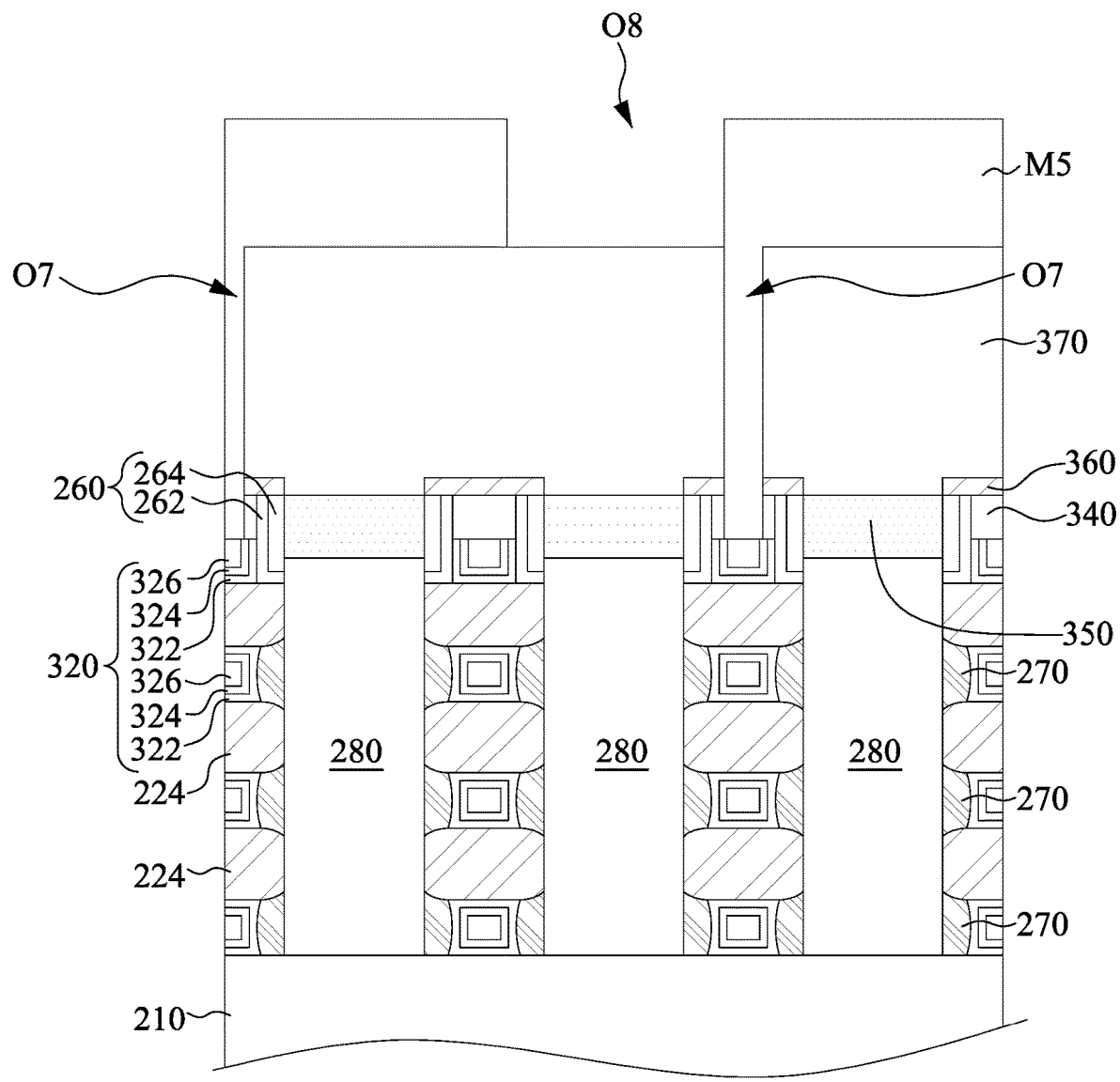

Next, as illustrated in FIG. 46, a patterned mask layer M5 is formed over the substrate 12 to fill the gate contact openings O7. The patterned mask layer M5 has an opening O8 vertically above a source/drain contact 350.

Figure 47:
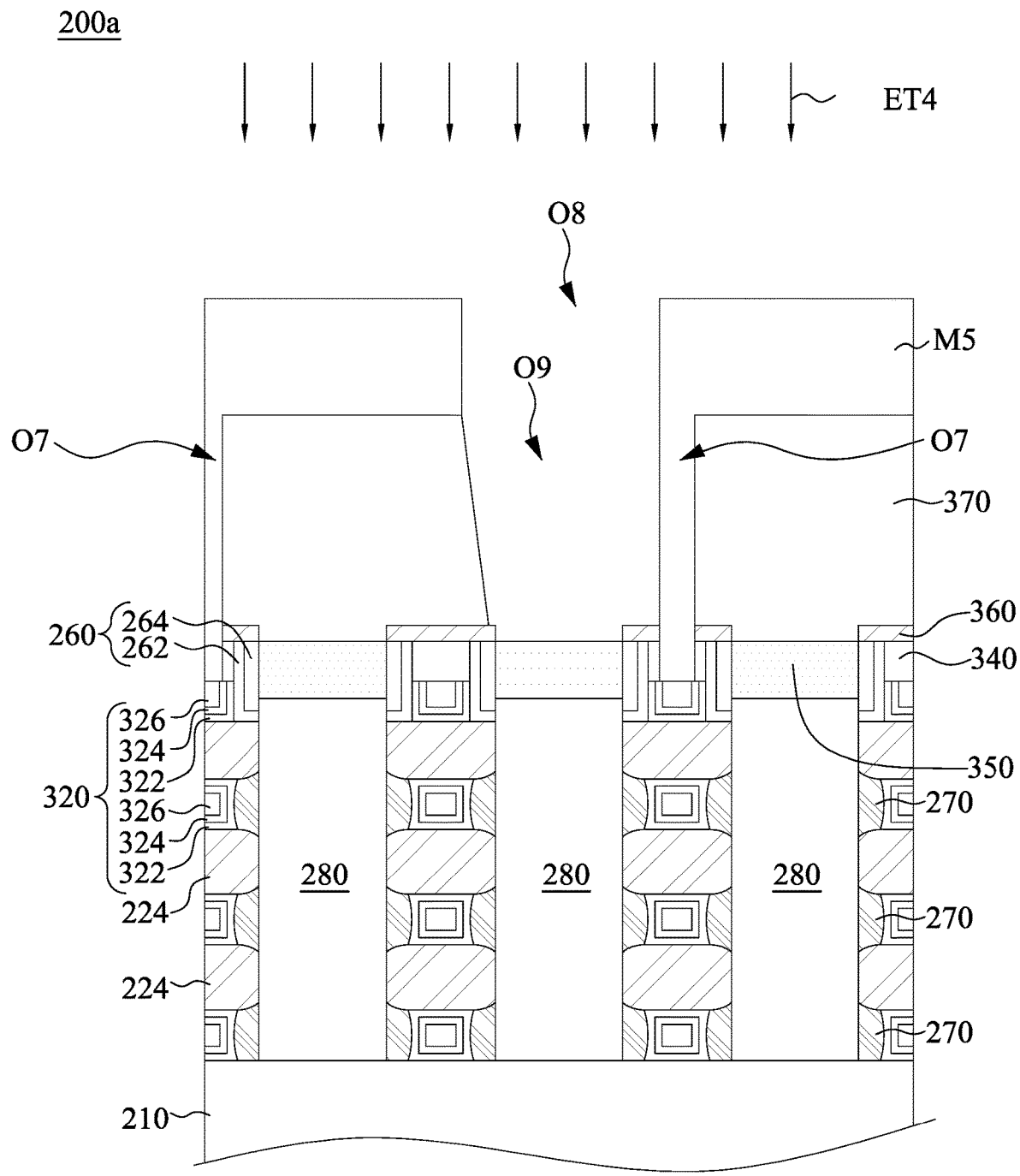

Referring to FIG. 47, with the patterned mask layer M5 in place, a via etching process ET4 is performed to form a via opening O9 extending through the ILD layer 370. The etching duration time of the via etching process ET4 is controlled to break through the ILD layer 370. As a result of the etching process ET4, the source/drain contacts 350 get exposed at bottoms of the via openings O9. Process details about the via etching process ET4 are discussed previously with respect to the via etching process ET1, and thus they are not repeated herein for the sake of brevity.

Figure 48:
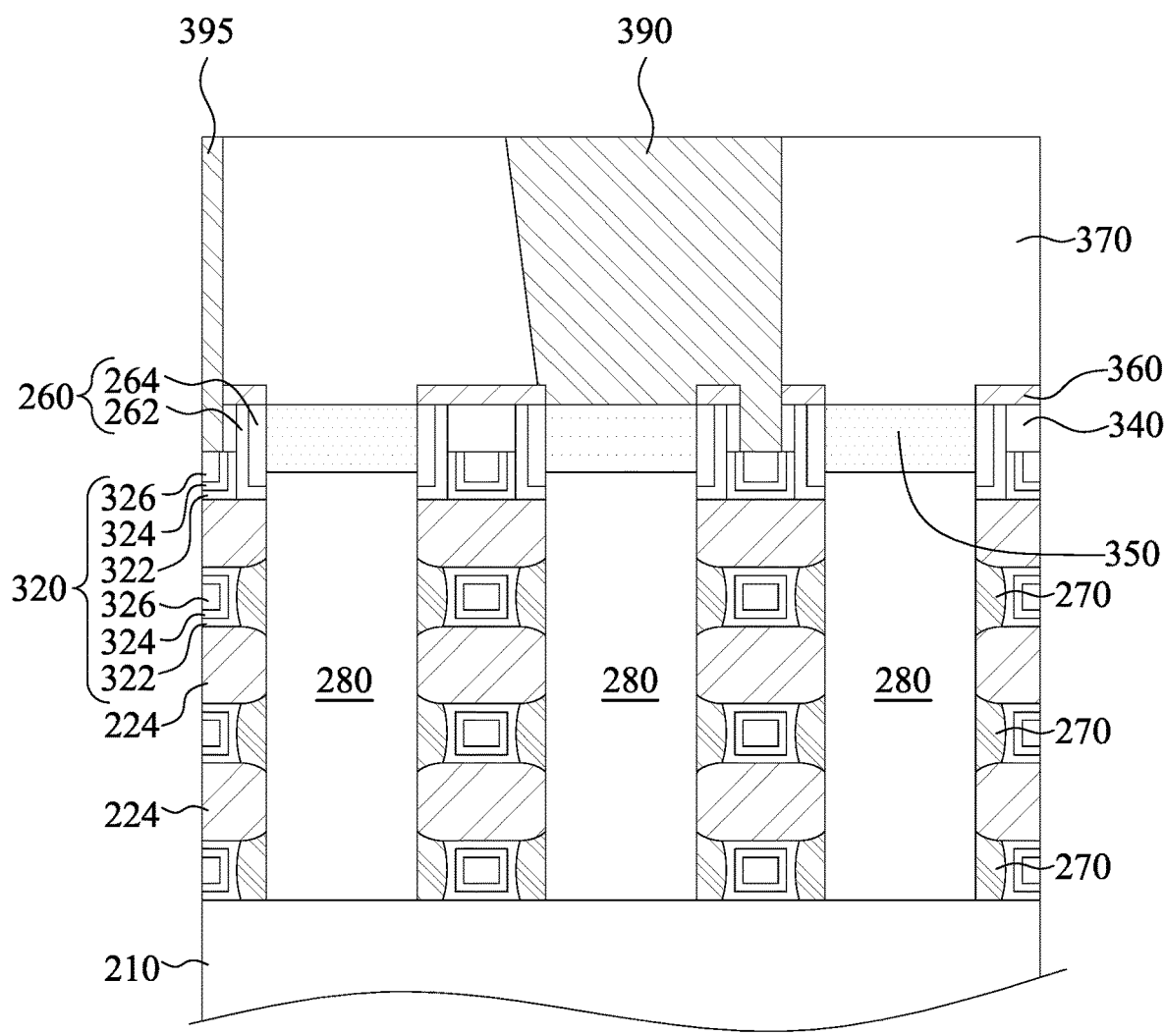

Referring to FIG. 48, the patterned mask layer M5 (referring to FIG. 47) is removed from the gate contact openings O7 by ashing and/or wet stripping, and then a butted contact 390 is formed to fill the via opening O9 and the gate contact opening O7 and a gate contact 395 is formed to fill another gate contact opening O7. The resulting structure is illustrated in FIG. 48. Materials and fabrication process details about the butted contact 390 and the gate contact 395 are similar to that about the source/drain vias 150, and thus they are not repeated herein for the sake of brevity.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the risk of leakage current (e.g., leakage current from source/drain via to gate contact and/or gate structure) can be reduced due to the etch stop layer. Another advantage is that a patterning process can be omitted for the formation of the etch stop layer. Yet another advantage is that the resistance capacitance (RC) delay can be improved due to a large distance from the source/drain via to a gate contact.

According to some embodiments, a method includes forming a gate structure over a substrate. A dielectric cap is formed over the gate structure. A source/drain contact is formed over a source/drain region next to the gate structure and over the substrate. An etch stop layer is selectively formed over the dielectric cap without overlapping the source/drain contact. An interlayer dielectric is deposited over the etch stop layer and the source/drain contact. A source/drain via is formed to extend through the ILD and to the source/drain contact.

According to some embodiments, a device includes a source/drain contact, an etch stop layer, an interlayer dielectric (ILD) layer, and a source/drain via. The source/drain contact is over a source/drain region of a transistor. The etch stop layer is over a gate structure of the transistor. The etch stop layer has a step distance above the source/drain contact and a sidewall substantially aligned with a sidewall of the source/drain contact. The ILD layer is above the etch stop layer. The source/drain via extends through the ILD layer and the etch stop layer to the source/drain contact.

According to some embodiments, a device includes first and second source/drain contacts, an etch stop layer, an interlayer dielectric (ILD) layer, and a via structure. The first and second source/drain contacts are respectively over first and second source/drain regions of a transistor. The etch stop layer is over a gate structure of the transistor. The ILD layer is over the etch stop layer and has a stepped bottom surface having a lower step in contact with a top surface of the first source/drain region and an upper step in contact with a top surface of the etch stop layer. The via structure extends through the ILD layer and the etch stop layer to the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate structure over a substrate;
    forming a dielectric cap over the gate structure;
    forming a source/drain contact over the substrate;
    depositing an etch stop layer over the dielectric cap;
    depositing an interlayer dielectric (ILD) layer over the etch stop layer, wherein the ILD layer is in contact with a bottom of sidewall of the etch stop layer, wherein a bottom surface of the ILD layer forms an interface with the source/drain contact at a position lower than a top surface of the etch stop layer; and
    forming a gate via in the ILD layer and passing through the etch stop layer and the dielectric cap to the gate structure.

2. The method of claim 1, wherein a thickness of the etch stop layer is in a range of about 3 nm to about 10 nm.

3. The method of claim 1, wherein the gate via is laterally surrounded by the etch stop layer.

4. The method of claim 1, wherein the etch stop layer is a metal oxide layer.

5. The method of claim 1, wherein the etch stop layer is not directly over the source/drain contact prior to depositing the ILD layer over the etch stop layer.

6. The method of claim 1, further comprising forming a source/drain via in the ILD layer and in contact with the sidewall of the etch stop layer.

7. The method of claim 1, wherein the etch stop layer includes a nitride material.

8. A method comprising:
    forming a gate structure over a substrate;
    forming a dielectric cap over the gate structure;
    forming a source/drain contact over the substrate;
    depositing an etch stop layer over the dielectric cap;
    depositing an interlayer dielectric (ILD) layer over the etch stop layer, wherein a width of the etch stop layer is substantially the same as a width of the dielectric cap prior to depositing the ILD layer;
    forming a source/drain via in the ILD layer to be electrically connected to the source/drain contact; and
    forming a self-assemble monolayer (SAM) over the source/drain contact prior to forming the etch stop layer, wherein a sidewall of the etch stop layer is in contact with a sidewall of the SAM after forming the etch stop layer.

9. The method of claim 8, further comprising forming gate spacers over the substrate, wherein the gate spacers are on opposite sides of the gate structure, and the dielectric cap covers the gate spacers.

10. The method of claim 8, wherein a sidewall of the etch stop layer is substantially aligned with a sidewall of the dielectric cap.

11. The method of claim 8, further comprising removing the SAM prior to depositing the ILD layer over the etch stop layer.

12. The method of claim 8, wherein the SAM is spaced apart from the dielectric cap.

13. The method of claim 8, wherein the source/drain via is in contact with a top surface and a sidewall of the etch stop layer.

14. A device comprising:
    a transistor comprising:
    a gate structure;
    first and second source/drain regions on opposite sides of the gate structure; and
    a gate spacer on a sidewall of the gate structure;
    first and second source/drain contacts respectively over the first and second source/drain regions of the transistor;
    an etch stop layer over the gate structure;
    an interlayer dielectric (ILD) layer over the etch stop layer, wherein a bottom surface of the ILD layer forms an interface with a top surface of the first source/drain contact at a position lower than a top surface of the etch stop layer; and
    a via structure in the ILD layer.

15. The device of claim 14, wherein the via structure is electrically connected to the first source/drain contact.

16. The device of claim 14, wherein a bottom surface of the via structure is substantially coplanar with the bottom surface of the ILD layer.

17. The device of claim 14, wherein the bottom surface of the ILD layer is lower than the top surface of the etch stop layer.

18. The device of claim 14, wherein the etch stop layer is not in contact with the first and second source/drain contacts.

19. The device of claim 14, further comprising a dielectric cap between the gate structure and the etch stop layer.

20. The device of claim 14, wherein the ILD layer is in contact with an entirety of a sidewall of the etch stop layer.

* * * * *